United States Patent
Tokutomi et al.

(10) Patent No.: US 11,211,396 B2
(45) Date of Patent: Dec. 28, 2021

(54) SEMICONDUCTOR MEMORY DEVICE

(71) Applicant: TOSHIBA MEMORY CORPORATION, Minato-ku (JP)

(72) Inventors: Tsukasa Tokutomi, Kamakura (JP); Masanobu Shirakawa, Chigasaki (JP); Takuya Futatsuyama, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 149 days.

(21) Appl. No.: 16/297,798

(22) Filed: Mar. 11, 2019

(65) Prior Publication Data
US 2020/0091169 A1   Mar. 19, 2020

(30) Foreign Application Priority Data

Sep. 14, 2018 (JP) .............................. JP2018-172896

(51) Int. Cl.
| | |
|---|---|
| *H01L 27/11578* | (2017.01) |
| *G11C 16/26* | (2006.01) |
| *G11C 16/04* | (2006.01) |
| *G11C 16/14* | (2006.01) |
| *G11C 16/34* | (2006.01) |

(52) U.S. Cl.
CPC .... *H01L 27/11578* (2013.01); *G11C 16/0466* (2013.01); *G11C 16/0483* (2013.01); *G11C 16/14* (2013.01); *G11C 16/26* (2013.01); *G11C 16/3445* (2013.01)

(58) Field of Classification Search
None
See application file for complete search history.

(56) References Cited

U.S. PATENT DOCUMENTS

| | | | |
|---|---|---|---|
| 8,194,467 B2 | 6/2012 | Mikajiri et al. | |
| 8,250,437 B2 | 8/2012 | Sakurada et al. | |
| 8,976,602 B2 | 3/2015 | Shiga et al. | |
| 9,786,378 B1 | 10/2017 | Zhang et al. | |
| 2005/0141284 A1* | 6/2005 | Futatsuyama | G11C 16/16 365/185.29 |
| 2016/0267980 A1* | 9/2016 | Akamine | G11C 29/025 |
| 2020/0006376 A1* | 1/2020 | Makala | H01L 27/11556 |

FOREIGN PATENT DOCUMENTS

| | | |
|---|---|---|
| JP | 4975794 | 7/2012 |
| JP | 2014-038670 | 2/2014 |

* cited by examiner

*Primary Examiner* — Eva Y Montalvo
*Assistant Examiner* — Kien C Ly
(74) *Attorney, Agent, or Firm* — ObLon, McClelland, Maier & Neustadt, L.L.P.

(57) ABSTRACT

According to one embodiment, a semiconductor memory device includes: first and second memory cells; a first and second word lines; and a first bit line. The device is configured to execute first to sixth operations. In the first operation, a first voltage is applied to the first word line and a second voltage is applied to a semiconductor layer. In the second operation, the first voltage is applied to the second word line. In the third operation, a third voltage is applied to the first word line. In the fourth operation, the third voltage is applied to the second word line. In the fifth operation, a fourth voltage is applied to the first word line. In the sixth operation, the fourth voltage is applied to the second word line.

20 Claims, 44 Drawing Sheets

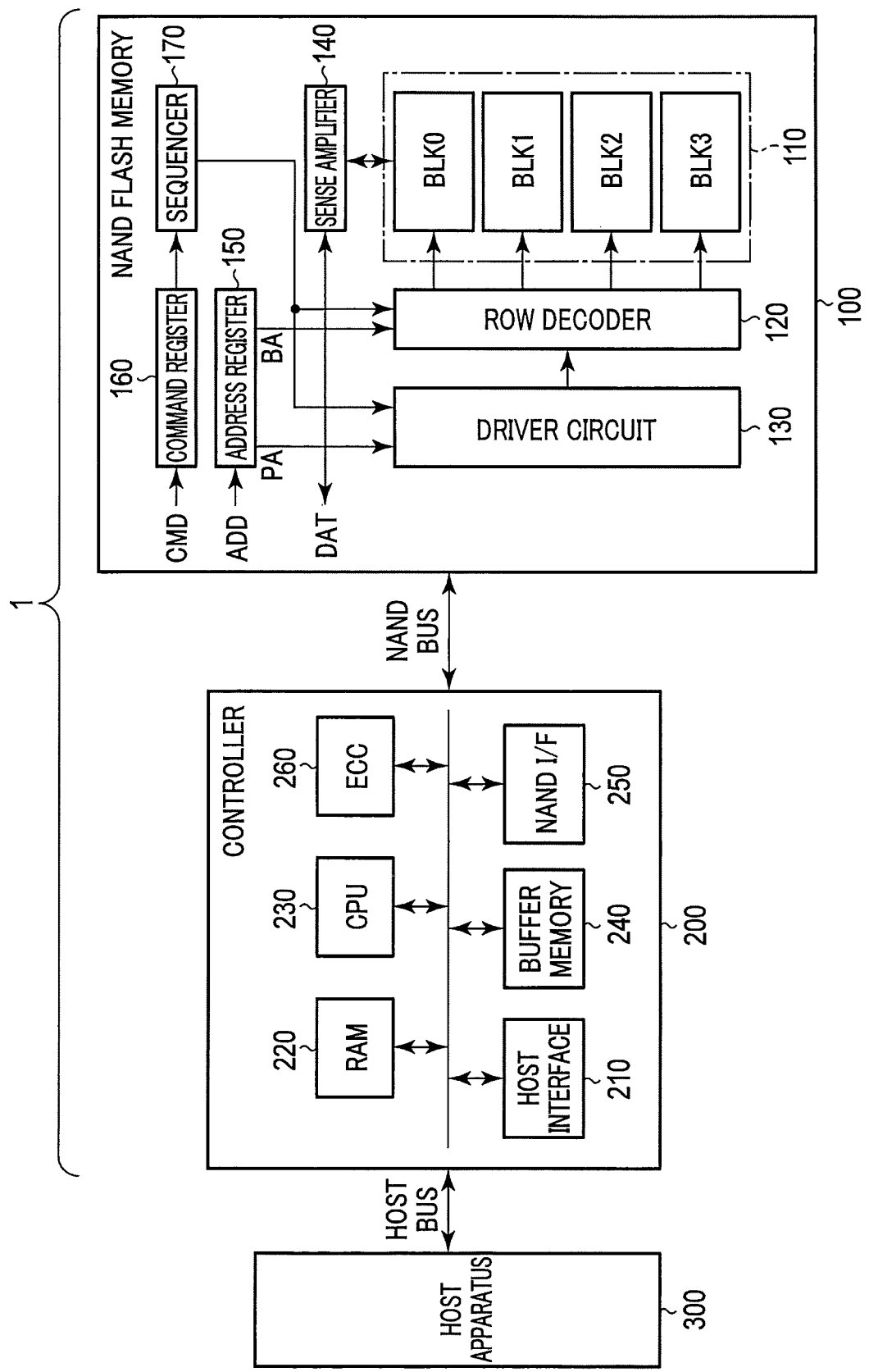
F I G. 1

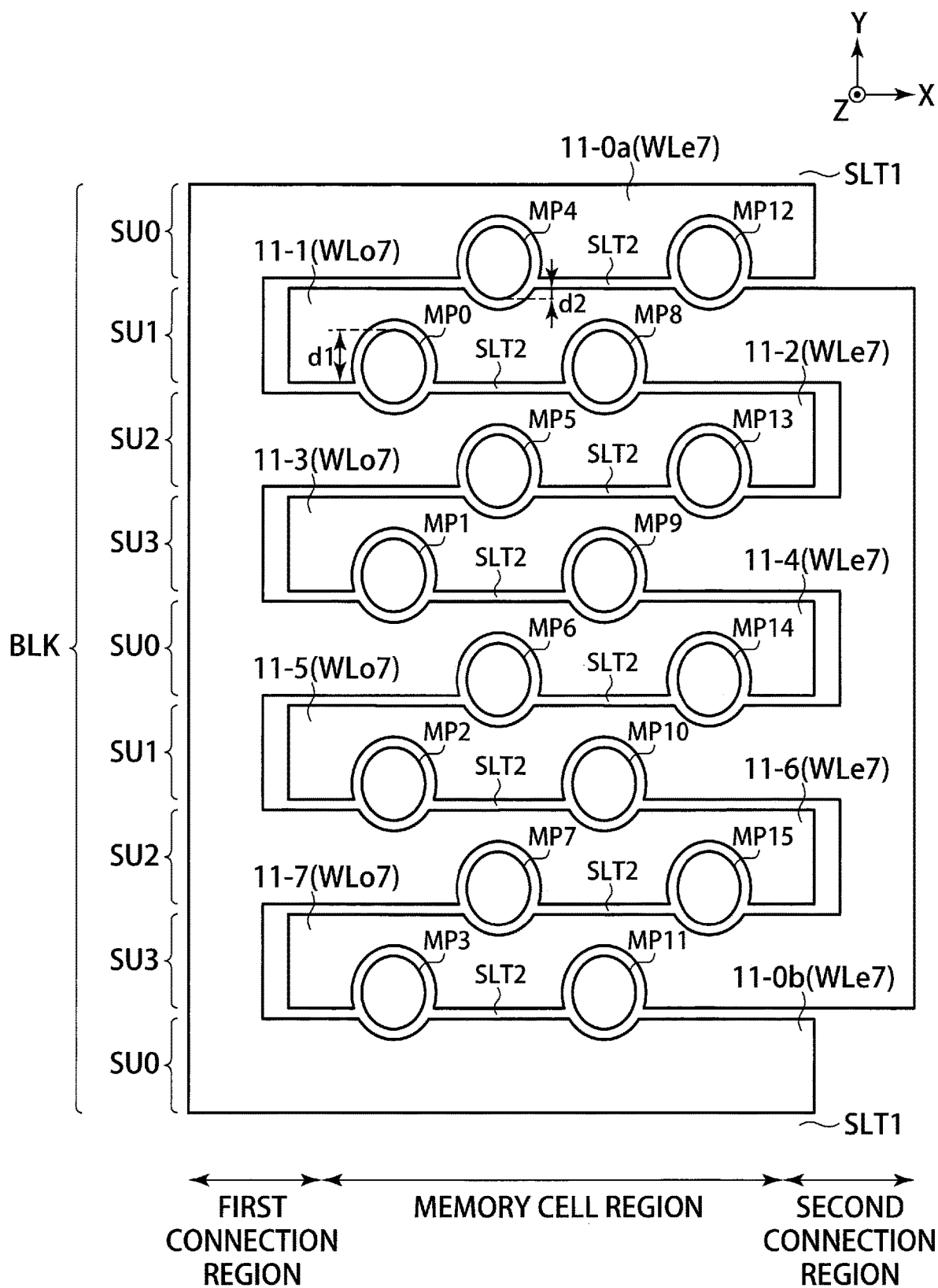
F I G. 4

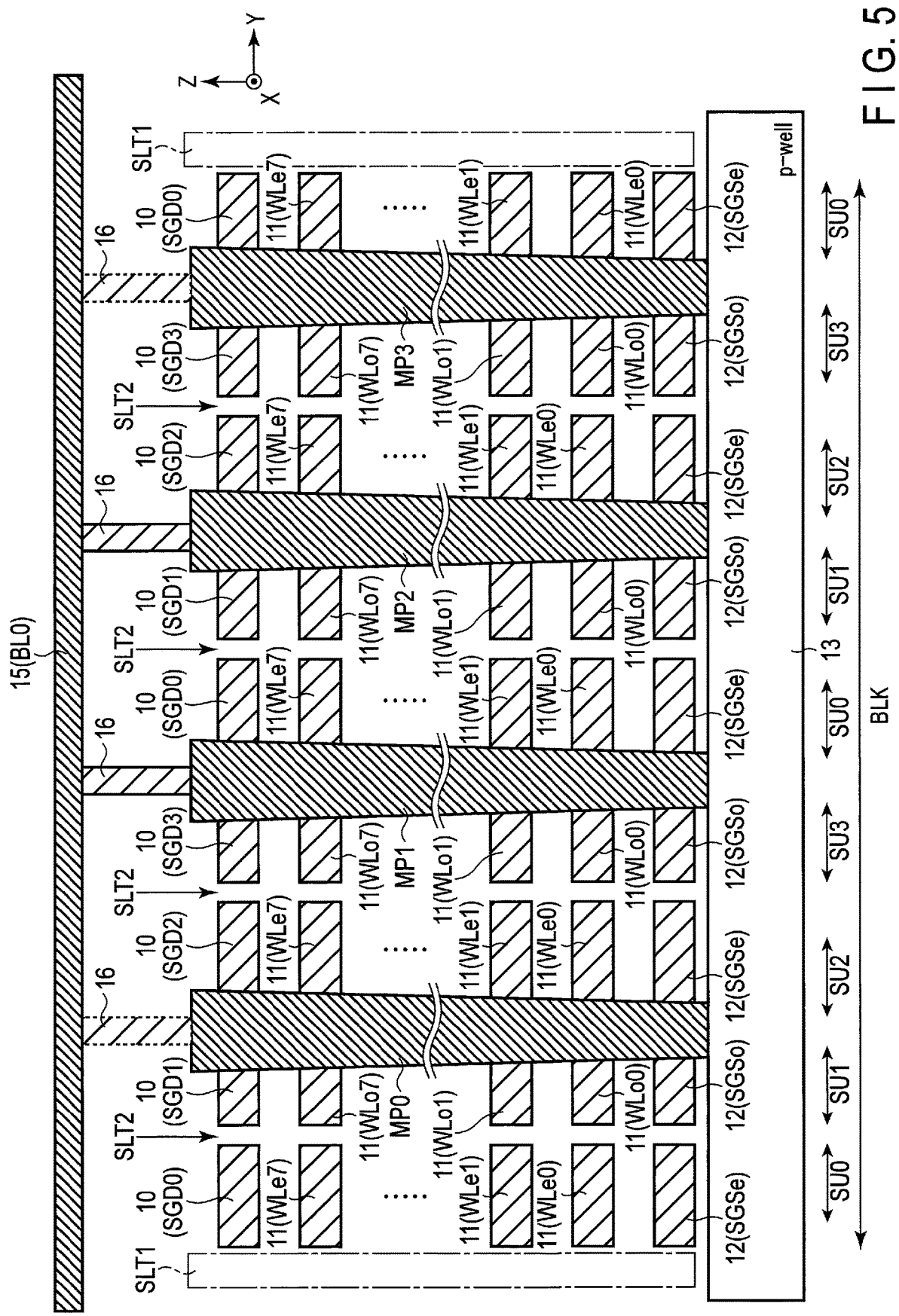
F I G. 5

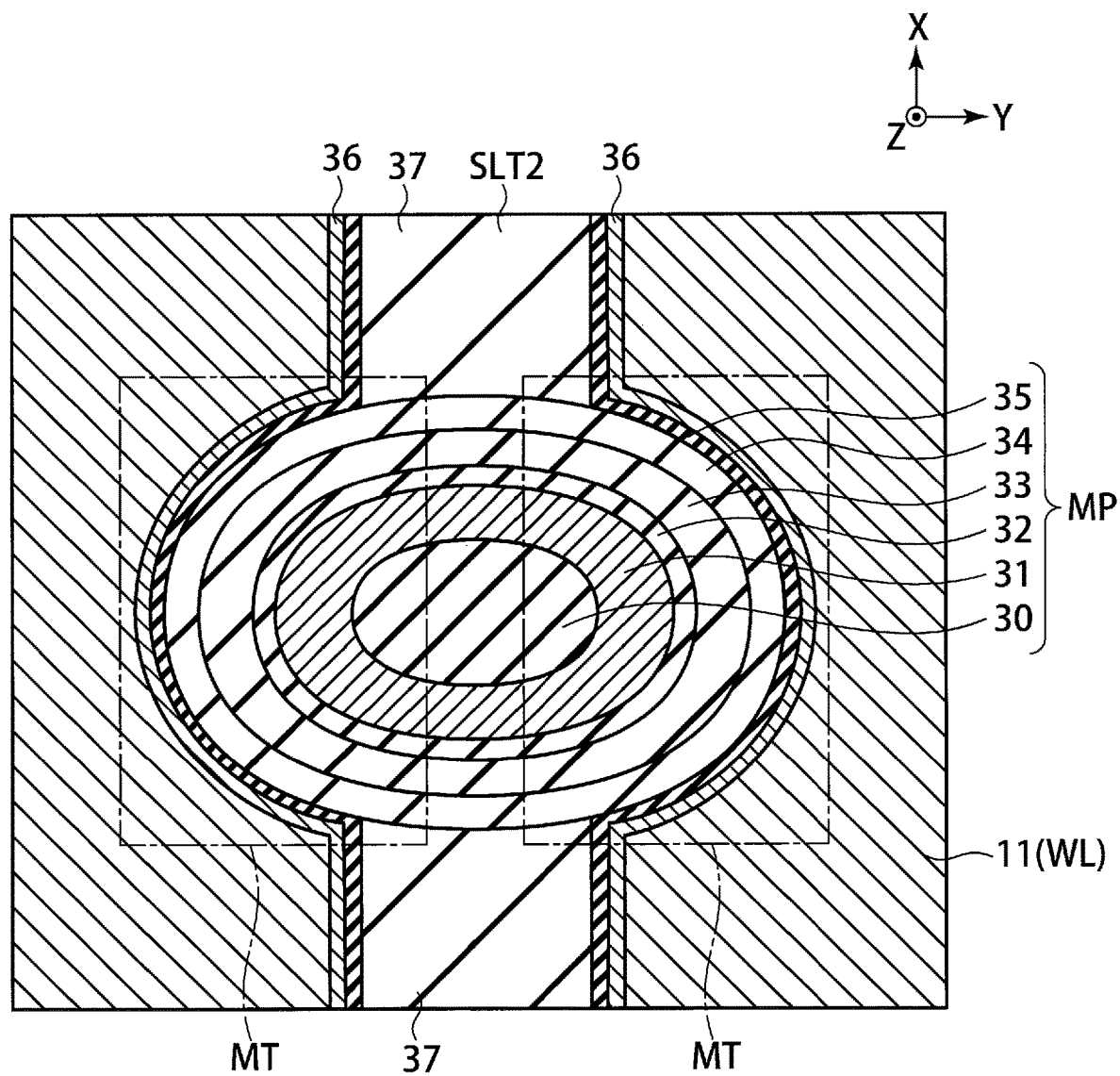
F I G. 6

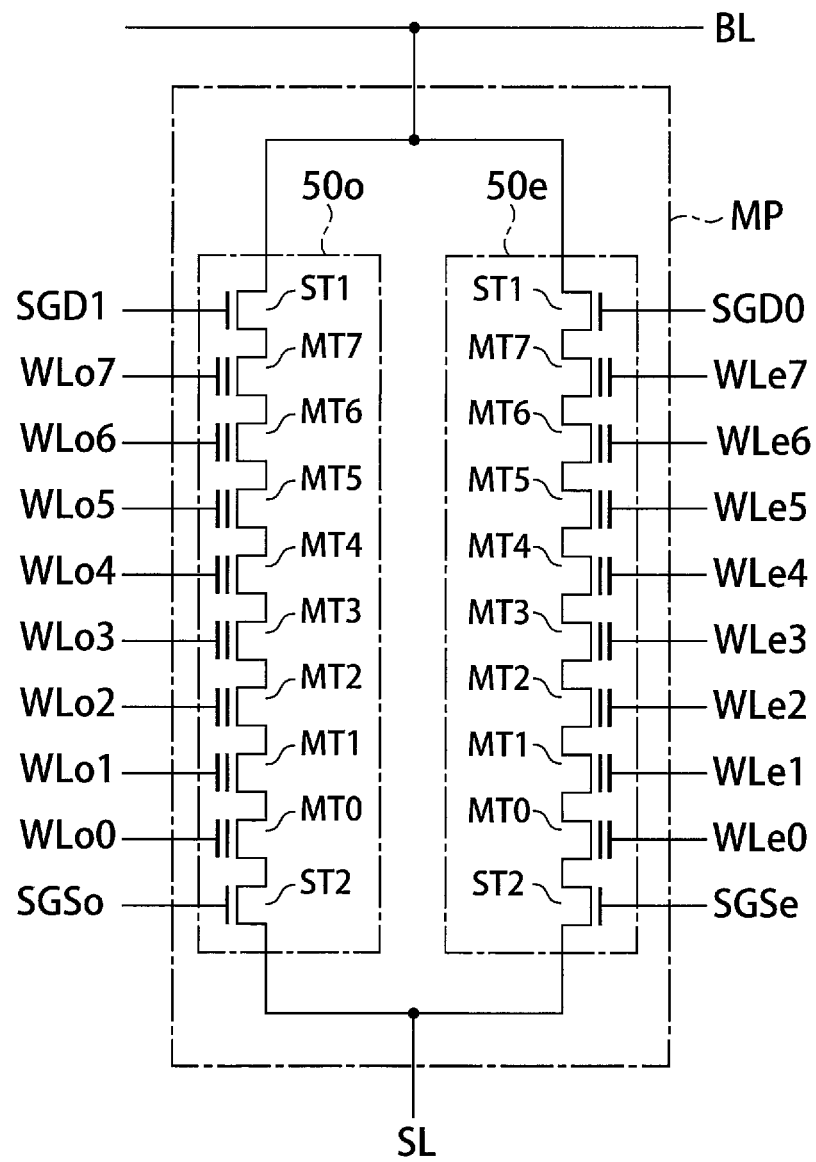
F I G. 8

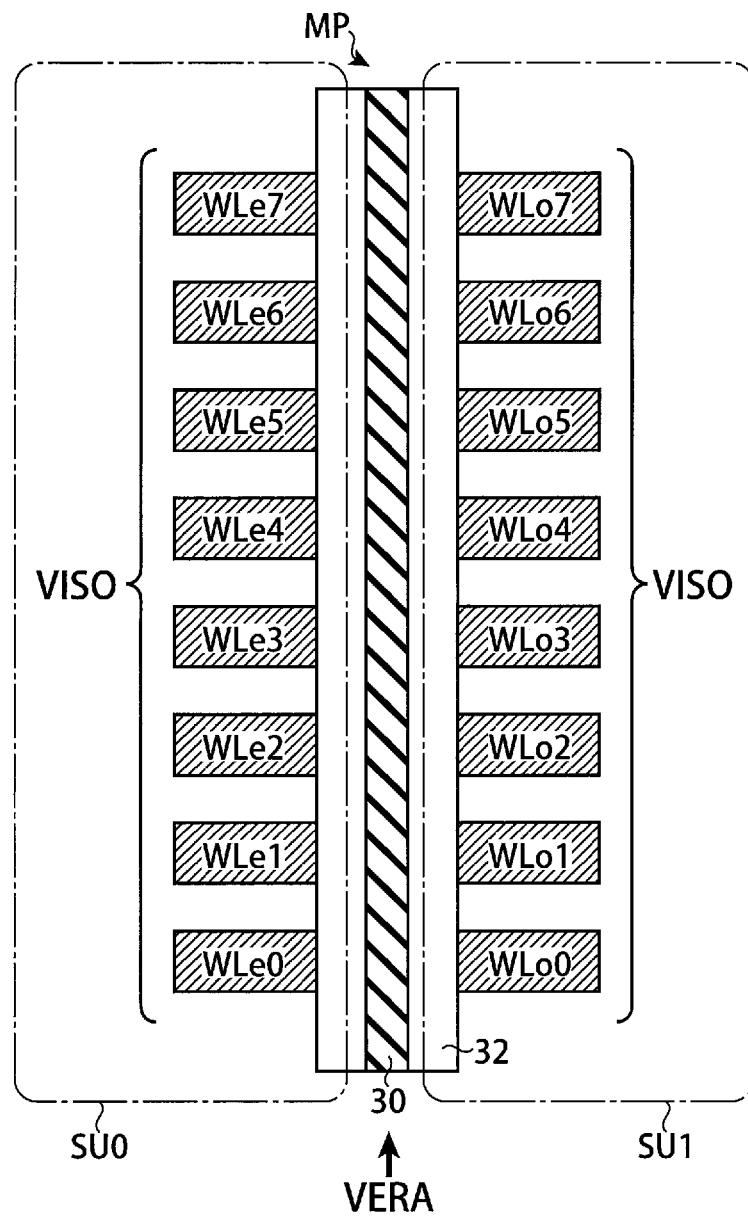
F I G. 12

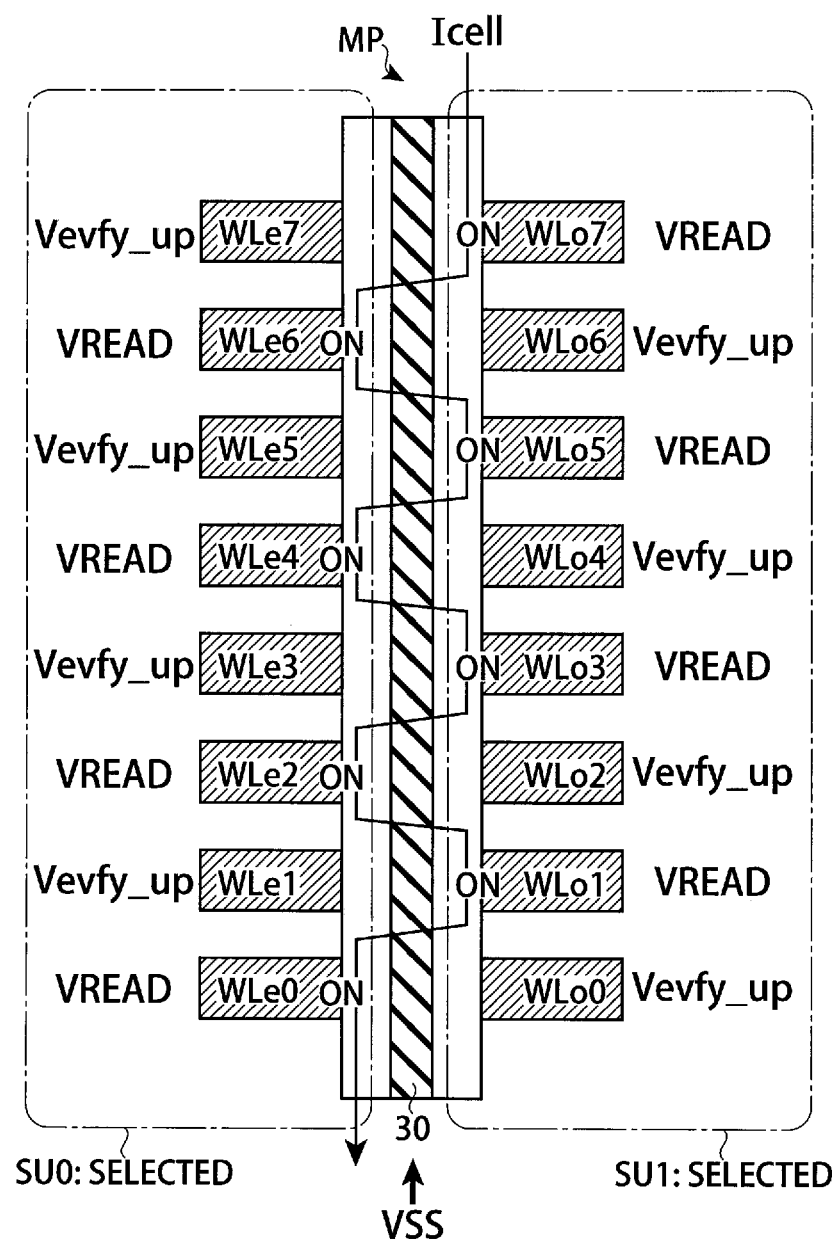
F I G. 20

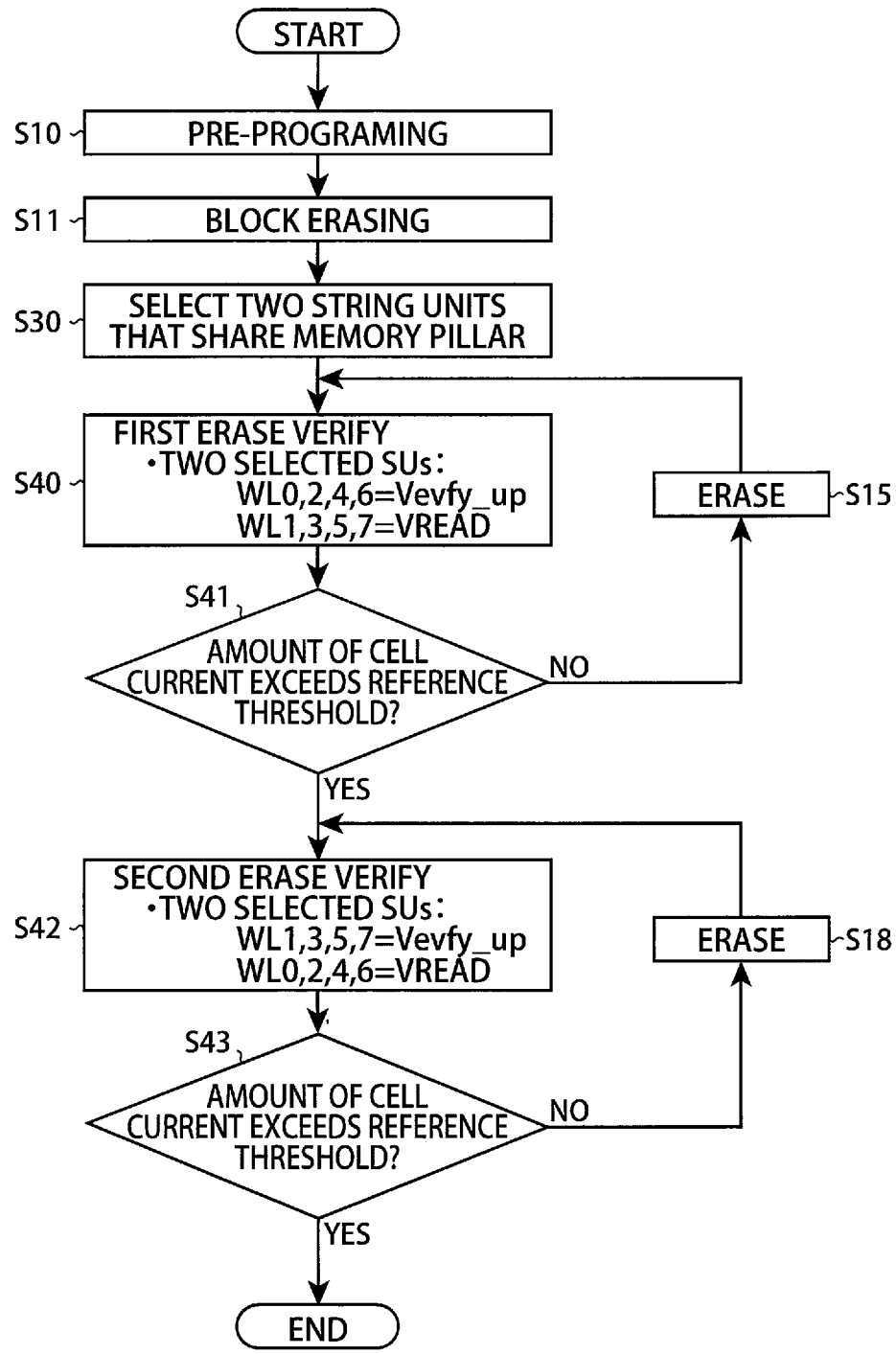
F I G. 21

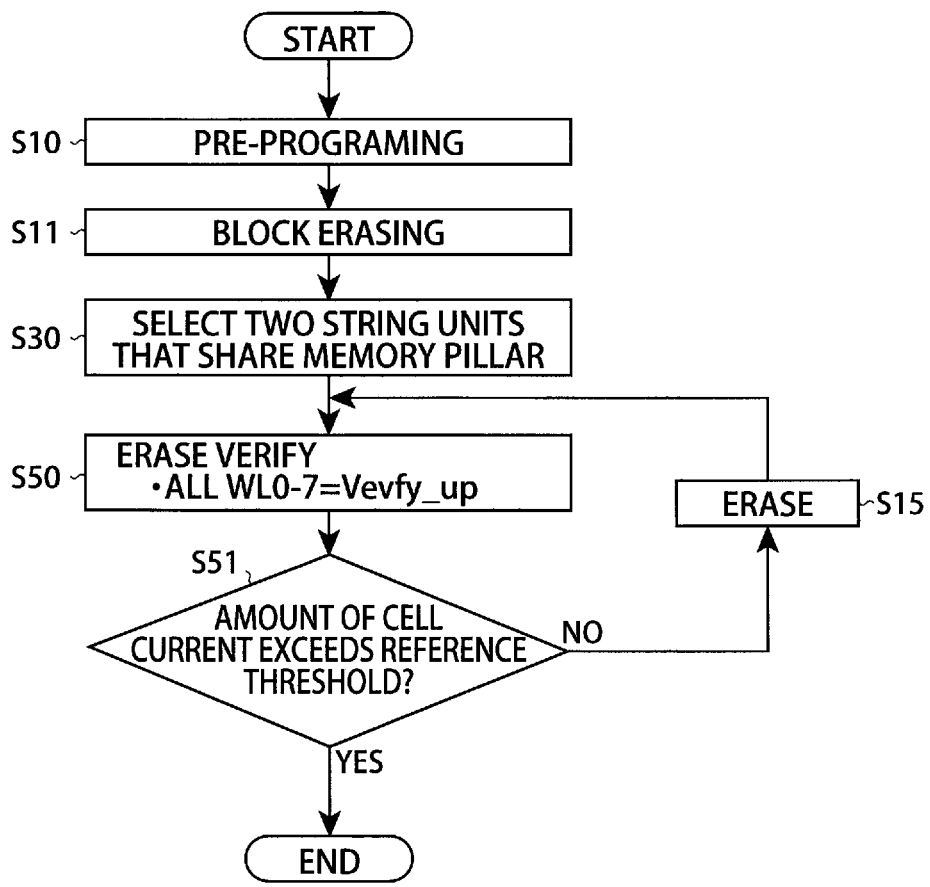
F I G. 24

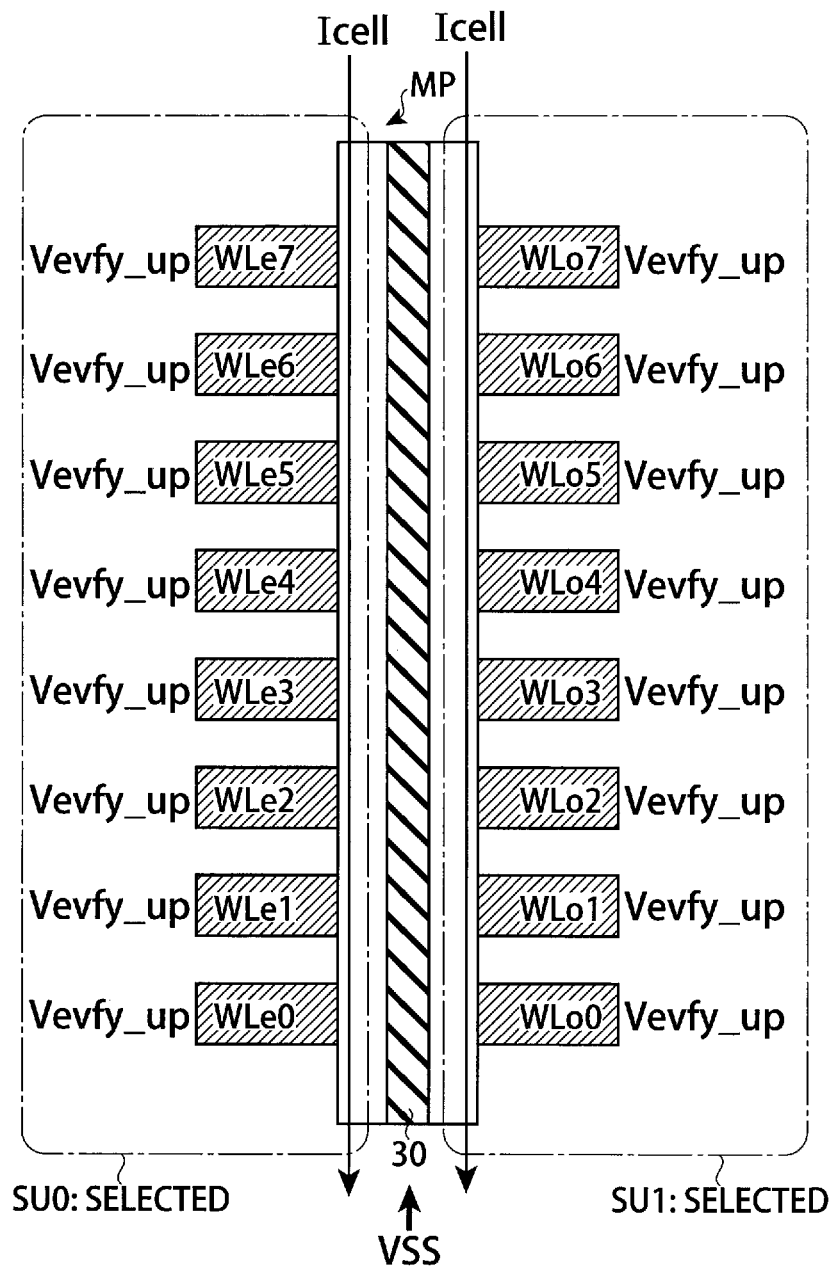
F I G. 25

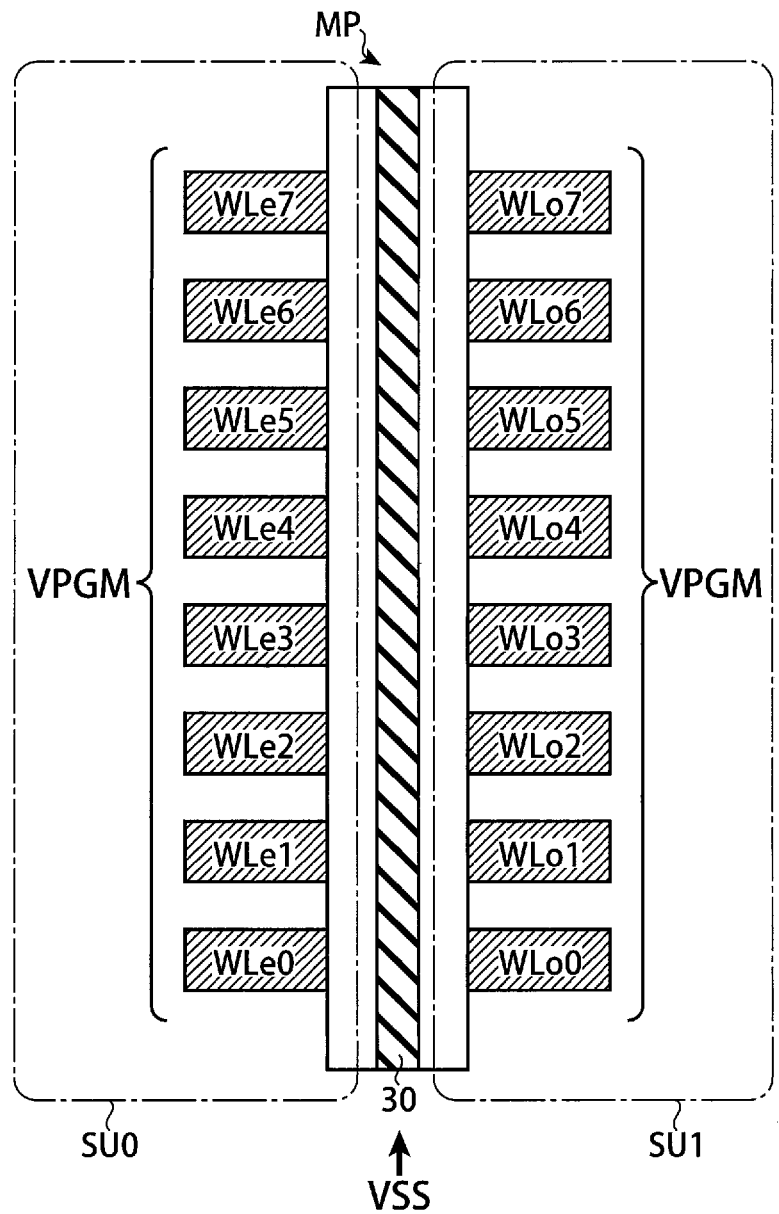
F I G. 27

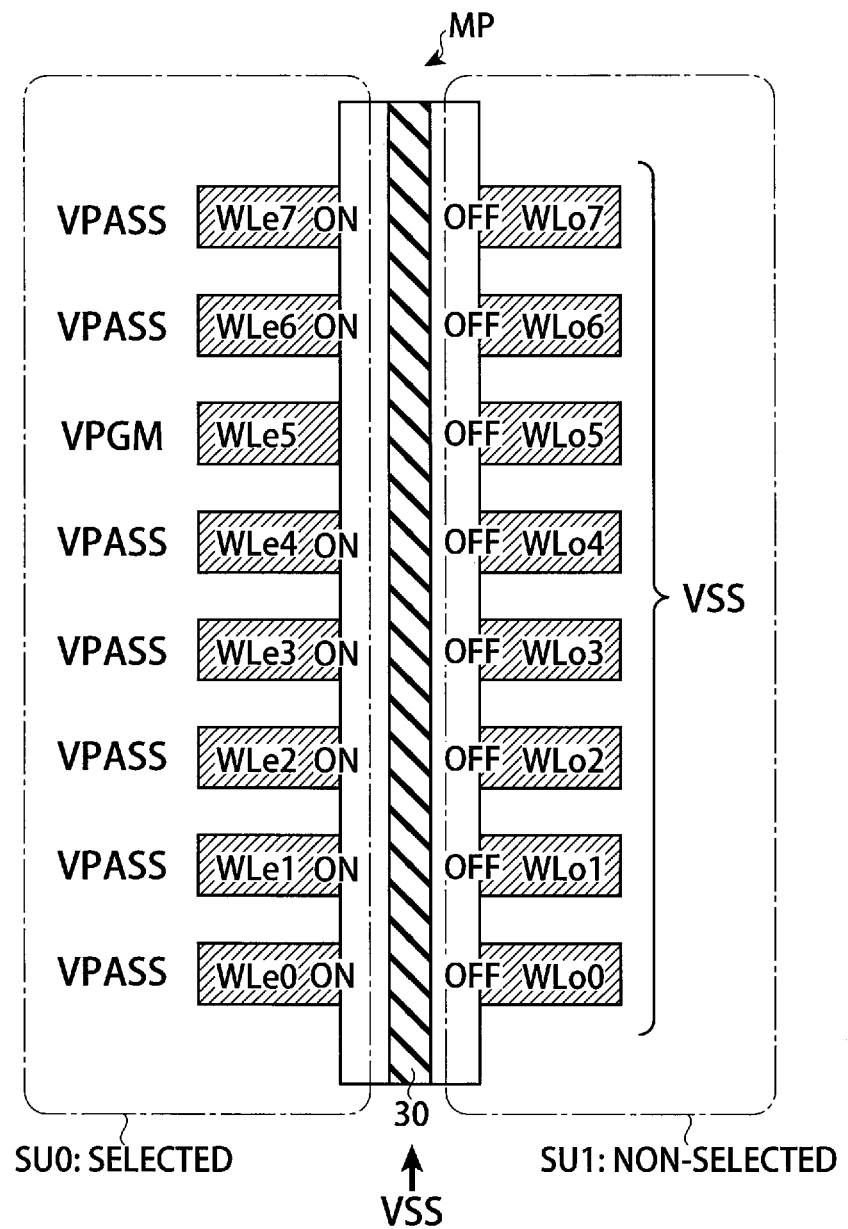
F I G. 30

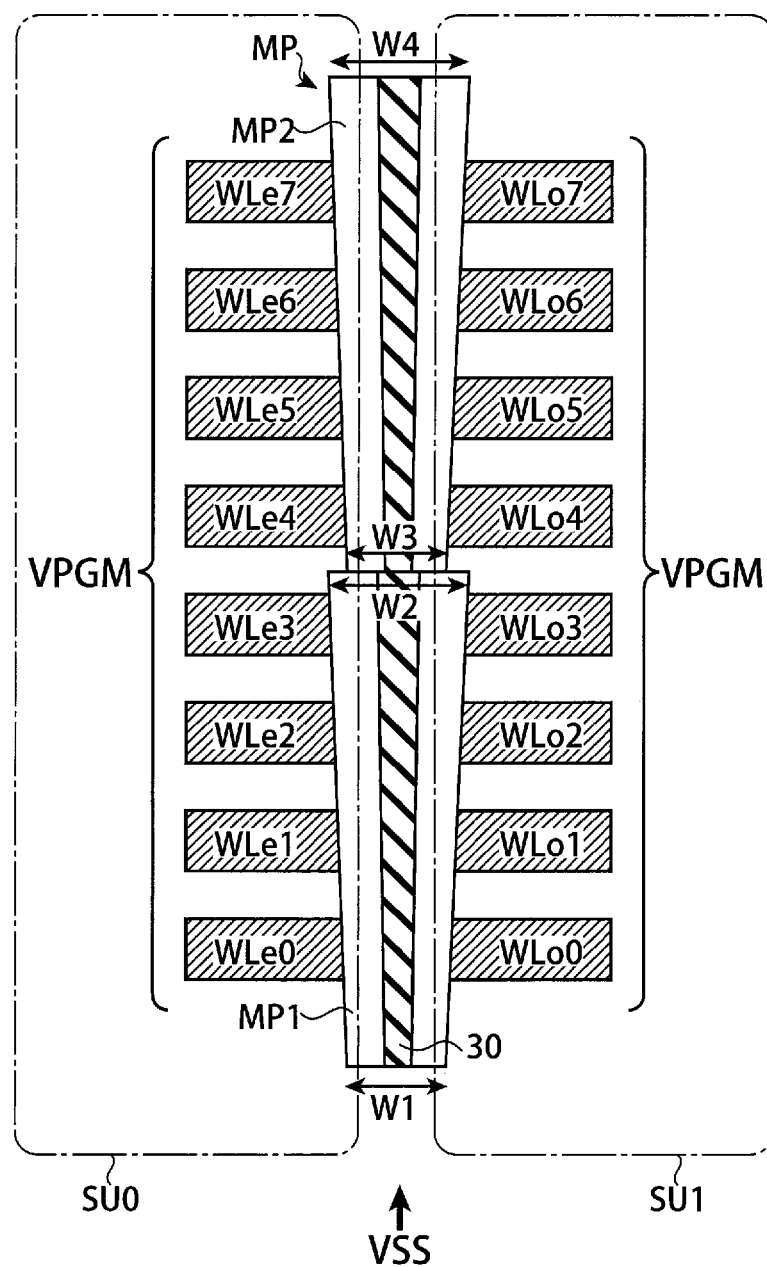
F I G. 31

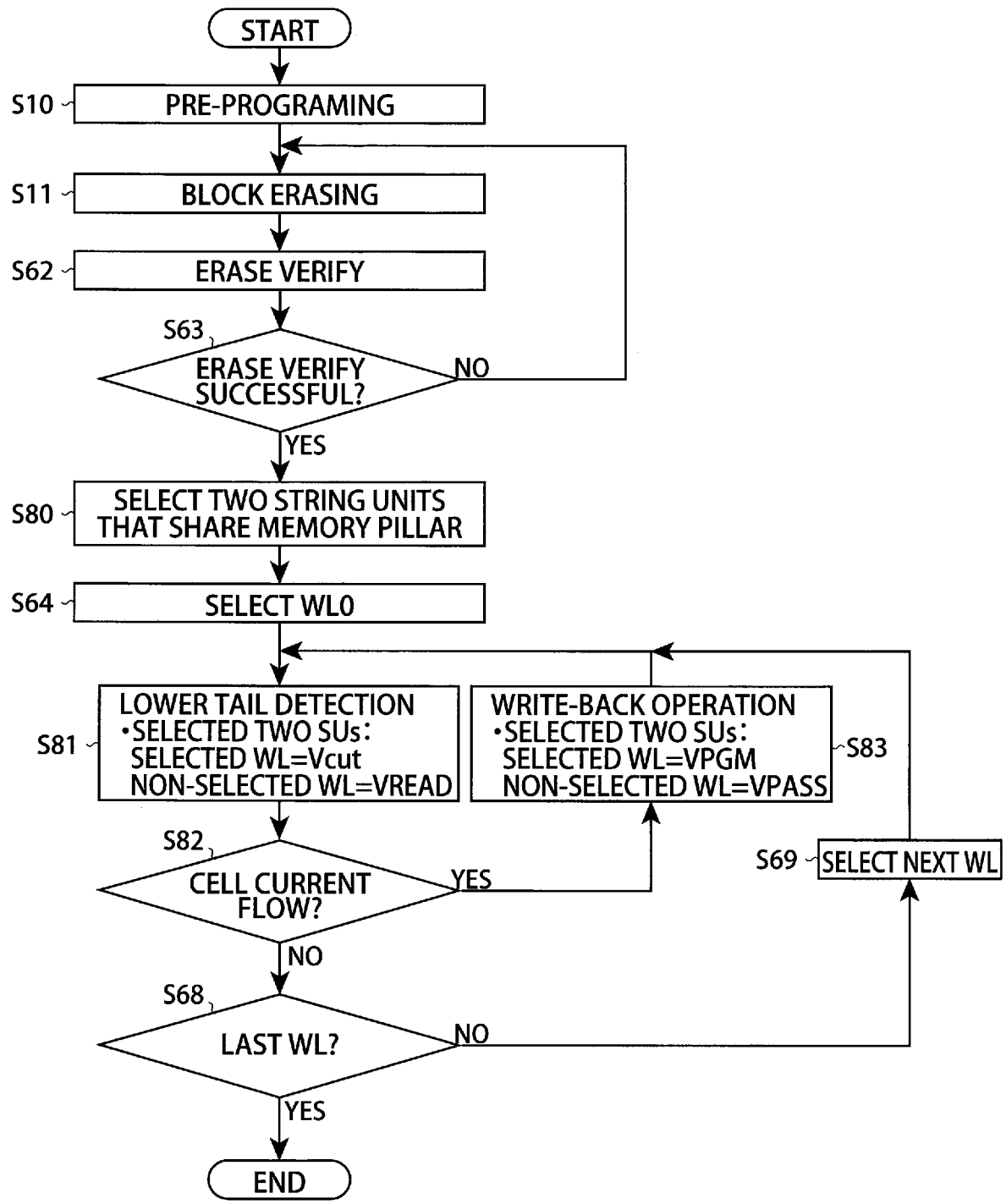
F I G. 35

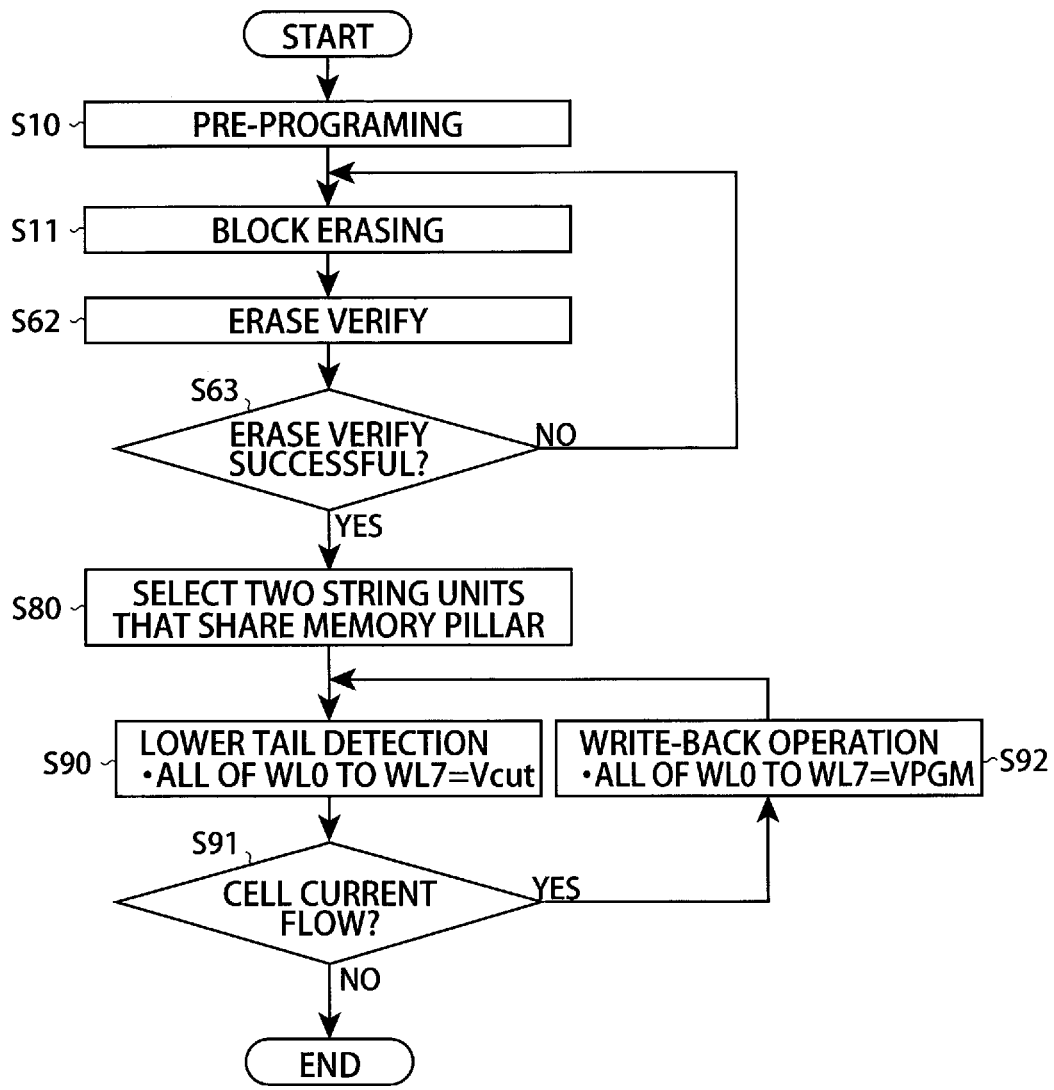
F I G. 38

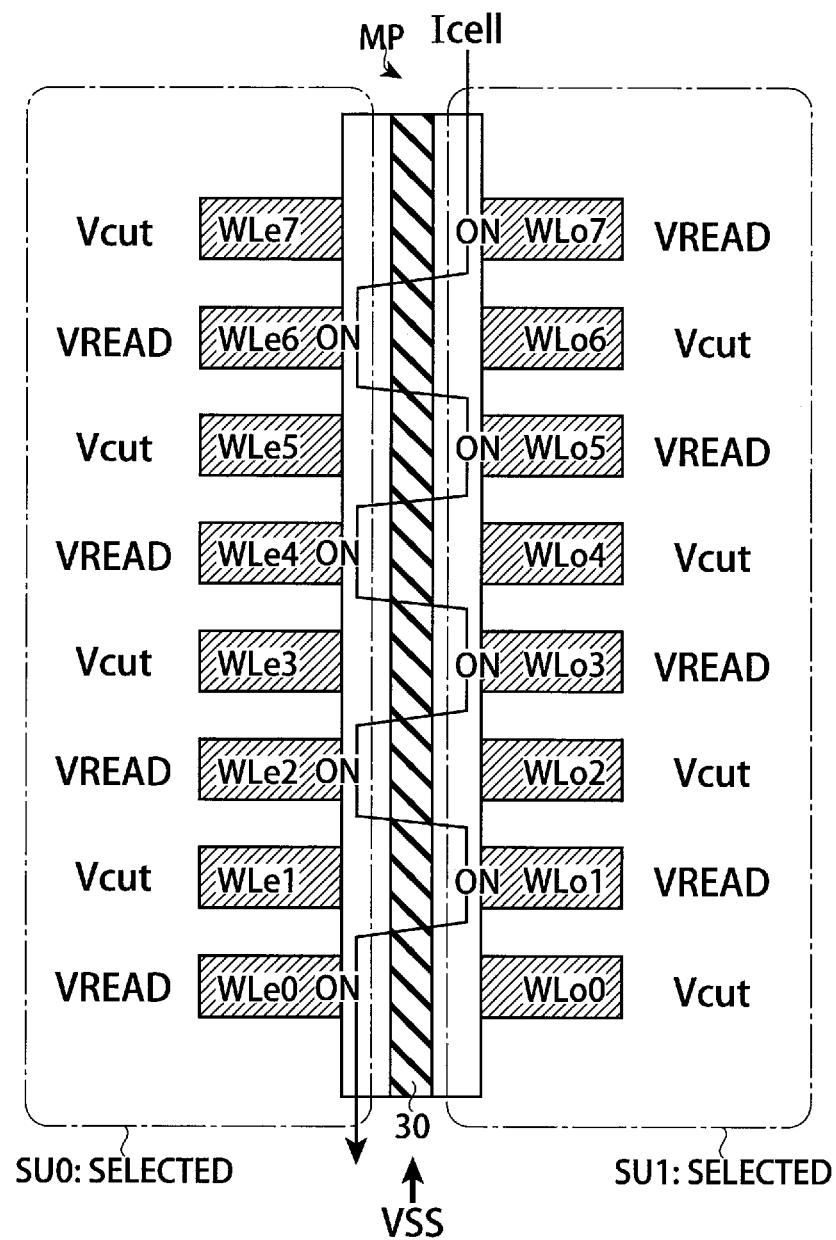
F I G. 43

SEMICONDUCTOR MEMORY DEVICE

CROSS-REFERENCE TO RELATED APPLICATIONS

This application is based upon and claims the benefit of priority from Japanese Patent Application No. 2018-172896, filed Sep. 14, 2018, the entire contents of which are incorporated herein by reference.

FIELD

Embodiments described herein relate generally to a semiconductor memory device.

BACKGROUND

A semiconductor memory in which memory cells are three-dimensionally stacked has been known.

BRIEF DESCRIPTION OF THE DRAWINGS

FIG. 1 is a block diagram of a memory system which utilizes a semiconductor memory device according to a first embodiment;

FIGS. 3 and 4 shows layout views of selection gate lines and word lines of the semiconductor memory device according to the first embodiment;

FIG. 5 shows a vertical cross section of a block of the semiconductor memory device according to the first embodiment;

FIGS. 6 and 7 show cross and vertical sections of memory cell transistors of the semiconductor memory device according to the first embodiment;

FIG. 8 shows an equivalent circuit of transistors formed in a pillar of the semiconductor memory device according to the first embodiment;

FIGS. 12, 13, and 14 show vertical sections of a pillar of the semiconductor memory device according to the first embodiment;

FIGS. 19 and 20 show vertical sections of a pillar of a semiconductor memory device according to a third embodiment;

FIG. 21 shows a flowchart of an erase operation of a semiconductor memory device according to a fourth embodiment;

FIG. 24 is a flowchart of an erase operation of a semiconductor memory device according to a fifth embodiment;

FIG. 25 shows a vertical section of a pillar of the semiconductor memory device according to the fifth embodiment;

FIGS. 27, 28, 29, and 30 show vertical sections of a pillar of the semiconductor memory device according to the sixth embodiment;

FIGS. 31, 32, 33, and 34 show vertical sections of a pillar of a semiconductor memory device according to a seventh embodiment;

FIG. 35 shows a flowchart of an erase operation of a semiconductor memory device according to an eighth embodiment;

FIG. 38 shows a flowchart of an erase operation of a semiconductor memory device according to a ninth embodiment;

FIGS. 41, 42, 43, and 44 show vertical sections of a pillar of the semiconductor memory device according to the tenth embodiment.

DETAILED DESCRIPTION

Figure 2:
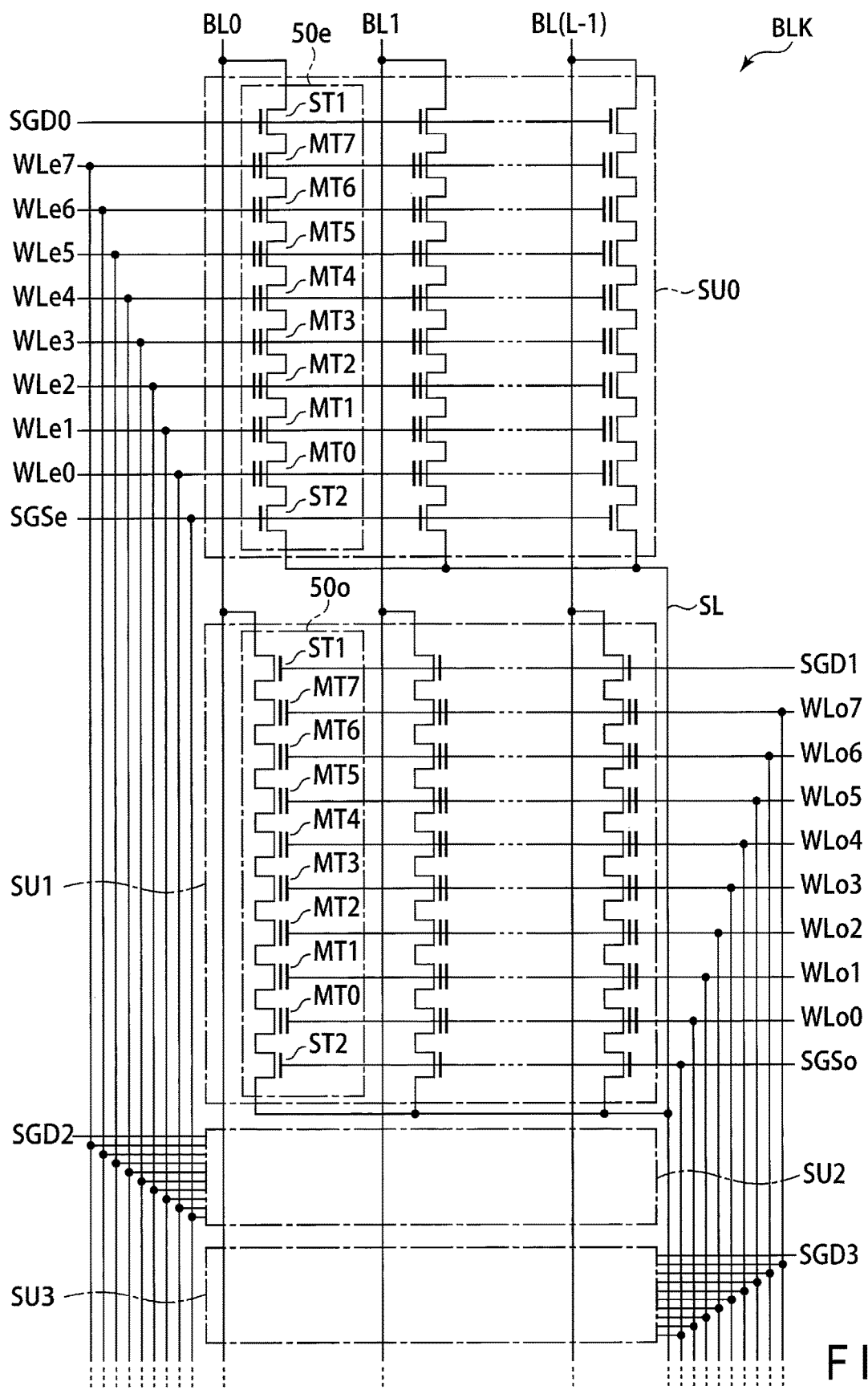
FIG. 2 is a circuit diagram of a memory cell array of the semiconductor memory device according to the first embodiment.

In general, according to one embodiment, a semiconductor memory device includes: a first memory cell capable of holding data; a second memory cell capable of holding data; a first word line coupled to the first memory cell; a second word line coupled to the second memory cell; and a first bit line capable of being electrically coupled to both the first memory cell and the second memory cell. The first memory cell shares a semiconductor layer with the second memory cell, and faces the second memory cell across the semiconductor layer. The semiconductor device is configured to execute a first operation, a second operation, a third operation, a fourth operation, a fifth operation, and a sixth operation to erase data. In the first operation, a first voltage is applied to the first word line, and a second voltage higher than the first voltage is applied to the semiconductor layer. In the second operation, the first voltage is applied to the second word line, and the second voltage is applied to the semiconductor layer. In the third operation after the first operation, a third voltage lower than the second voltage is applied to the first word line to read data from the first memory cell. In the fourth operation after the second operation, the third voltage is applied to the second word line to read data from the second memory cell. In the fifth operation after the third operation, a fourth voltage lower than the third voltage is applied to the first word line to read data from the first memory cell. In the sixth operation after the fourth operation, the fourth voltage is applied to the second word line to read data from the second memory cell

1. First Embodiment

A semiconductor memory device according to a first embodiment will be explained. A memory system explained below includes a NAND flash memory as an example of the semiconductor memory device.

1.1 System Configuration

First, the configuration of the memory system using the semiconductor memory device according to the first embodiment will be explained.

1.1.1 Overall Configuration

The overall configuration of the memory system will be roughly described with reference to FIG. 1.

As illustrated in FIG. 1, the memory system 1 includes a NAND flash memory 100 and a controller 200. The NAND flash memory 100 and the controller 200 may be integrated into a single semiconductor device, examples of which include a memory card such as an SD™ card, and a solid state drive (SSD). The controller 200 may be a system on chip (SoC).

The NAND flash memory 100 includes a plurality of memory cells to store data in a non-volatile manner. The controller 200 is connected to the NAND flash memory 100 via a NAND bus, and is connected to a host apparatus 300 via a host bus. The controller 200 controls the NAND flash memory 100, and accesses the NAND flash memory 100 in response to instructions received from the host apparatus 300. The host apparatus 300 may be a digital camera or a personal computer, and the host bus may be a bus complying with the SD™ interface specification. The NAND bus is used to exchange signals in compliance with the NAND interface.

1.1.2 Configuration of Controller 200

Continuing to refer to FIG. 1, the detailed configuration of the controller 200 will be explained. The controller 200 of FIG. 1 includes a host interface circuit 210, an internal memory (RAM) 220, a processor (CPU) 230, a buffer memory 240, a NAND interface circuit 250, and an ECC (Error Checking and Correcting) circuit 260.

The host interface circuit 210 is connected to the host apparatus 300 via the host bus, and transfers instructions and data received from the host apparatus 300 to the processor 230 and to the buffer memory 240, respectively. Furthermore, under the control of the processor 230, the host interface circuit 210 transfers the data stored in the buffer memory 240 to the host apparatus 300.

The processor 230 controls the entire operations of the controller 200. For instance, upon receipt of a write instruction from the host apparatus 300, the processor 230 issues a write command to the NAND interface circuit 250. The processor 230 similarly operates when instructions to read data and to erase data are received from the host apparatus 300. The processor 230 performs various operations, such as wear leveling, to manage the NAND flash memory 100. The operation of the controller 200 discussed below may be implemented by software (firmware) executed by the processor 230, or may be realized by hardware.

The NAND interface circuit 250 is connected to the NAND flash memory 100 via the NAND bus, and controls communications with the NAND flash memory 100. Under the control of the processor 230, the NAND interface circuit 250 transmits various signals to the NAND flash memory 100, and receives various signals from the NAND flash memory 100.

The buffer memory 240 temporarily stores data to be written into and read out of the NAND flash memory 100.

The internal memory 220 is a semiconductor memory such as a dynamic random access memory (DRAM) and a static random access memory (SRAM), and is used as a workspace for the processor 230. The internal memory 220 stores firmware or software and various parameter or data tables for controlling the NAND flash memory 100.

The ECC circuit 260 executes error detection and error correction operations for the data stored in the NAND flash memory 100. When writing data into the NAND flash memory 100, the ECC circuit 260 generates from the data error correction codes and associates the error correction codes to the write data. When reading data out of the NAND flash memory 100, the ECC circuit 260 decodes the error correction codes of the read data.

1.1.3 Configuration of NAND Flash Memory 100

1.1.3.1 Overall Configuration of NAND Flash Memory 100

Next, the configuration of the NAND flash memory 100 is explained. The NAND flash memory 100 of FIG. 1 includes a memory cell array 110, a row decoder 120, a driver circuit 130, a sense amplifier 140, an address register 150, a command register 160, and a sequencer 170.

The memory cell array 110 includes a plurality of blocks BLK, which include a plurality of non-volatile memory cells each associated with a row and a column. The memory cell array 110 stores the data supplied from the controller 200.

The row decoder 120 selects one of the blocks BLK, and further selects one or more rows of the selected block BLK.

The driver circuit 130 applies a voltage to the selected block BLK via the row decoder 120.

The sense amplifier 140, at the time of reading data or verifying the data, senses the data read from the memory cell array 110 and performs the necessary computations based on the sensed data. This read data DAT is output to the controller 200. At the time of writing data, the sense amplifier 140 transfers the write data DAT received from the controller 200, to the memory cell array 110.

The address register 150 holds an address ADD received from the controller 200. The command register 160 holds a command CMD received from the controller 200.

The sequencer 170, as a control circuitry, controls operations of the NAND flash memory 100, based on various types of information held in the registers 150 and 160.

1.1.3.2 Configuration of Memory Cell Array 110

The memory cell array 110 of the semiconductor memory device according to the first embodiment is explained.

<Circuit Configuration>

First, the circuit configuration of the memory cell array 110 will be explained with reference to FIG. 2. FIG. 2 shows an equivalent circuit of one of the blocks BLK. As illustrated in FIG. 2, the block BLK includes a plurality of string units SU (SU0, SU1, SU2, . . . ), and each string unit SU includes a plurality of NAND strings 50. Hereinafter, to differentiate the NAND strings of the string units with even numbers (even string units) SUe (SU0, SU2, SU4, . . . ) from the NAND strings of the string units with odd numbers (odd string units) SUo (SU1, SU3, SU5, . . . ), they will be collectively referred to as NAND strings 50e and NAND strings 50o, respectively.

Each of the NAND strings 50 may include eight memory cell transistors MT (MT0 to MT7) and selection transistors ST1 and ST2. A memory cell transistor MT includes a control gate and a charge accumulation layer, and holds data in a non-volatile manner. The memory cell transistors MT are coupled in series between the source of the selection transistor ST1 and the drain of the selection transistor ST2.

The gates of the selection transistors ST1 in each string unit SU are coupled to a single selection gate line SGD (SGD0, SGD1, . . . ). Each of the selection gate lines SGD is independently controlled by the row decoder 120. The gates of the selection transistors ST2 in each of the even string units SUe (SU0, SU2, . . . ) may be commonly coupled to the selection gate line SGSe, and the gates of the selection transistors ST2 in each of the odd string units SUo (SU1, SU3, . . . ) may be commonly coupled to the selection gate line SGSo. The selection gate lines SGSe and SGSo may be controlled either commonly or independently.

The control gates of the memory cell transistors MT (MT0 to MT7) included in the even string units SUe of the same block BLK are commonly coupled to the corresponding word lines WLe (WLe0 to WLe7), respectively. The control gates of the memory cell transistors MT (MT0 to MT7) included in the odd string unit SUo are commonly coupled to the corresponding word lines WLo (WLo0 to WLo7), respectively. The word lines WLe and the word lines WLo are independently controlled by the row decoder 120.

A block BLK may be a minimum size unit for data erasing. In other words, the data stored in all the memory cell transistors MT in the same block BLK is erased at a time. However, the data may be erased in every string unit SU, or in units smaller than a string unit SU.

In the memory cell array 110, the drains of the selection transistors ST1 of the NAND strings 50 in the same column are commonly coupled to the same bit line BL (BL0 to BL(L−1), where L is a natural number larger than or equal to 2). That is, a bit line BL is commonly coupled to the NAND strings 50e and 50o in the same column across different string units SU. The sources of all of the selection transistors ST2 are commonly coupled to a source line SL.

In other words, each string unit SU includes a plurality of NAND strings 50 that are coupled to their respective bit lines BL and to the same selection gate line SGD. Each block BLK includes a plurality of string units SU that share the word lines WL. A memory cell array 110 includes a plurality of blocks BLK that share bit lines BL. In the memory cell array 110, the memory cell transistors MT and the selection transistors ST1 and ST2 are three-dimensionally stacked by forming the selection gate line SGS, the word lines WL, and the selection gate line SGD in layers on the semiconductor substrate.

<Planar Layout of Memory Cell Array>

Figure 3:
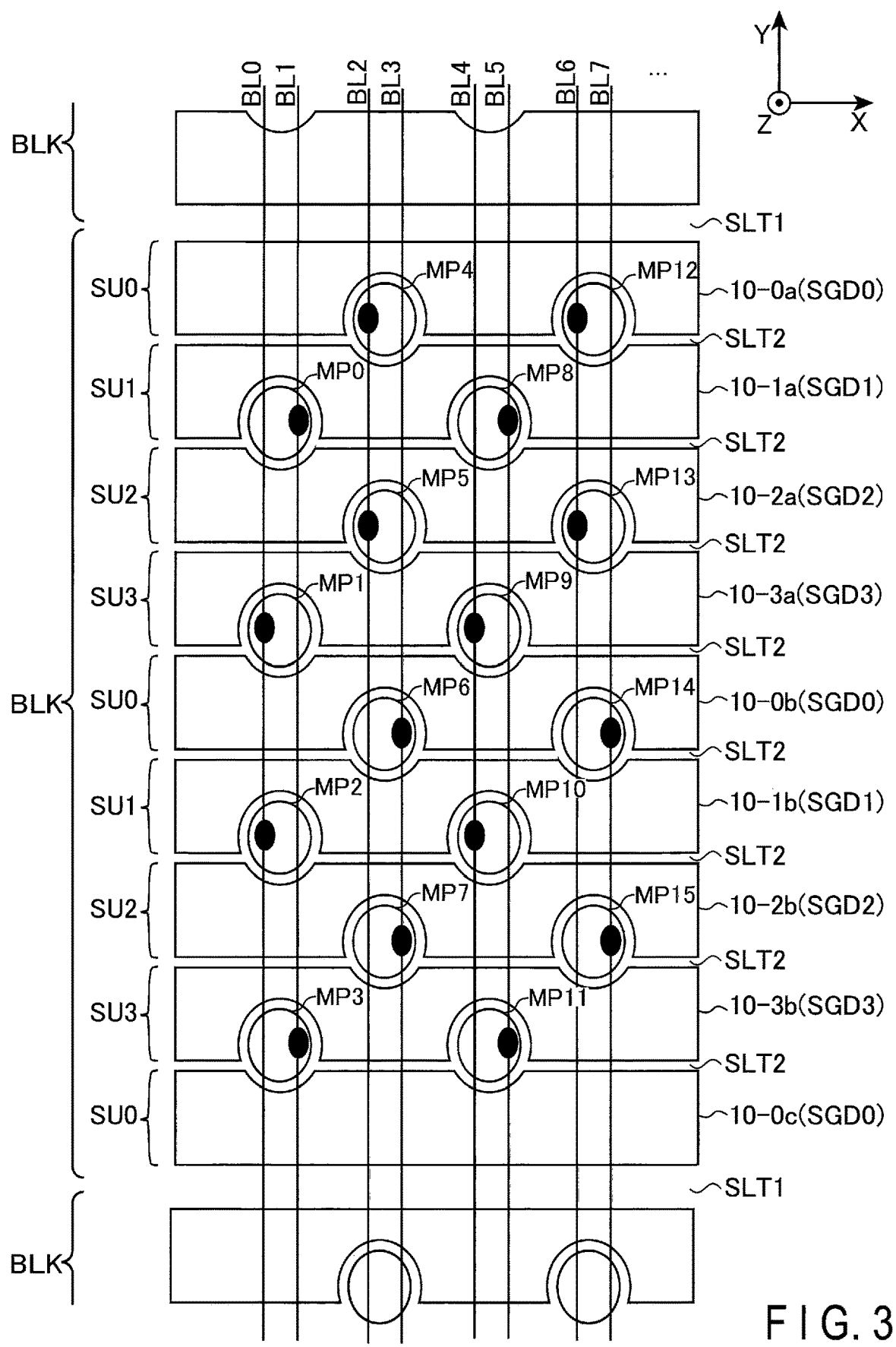

Next, the planar layout of the memory cell array 110 is described. FIG. 3 shows a planar layout of the selection gate lines SGD of a certain block BLK along the plane of the semiconductor substrate (referred to as an "X-Y plane"). In this example, one block BLK includes four selection gate lines SGD (SDG0 to SDG7).

As illustrated in FIG. 3, nine conductive layers 10 (10-0a to 10-3a, 10-0b to 10-3b, and 10-0c) extending along the X direction are arranged in the Y direction orthogonal to the X direction. Each conductive layer 10 functions as the selection gate line SGD. In the example of FIG. 3, the two conductive layers 10-0a and 10-0c positioned at the opposite ends of the block BLK in the Y direction, and the conductive layer 10-0b positioned at the center of the block BLK in the Y direction are electrically coupled to each other to form the selection gate line SGD0. Furthermore, the conductive layers 10-1a and 10-1b are electrically coupled to each other to form the selection gate line SGD1. The conductive layers 10-2a and 10-2b are electrically coupled to each other to form the selection gate line SGD2, and the conductive layers 10-3a and 10-3b are electrically coupled to each other to form the selection gate line SGD3.

In the block BLK, the conductive layers 10 that are adjacent to each other in the Y direction are separated by an insulating layer (not shown). The regions in which the insulating layers are located are referred to as slits SLT2. In each slit SLT2, the insulating layer is buried from the surface of the semiconductor substrate to at least the layer where the conductive layers 10 are arranged. Furthermore, in the memory cell array 110, a plurality of blocks BLK as illustrated in FIG. 3 are arranged in the Y direction. The blocks BLK that are adjacent to each other in the Y direction are also separated by an insulating layer (not shown). The regions in which these insulating layers are located are referred to as slits SLT1.

A plurality of pillars MP (MP0 to MP15) extending along the Z direction are arranged between the conductive layers 10 that are adjacent to each other in the Y direction to form the selection transistors ST1 and ST2 and the memory cell transistors MT. The plurality of pillars are referred to as memory pillars. The Z direction is orthogonal to the X-Y plane, or in other words, vertical to the surface of the semiconductor substrate.

In particular, the memory pillars MP0 and MP8 are positioned between the conductive layers 10-1a and 10-2a; the memory pillars MP1 and MP9 are positioned between the conductive layers 10-3a and 10-0b; the memory pillars MP2 and MP10 are positioned between the conductive layers 10-1b and 10-2b; and the memory pillars MP3 and MP11 are positioned between the conductive layers 10-3b and 10-0c. The memory pillars MP are structures that are used to form the selection transistors ST1 and ST2 and the memory cell transistors MT, which will be discussed later in detail.

The memory pillars MP0 to MP3 are aligned in the Y direction. The memory pillars MP8 to MP11 are aligned in the Y direction side by side with the memory pillars MP0 to MP3 in the X direction. That is, the alignment of the memory pillars MP0 to MP3 is parallel to the alignment of the memory pillars MP8 to MP11.

Two bit lines BL are provided above a single memory pillar MP. The memory pillar MP, however, is electrically coupled to one of the two bit lines BL.

In this example shown in FIG. 3, two bit lines BL0 and BL1 are provided above the memory pillars MP0 to MP3. The bit line BL0 is electrically coupled to the memory pillars MP1 and MP2, and the bit line BL1 is electrically coupled to the memory pillars MP0 and MP3. Furthermore, two bit lines BL4 and BL5 are provided above the memory pillars MP8 to MP11.

The bit line BL4 is electrically coupled to the memory pillars MP9 and MP10, and the bit line BL5 is electrically coupled to the memory pillars MP8 and MP11.

The memory pillars MP4 and MP12 are positioned between the conductive layers 10-0a and 10-1a; the memory pillars MP5 and MP13 are positioned between the conductive layers 10-2a and 10-3a; the memory pillars MP6 and MP14 are positioned between the conductive layers 10-0b and 10-1b; and the memory pillars MP7 and MP15 are positioned between the conductive layers 10-2b and 10-3b.

The memory pillars MP4 to MP7 are aligned in the Y direction, and the memory pillars MP12 to MP15 are also aligned in the Y direction. The memory pillars MP4 to MP7 are aligned in the Y direction between the alignment of the memory pillars MP0 to MP3 and the alignment of the memory pillars MP8 to MP11. Furthermore, the memory pillars MP12 to MP15 are aligned in the Y direction so that the alignment of the memory pillars MP8 to MP11 is positioned between the alignment of the memory pillars MP4 to MP7 and the alignment of the memory pillars MP12 to MP15. The alignment of the memory pillars MP4 to MP7 is parallel to the alignment of the memory pillars MP12 to MP15.

Two bit lines BL2 and BL3 are provided above the memory pillars MP4 to MP7. The bit line BL2 is electrically coupled to the memory pillars MP4 and MP5, and the bit line BL3 is electrically coupled to the memory pillars MP6 and MP7. Two bit lines BL6 and BL7 are provided above the memory pillars MP12 to MP15. The bit line BL6 is electrically coupled to the memory pillars MP12 and MP13, and the bit line BL7 is electrically coupled to the memory pillars MP14 and MP15.

That is, each memory pillar MP is embedded in a portion of one slit SLT2 between two conductive layers 10 located adjacently in the Y direction. Thus, one slit SLT2 is present between any two memory pillars MP that are adjacent to each other in the Y direction. No memory pillar MP is provided between the conductive layers 10-0a of one block and the conductive layers 10-0c of another block that face each other across the slit SLT1.

Like FIG. 3, FIG. 4 shows a planar layout of the word lines WL on the X-Y plane. The area illustrated in FIG. 4 corresponds to the area of the block illustrated in FIG. 3, and shows a layer for word lines WL 11 which is arranged below the conductive layers 10 shown in FIG. 3.

As shown in FIG. 4, nine conductive layers 11 (11-0 to 11-7, where the conductive layers 11-0 include conductive layers 11-0a and 11-0b) extending along the X direction are arranged in the Y direction. The conductive layers 11-0a, 11-1 to 11-7, and 11-0b are arranged below the conductive layers 10-0a to 10-3a, 10-0b to 10-3b, and 10-0c, respectively, with an insulating layer interposed therebetween. The conductive layers 11 form the word lines WLe7 and WLo7. Other word lines WL0 to WL6 are similarly formed.

In the example of FIG. 4, the conductive layers 11-0a, 11-2, 11-4, 11-6, and 11-0b function as the word line WLe7. These conductive layers 11-0a, 11-2, 11-4, 11-6, and 11-0b extend to their respective ends toward a first direction along the X direction (referred to as "first connection ends"), and are coupled together at their first connection ends. At the first connection ends, the conductive layers 11-0a, 11-2, 11-4, 11-6, and 11-0b are commonly coupled to the row decoder 120.

The conductive layers 11-1, 11-3, 11-5, and 11-7 function as the word line WLo7. These conductive layers 11-1, 11-3, 11-5, and 11-7 extend to their respective ends toward a second direction, which is opposite to the first direction, along the X direction (referred to as "second connection ends"), and are coupled together at their second connection ends. At the second connection ends, the conductive layers 11-1, 11-3, 11-5, and 11-7 are commonly coupled to the row decoder 120.

The memory cell transistors MT are provided between the first connection ends and the second connection ends. In regions in which the memory cell transistors MT are formed (referred to as memory cell regions), the conductive layers 11 which are adjacent to each other in the Y direction are separated by the slits SLT2 described by referring to FIG. 3. Similarly, between the blocks BLK which are adjacent to each other in the Y direction, the conductive layer 11 of one block BLK and the conductive layer of another block BLK adjacent to the one block BLK in the Y direction are separated by the slit SLT1. Furthermore, the memory pillars MP0 to MP15 are located in the memory cell regions in the same manner as explained above with reference to FIG. 3.

In the other layers, the other word lines WL and selection gate lines SGS are formed in the same way as the above-described layer.

<Cross-Sectional Structure of Memory Cell Array>

The cross-sectional structure of the memory cell array 110 is now discussed. FIG. 5 shows a vertical section of the block BLK, taken along the Y direction. By way of example, FIG. 5 illustrates a vertical section of a region taken along the bit line BL0 shown in FIG. 3.

As illustrated in FIG. 5, the conductive layers 12 functioning as the selection gate lines SGS is located above the semiconductor substrate (e.g., p-type well region) 13. Eight conductive layers 11 functioning as the word lines WL0 to WL7 are stacked in the Z direction above the selection gate lines SGS. The layout views of these conductive layers for the word lines 11 and the SGS 12 are presented in FIG. 4. The conductive layers 10 functioning as the selection gate lines SGD is arranged above the word lines 11. As for the layer for the SGD, its layout view has already been discussed with reference to FIG. 3.

The slits SLT2 and the memory pillars MP are arranged alternately along the Y direction to each extend through the SGD 10 to the semiconductor substrate 13. As discussed above, the slits SLT2 are formed of insulating layers. The insulation films of the slit SLT2 may include contact plugs to apply a voltage to a region of the semiconductor substrate 13. For example, contact plugs may be provided to couple the sources of the selection transistors ST2 to a source line that is not shown.

The layer for the SGS 12 includes the selection gate lines SGSe and the selection gate lines SGSo which are alternately arranged with slits SLT2 or memory pillars MP interposed in-between. Similarly, each of the layers for the word lines WL 11 includes the word lines WLo and the word lines WLe which are alternately arranged with slits SLT2 or memory pillars MP interposed therebetween.

The slits SLT1 are arranged between the blocks BLK which are adjacent to each other in the Y direction. As mentioned above, the slits SLT1 are formed of an insulating layer. The insulating layers of the slits SLT1 may include contact plugs to apply a voltage to a region of the semiconductor substrate 13. For example, contact plugs may be provided to couple the sources of the selection transistors ST2 to the source line. The width of the slit SLT1 in the Y direction is greater than the width of the slit SLT2 in the Y direction.

A contact plug 16 is arranged on each of the memory pillars MP. The conductive layers 15 functioning as the bit lines BL is arranged along the Y direction in a manner so that the bit lines BL are commonly coupled to the corresponding contact plugs 16. FIG. 5 presents the Y-Z plane cross section taken along the bit line BL0. Therefore, in FIG. 5, only the contact plugs 16 that are coupled to the memory pillars MP1 and MP2 are shown in section.

<Structure of Memory Pillar and Memory Cell Transistor>

Figure 7:
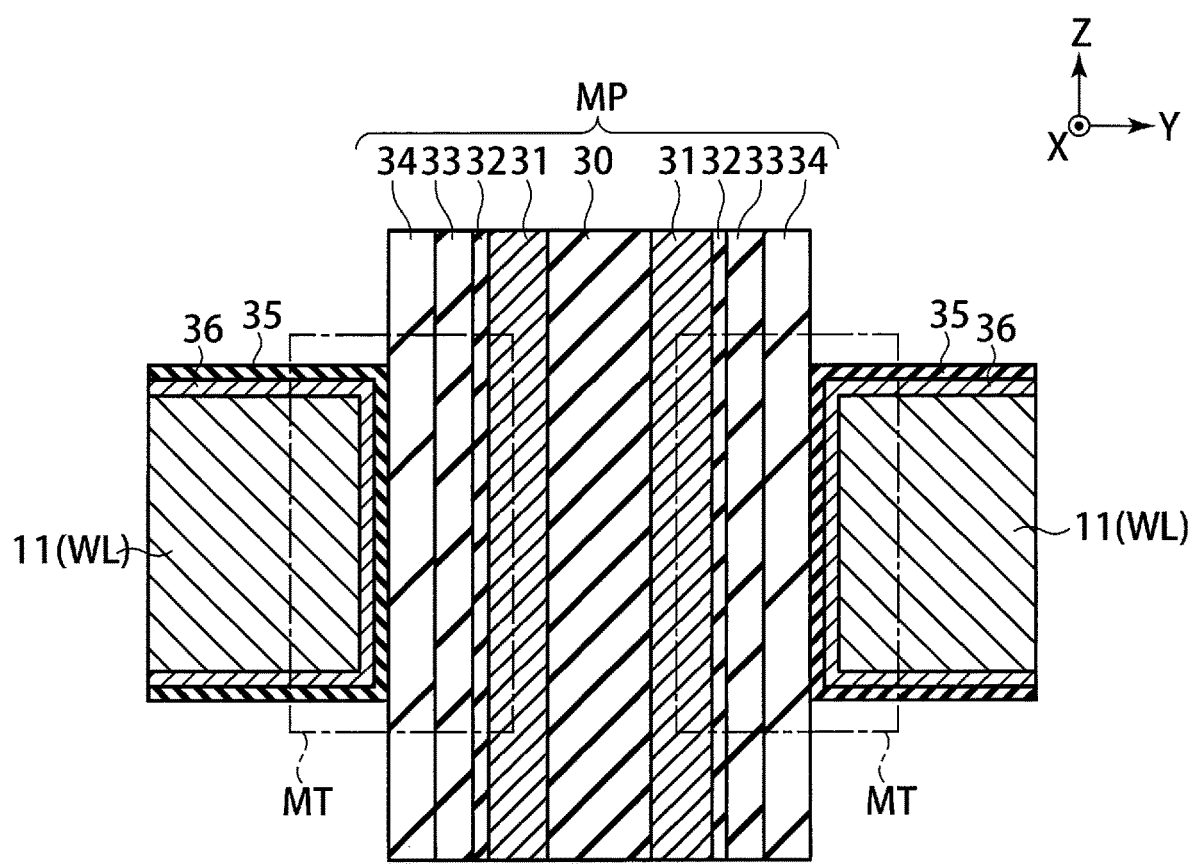

The structure of each memory pillar MP and each memory cell transistor MT will be explained. FIG. 6 is a cross section of the memory pillar MP taken along the X-Y plane, and FIG. 7 is a vertical section of the same taken along the Y-Z plane. Particularly, FIGS. 6 and 7 illustrate the area in which two memory cell transistors MT are formed.

As illustrated in FIGS. 6 and 7, the memory pillar MP includes an insulating layer 30, a semiconductor layer 31, and insulating layers 32 to 34 which are coaxially arranged along the Z direction. The insulating layer 30 may be a silicon dioxide film. The semiconductor layer 31 is arranged to surround the insulating layer 30, and provides a region in which the channels of the memory cell transistors MT are formed. The semiconductor layer 31 may be formed of polycrystalline silicon. The insulating layer 32 is arranged to surround the semiconductor layer 31, and to function as a gate insulating layer of the memory cell transistor MT. The insulating layer 32 may have a stacked structure including a silicon dioxide film and a silicon nitride film. The insulating layer 33 is arranged to surround the semiconductor layer 31, and functions as a charge accumulation layer of the memory cell transistor MT. The insulating layer 33 may be a silicon nitride film. The insulating layer 34 is arranged to surround the insulating layer 33, and functions as a block insulating layer of the memory cell transistor MT. The insulating layer 34 may be a silicon dioxide film. Outside the memory pillar MP, an insulating layer 37 is buried in the slit SLT2. The insulating layer 37 may be a silicon dioxide film.

An aluminum oxide (AlO) layer 35 may be arranged around the above-described memory pillar MP. A barrier metal layer (e.g., a titanium nitride (TiN) film) 36 may be formed around the AlO layer 35. The conductive layers 11 that function as the word lines WL are arranged around the barrier metal layer 36. The conductive layers 11 may be formed of tungsten.

With the above-described configuration, two memory cell transistors MT are formed along the Y direction in one region of the memory pillar MP shown in FIGS. 6 and 7. The selection transistors ST1 and ST2 are similarly formed.

FIG. 8 shows an equivalent circuit of the transistors formed in the memory pillar MP. As illustrated in FIG. 8, two NAND strings 50o and 50e are formed in one memory pillar MP. In other words, a pair of selection transistors ST1 arranged in the one memory pillar MP are coupled to different selection gate lines SGD. The pair of memory cell transistors MT0 to MT7 are respectively coupled to different word lines WLo and WLe. Furthermore, the pair of selection transistors ST2 are coupled to different selection gate lines SGSo and SGSe. The two NAND strings 50o and 50e in the same memory pillar MP are coupled to the same bit line BL, and to the same source line SL. The two NAND strings 50o and 50e formed in the same memory pillar MP share a back gate (semiconductor layer 31).

<Threshold Voltage Distribution of Memory Cell Transistor>

In an example introduced here, a single memory cell transistor MT may be configured to hold 3-bit data. The bits of this 3-bit data will be referred to, from the least significant bit, as a lower bit, middle bit, and upper bit. In the memory cell transistors that are coupled to the same word line, a set of lower bits held in those memory cell transistors is denoted as a lower page, a set of middle bits held in the those memory cells transistors is denoted as a middle page, and a set of upper bits held in the those memory cells transistors is denoted as an upper page. That is, three pages are assigned to one word line WL, which means that one string unit SU coupled to eight word lines WL has a capacity of 24 pages. In other words, a "page" can be defined as a portion of the memory space that is formed by the memory cell transistors coupled to the same word line. The data writing and reading may be performed for every page.

Figure 9:
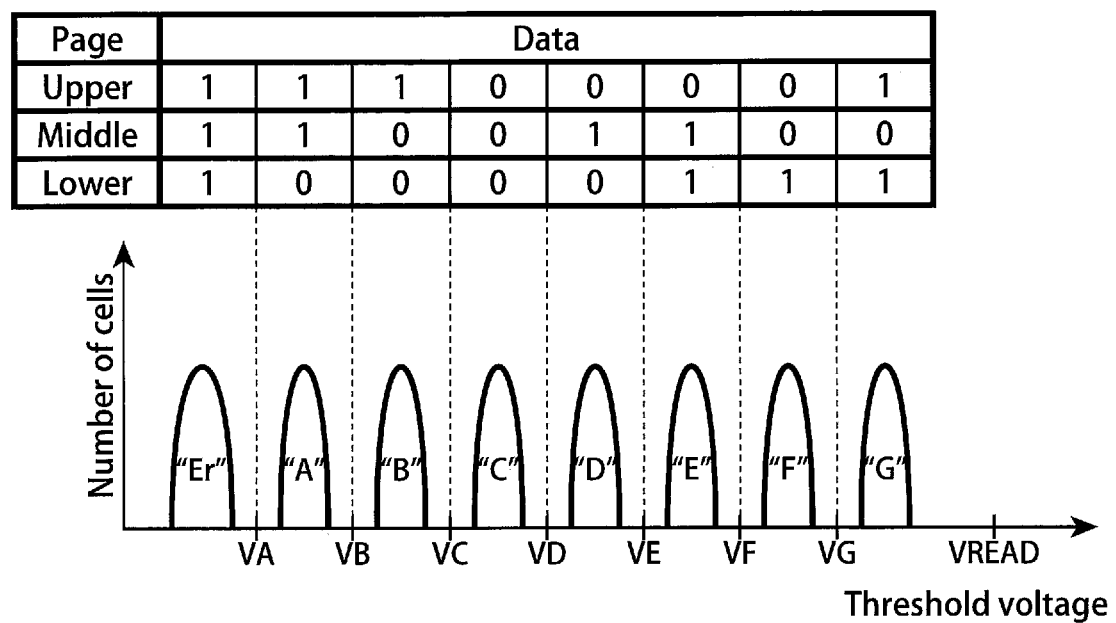
FIG. 9 schematically shows a relation of stored bit values and threshold voltage distribution for a memory cell of a semiconductor memory device according to the first embodiment.

FIG. 9 shows the possible bit values to be stored in each memory cell transistor MT, threshold voltage distribution, and read voltages used for reading data.

As shown in FIG. 9, one memory cell transistor MT may be set in one of eight possible states in accordance with the threshold voltage states. These eight states are referred to as "Er" state, "A" state, "B" state, "C" state, . . . and "G" state from the lowest threshold voltage state.

The threshold voltage of the memory cell transistor MT in the "Er" state is lower than the read voltage VA, which corresponds to the data erased state. The read voltage VA may be 0V, and the threshold voltage of the memory cell transistor MT in the "Er" state is negative. The threshold voltage of the memory cell transistor MT in the "A" state is greater than or equal to the read voltage VA, and is smaller than the read voltage VB (>VA). The threshold voltage of the memory cell transistor MT in the "B" state is greater than or equal to the read voltage VB, and is smaller than the read voltage VC (>VB). The threshold voltage of the memory cell transistor MT in the "C" state is greater than or equal to the read voltage VC, and is smaller than the read voltage VD (>VC). The threshold voltage of the memory cell transistor MT in the "D" state is greater than or equal to the read voltage VD, and is smaller than the read voltage VE (>VD). The threshold voltage of the memory cell transistor MT in the "E" state is greater than or equal to the read voltage VE, and is smaller than the read voltage VF (>VE). The threshold voltage of the memory cell transistor MT in the "F" state is greater than or equal to the read voltage VF, and is smaller than the read voltage VG (>VF). The threshold voltage of the memory cell transistor MT in the "G" state is greater than or equal to the read voltage VG, and is smaller than the voltage VREAD. Of these eight states corresponding to the above-described threshold voltage distribution states, the "G" state indicates the highest threshold voltage distribution. The voltage VREAD is a voltage which is applied to non-selected word lines at the time of data reading and turns on any memory cell transistors MT coupled to the non-selected word lines regardless of the data stored in those memory cell transistors.

The above-described threshold voltage distribution states are realized by writing a 3-bit (3-page) value including the lower bit, middle bit, and upper bit in the corresponding memory cell transistor. The eight threshold voltage distribution states establish the following relationship with the lower bit, middle bit, and upper bit values.

"Er" state: "111" (in the order of "upper/middle/lower")
"A" state: "110"
"B" state: "100"
"C" state: "000"
"D" state: "010"
"E" state: "011"
"F" state: "001"
"G" state: "101"

In the above threshold voltage distribution states, the bit values of any adjacent two states have a difference in only one of the three bits.

In view of the above, when reading the value of the lower bit, the read voltages corresponding to the boundary voltages at which the value ("0" or "1") of the lower bit changes are used. The same applies to the middle bit and the upper bit.

1.2 Erase Operation

A method of erasing data stored in the above-described NAND flash memory is explained.

1.2.1 Overall Procedure of Data Erase Operation

Figure 10:
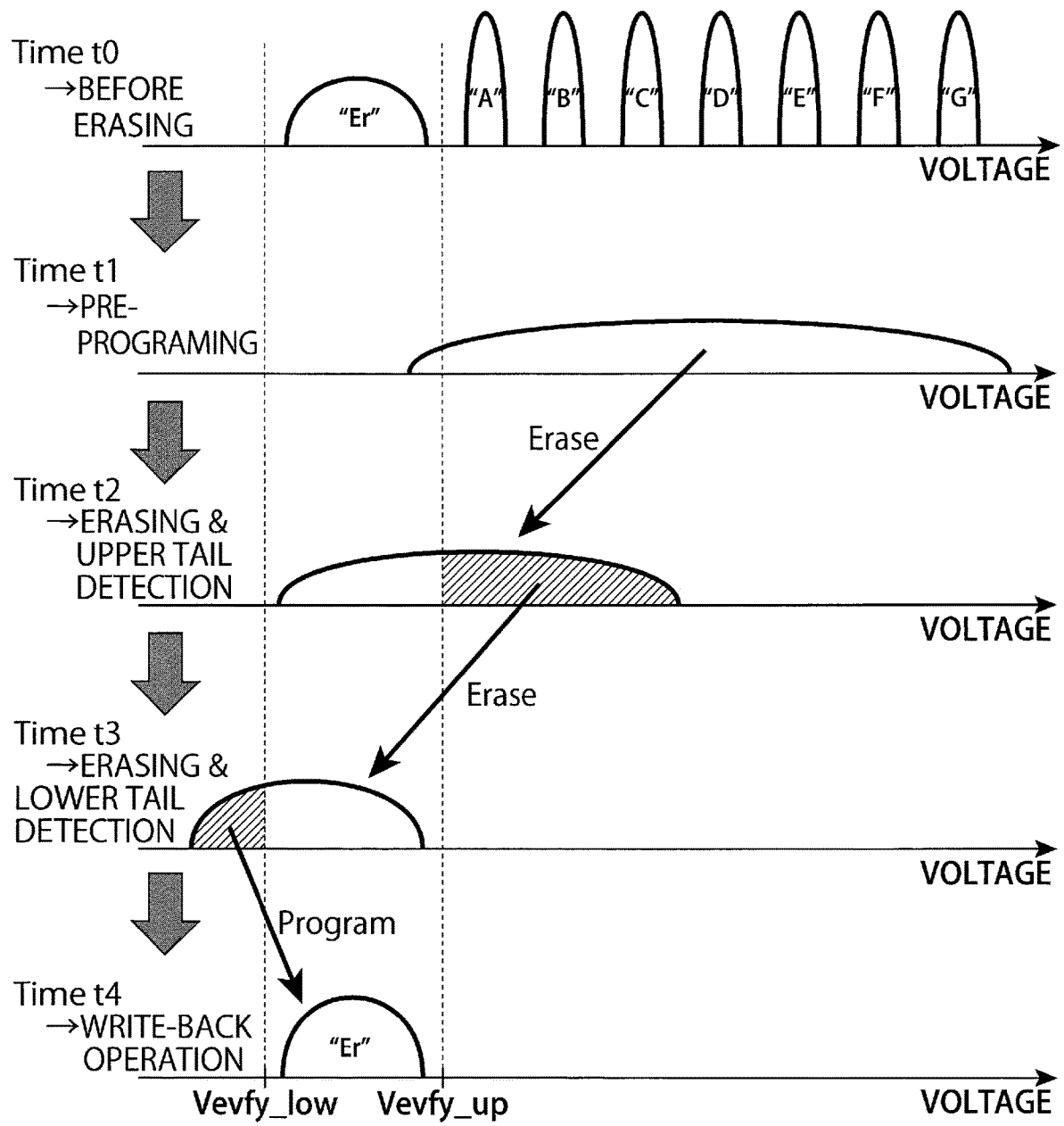
FIG. 10 shows transition of threshold voltage distribution of the memory cells when the semiconductor memory device according to the first embodiment is in an erase operation.

First, the overall procedure of the data erase operation will be discussed with reference to FIG. 10. FIG. 10 shows transition of the threshold voltage distribution of memory cell transistors MT in the data erase operation.

As shown in FIG. 10, at time t0 before the data erase operation starts, the memory cell transistors MT of an erase target block BLK are in one of the "Er" to "G" states to hold various bit values.

Next, in the NAND flash memory 100, upon reception of an erase command sent by the controller 200, the sequencer 170 initiates the data erase operation. In particular, at time t1 shown in FIG. 10, the sequencer 170 executes pre-programming. The pre-programming includes an operation of programming the memory cell transistors MT of the erase target block BLK to increase the threshold voltage of any memory cell transistor MT in the "Er" state to a threshold voltage which is higher than the read voltage VA, for example, to a certain positive threshold voltage. As a result, as shown in FIG. 10, at time t1, the threshold voltage distribution of the memory cell transistors MT of the erase target block presents a continuous distribution rather than a discrete distribution presented at time t0.

Next, the sequencer 170 executes an erase operation at time t2 in FIG. 10 to shift the threshold voltages of the memory cell transistors MT to a lower voltage side. In the initial erase operation, it is not necessary to bring the threshold voltages of all the memory cell transistors MT into the "Er" state. The initial erase operation is executed to bring the upper limit of the threshold voltage distribution of all the memory cell transistors MT to voltages lower than the threshold voltage at the time t1, for example, which may be at the level of the threshold voltage distribution of the "C" or "D" state. However, FIG. 10 presents a mere example, and in another example, the upper voltage limit at time t2 may be set to be lower than the voltage level of the threshold voltage distribution of the "G" state. After the initial erase operation, the sequencer 170 confirms whether or not there is any memory cell transistor MT having a threshold voltage higher than a first erase verify voltage Vevfy_up (i.e., any memory cell transistor MT having a threshold voltage corresponding to the shaded region as shown at time t2 of FIG. 10). This is referred to as "upper tail detection". In the upper tail detection, any memory cell having a threshold value higher than the threshold voltage of the erase state is detected. The first erase verify voltage Vevfy_up may be smaller than or equal to the read voltage VA, or may be a voltage that defines the upper limit of the threshold value of the "Er" state. The voltage Vevfy_up may be 0V, or may be a negative value, or a positive value lower than or equal to the read voltage VA.

When the presence of any memory cell transistor MT having a threshold value higher than the first erase verify voltage Vevfy_up is detected, the sequencer 170 further executes the erase operation to shift the threshold voltages of the memory cell transistors MT to a lower voltage side.

The erase operation is executed to bring the threshold voltages of all the memory cell transistors MT to voltages equal to or lower than the first erase verify voltage Vevfy_up. If, after the erase operation, there is no longer a memory cell transistor MT having a threshold voltage higher than the first erase verify voltage Vevfy_up, the sequencer 170 confirms whether or not there is any memory cell transistor MT having a threshold voltage lower than or equal to the second erase verify voltage Vevfy_low (i.e., any memory cell transistor MT having a threshold voltage corresponding to the shaded region as shown at time t3 of FIG. 10). This is referred to as "lower tail detection". The lower tail detection is executed to detect the presence of any overly erased memory cell transistors MT. The second erase verify voltage Vevfy_low is lower than the first erase verify voltage Vevfy_up. The second erase verify voltage may be a voltage which defines the lower limit of the threshold voltage of the "Er" state, and may be a negative voltage. Unlike the upper tail detection, in the lower tail detection, memory cell transistors MT having a threshold voltage lower than or equal to the second erase verify voltage Vevfy_low may be identified.

Thereafter, the sequencer 170 executes an operation of programming the memory cell transistors MT having a threshold voltage lower than or equal to the second erase verify voltage Vevfy_low to increase the threshold voltages of those memory cell transistors MT to voltages higher than the second erase verify voltage Vevfy_low.

By executing the data erase operation in the above-described manner, the threshold voltages of the memory cell transistors MT of the erase target block BLK are set to voltages which are higher than the second erase verify voltage Vevfy_low and lower than or equal to the first erase verify voltage Vevfy_up.

In the first embodiment as well as second to fifth embodiments described below, various methods for the upper tail detection will be discussed. In the sixth to tenth embodiments, various methods for the lower tail detection will be discussed.

1.2.2 Upper Tail Detection Method

Figure 11:
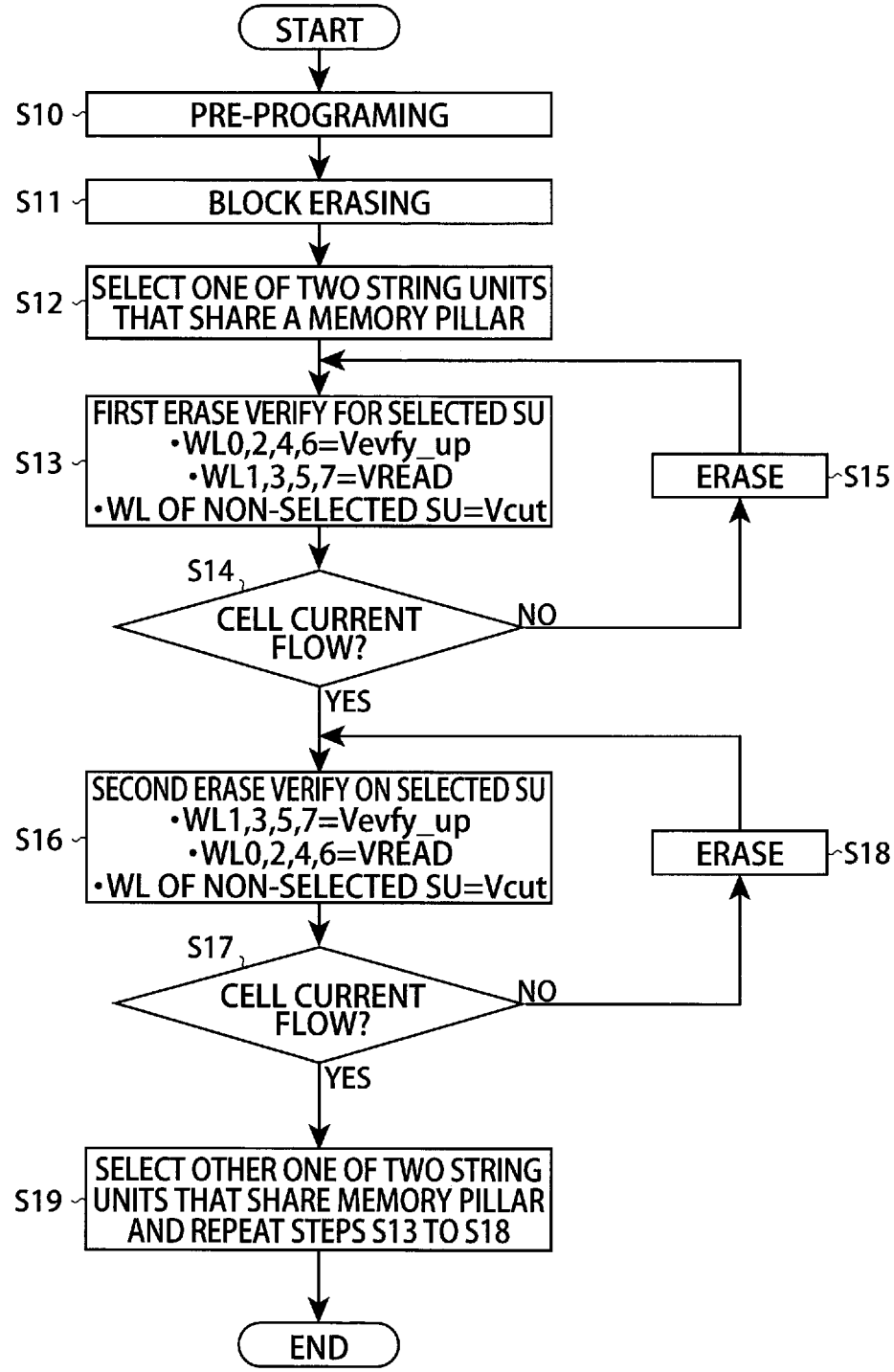
FIG. 11 shows a flowchart of the erase operation of the semiconductor memory device according to the first embodiment.

An upper tail detection method executed in the semiconductor memory device according to the first embodiment will be described together with the erase operation. FIG. 11 shows a flowchart of part of the erase operation executed until the upper tail detection succeeds after the erase operation.

As shown in FIG. 11, for one block BLK, the sequencer 170 executes the pre-programming (step S10), and then the erase operation (the erase operation at step S11). The state of the NAND strings in this erase operation is illustrated in FIG. 12. FIG. 12 schematically illustrates a cross section of a memory pillar MP in which two NAND strings 50 of the string units SU0 and SU1 are formed. In particular, FIG. 12 illustrates how voltages are applied to the memory pillar MP and the word lines WLe0 to WLe7 and WLo0 to WLo7 in the first erase operation.

In the example shown in FIG. 12, the row decoder 120 applies a voltage VISO (e.g., 0V) to all the word lines WLe0 to WLe7 and WLo0 to WLo7, and a well driver (not shown) applies an erase voltage VERA (e.g., 20V, where VERA>VISO) to the semiconductor layer 31 of the memory pillar MP. When the voltages VERA and VISO are so applied, electrons are drawn off from the charge accumulation layer 33 of the memory cell transistor MT to the semiconductor layer 31 to lower the threshold voltage of the memory cell transistor MT. This erase operation is executed simultaneously for all the string units SU0 to SU3 of the block BLK. The selection gate lines SGD and SGS may be in an electrically floating state, or the voltage VERA may be applied to the selection gate lines SGD and SGS by the row decoder 120.

Figure 13:
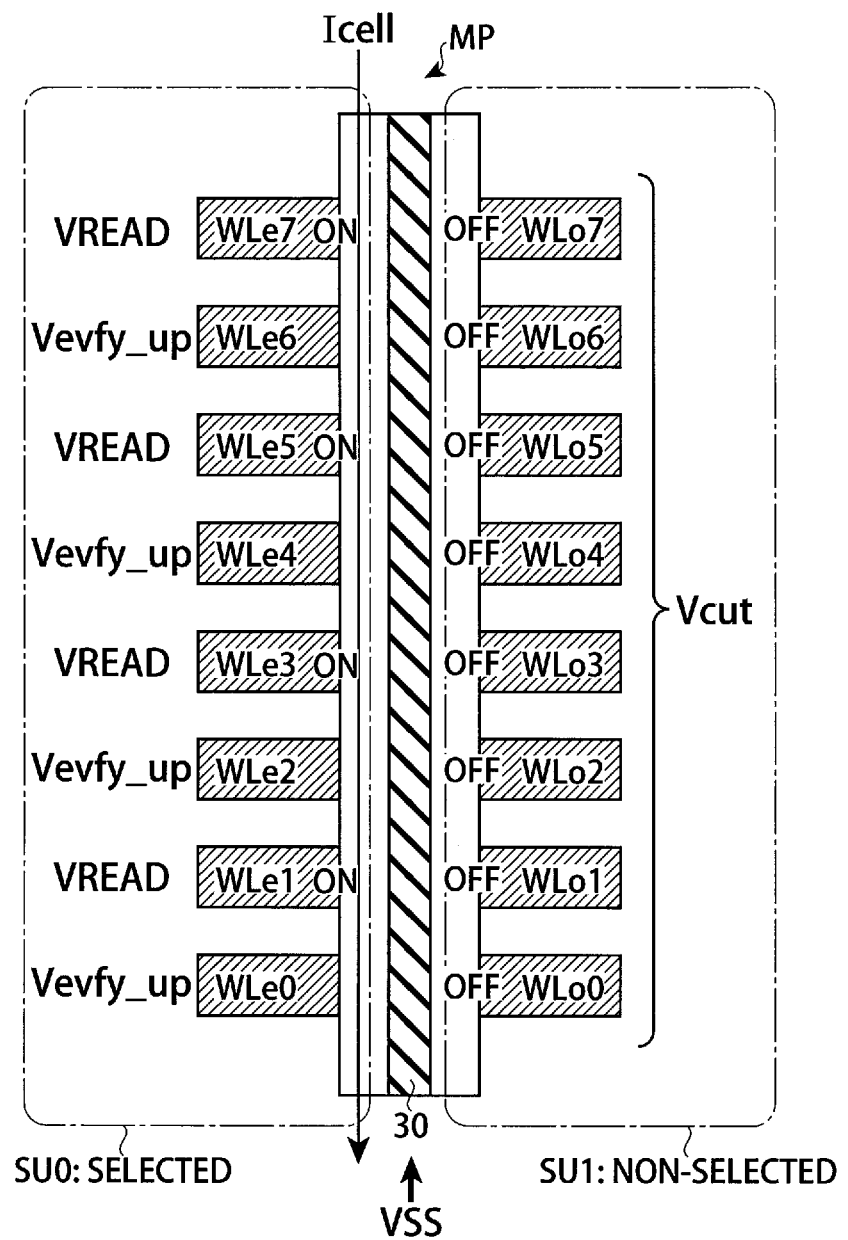

Next, as shown in FIG. 11, the sequencer 170 selects one of the two string units SU respectively including the NAND strings 50e and 50o that share a memory pillar MP in the erase target block (step S12). The sequencer 170 executes a first erase verify operation for the string unit SU selected at step S12 (step S13). The first erase verify operation is executed to determine whether the threshold voltages of the memory cell transistors MT coupled to the even word lines WL0 WL2, WL4, and WL6 in the selected string unit SU are lower than or equal to the first erase verify voltage Vevfy_up, as illustrated in FIG. 13. Like FIG. 12, FIG. 13 schematically shows how voltages are applied to the memory pillar MP and the word lines WLe0 to WLe7 and WLo0 to WLo7 in the first erase verify operation with a cross section of the memory pillar MP.

In the example shown in FIG. 13, the string unit SU0 is selected from the string units SU0 and SU1 respectively including the NAND strings 50e and 50o that share the memory pillar MP. The row decoder 120 applies the first erase verify voltage Vevfy_up to the word lines WLe0, WLe2, WLe4, and WLe6 and the voltage VREAD to the word lines WLe1, WLe3, WLe5, and WLe7. The row decoder 120 also applies the voltage Vcut to the word lines WLo0 to WLo7. The voltage Vcut is the same as the voltage used in the data read operation to be applied to a word line WLoi when a word line WLei is selected as a read target (where i is any number from 0 to 7 in this example), and to be applied to a word line WLei when a word line WLoi is selected as a read target. The value of the voltage Vcut is low enough to turn off even any memory cell transistor MT which is in the erase state. The voltage Vcut is lower than the voltage VA, and may be a negative voltage lower than or equal to the second erase verify voltage Vevfy_low.

The row decoder 120 further applies a voltage VSG to the selection gate lines SGD0 and SGSe to turn on the selection transistors ST1 and ST2 of the selected string unit SU0. On the other hand, the row decoder 120 applies the voltage VSS (e.g., 0V) to the selection gate lines SGD1 and SGSo to turn off the selection transistor ST1 of the non-selected string unit SU1. The same voltages are applied for other non-selected string units SU.

The sense amplifier 140 charges the bit line BL coupled to the memory pillar MP, and applies a voltage VPRE (e.g., 0.7V) to the bit line BL.

As a result of the application of the above-described voltages, the memory cell transistors MT0 to MT7 of the non-selected string unit SU1 are turned off, as illustrated in FIG. 13. On the other hand, in the selected string unit SU0, the memory cell transistors MT1, MT3, MT5, and MT7 in which the voltage VREAD is applied to their control gates via the corresponding word lines WLe1, WLe3, WLe5 and WLe7 are turned on. The memory cell transistors MT0, MT2, MT4, and MT6 are turned on when the first erase verify voltage Vevfy_up is applied to their control gates via the corresponding word lines WLe0, WLe2, WLe4, and WLe6, if their threshold voltages are lowered to voltages lower than or equal to the first erase verify voltage Vevfy_up, and, if not, these memory cell transistors are turned off. If all of the memory cell transistors MT0, MT2, MT4, and MT6 of the selected string unit SU0 are turned on, a cell current Icell flows from the bit line BL to the source line SL (not shown). If any of the memory cell transistors MT0, MT2, MT4, and MT6 of the selected string unit SU0 stays in the OFF state, the cell current Icell does not flow.

As shown in FIG. 11, if the cell current Icell does not flow (NO at step S14), the sequencer 170 determines that the threshold voltage of any of the memory cell transistors MT0, MT2, MT4, and MT6 in the selected string unit SU0 is not sufficiently lowered below the first erase verify voltage Vevfy_up, and thus repeats the erase operation for the block (step S15). The operation of step S15 is the same as that of step S11. Thereafter, the first erase verify operation is repeated (step S13). Whether or not the cell current Icell flows is determined at the sense amplifier 140.

Figure 14:
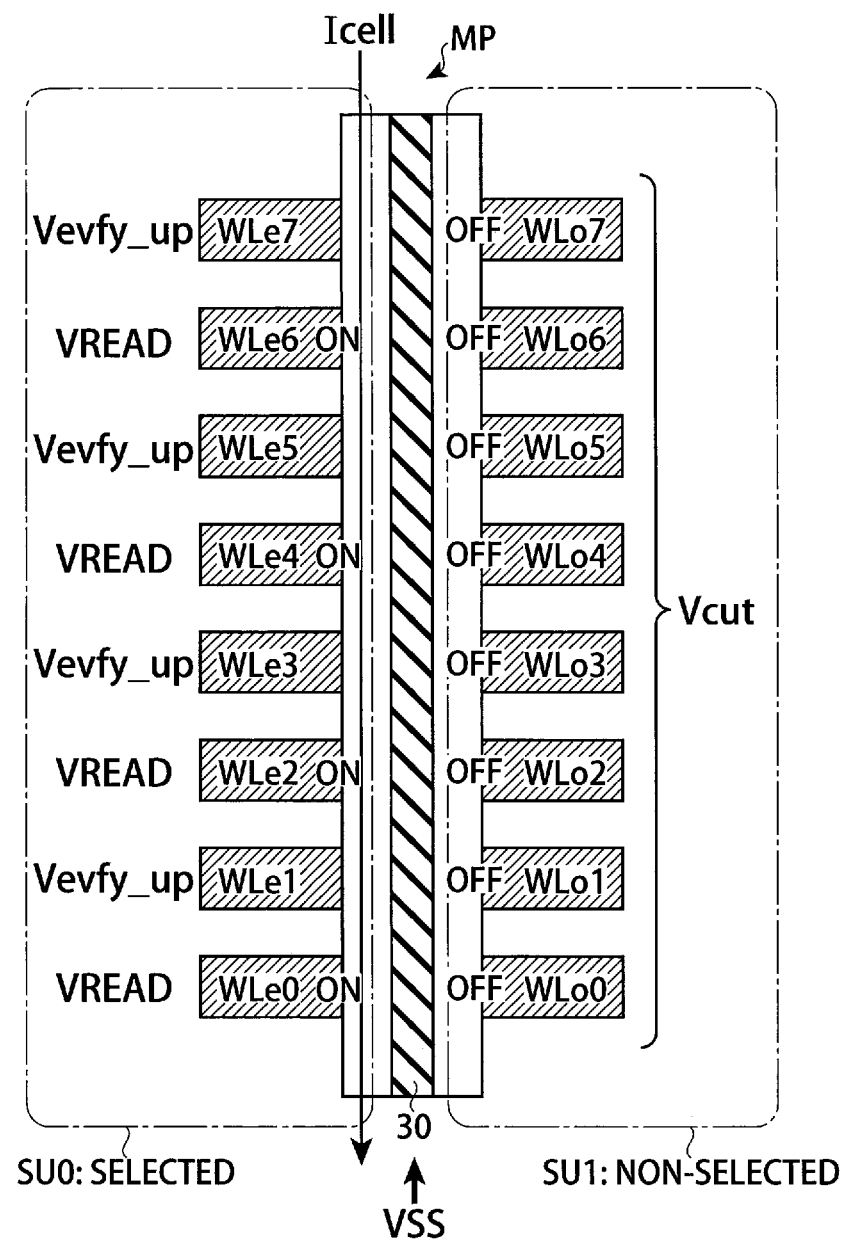

In contrast, if the cell current Icell flows (YES at step S14), the sequencer 170 executes a second erase verify operation for the string unit SU (the string unit SU0 in this example) selected at step S12 (step S16). The second erase verify operation is executed to determine whether or not the threshold voltages of the memory cell transistors MT coupled to the odd word lines WLe1, WLe3, WLe5, and WLe7 in the selected string unit SU0 are lower than or equal to the first erase verify voltage Vevfy_up. Either the first erase verify operation or the second erase verify operation may be executed first. The application of voltages in the second erase verify operation is illustrated in FIG. 14. Like FIG. 12, FIG. 14 schematically shows how the voltages are applied to the memory pillar MP and the word lines WLe0 to WLe7 and WLo0 to WLo7 in the second erase verify operation with a cross section of the memory pillar MP.

The second erase verify operation of FIG. 14 differs from the first erase verify operation of FIG. 13 in that the first erase verify voltage Vevfy_up is applied to the word lines WLe1, WLe3, WLe5, and WLe7 instead of the voltage VREAD and that the voltage VREAD is applied to the word lines WLe0, WLe2, WLe4, and WLe6 instead of the voltage Vevfy_up.

With no flow of the cell current Icell (NO at step S17), the first erase operation for the block BLK is repeated (step S18). In contrast, if the cell current Icell flows (YES at step S17), it is determined that the threshold voltages of the memory cell transistors MT0 to MT7 in the selected string unit SU0 are lower than or equal to the first erase verify voltage Vevfy_up.

Next, the sequencer 170 selects the other (i.e. the string unit SU1) of the two string units SU0 and SU1 and repeats the operations of step S13 to S18 (step S19). The same operations are also executed for the remaining string units SU2 and SU3.

1.3 Effects of First Embodiment

According to the first embodiment, the operational reliability of the semiconductor memory device can be enhanced. The effects will be explained below.

With the upper tail detection in the semiconductor memory device according to the present embodiment, the threshold voltages of the memory cell transistors in the "Er" state are increased to voltages higher than the voltage Vcut by pre-programming the memory cell transistors MT in the data erase operation. Thus, in the first and second erase verify operations, when the voltage Vcut to the word lines WL0 to WL7 of the non-selected string unit SU, the memory cell transistors MT0 to MT7 in the non-selected string unit SU can securely stay in the off state. Thus, in the first and second erase verify operations, the reliability of the verify result that is determined based on the on/off state of the memory cell transistors MT to the control gates of which the first erase verify voltage Vevfy_up is applied can be enhanced.

In a memory pillar MP as illustrated in FIGS. 6 and 7, two memory cell transistors MT that face each other across the memory pillar MP in the Y direction share the semiconductor layer 31 (which functions as a back-gate of the memory cells) of the memory pillar MP. When one of the two facing memory cell transistors MT is turned on, the turned-on memory cell transistor allows the cell current Icell to flow. According to the present embodiment, however, the memory cell transistors MT of the non-selected string unit SU can securely stay in the off state, and the cell current Icell can thereby be prevented from flowing through these memory cell transistors MT. Whether or not the current Icell flows depends only on whether the memory cell transistors MT of the selected string unit to which the first erase verify voltage Vevfy_up is applied are turned on or off, or in other words, whether the threshold voltages of these memory cell transistors MT are lower than or equal to the first erase verify voltage Vevfy_up, or greater than the same. In this manner, the influence of the memory cell transistors MT of the non-selected string unit SU can be eliminated.

In addition, in the semiconductor memory device according to the first embodiment, the first erase verify operation and the second erase verify operation are performed after the erase operation. In each erase verify operation, every other word line WL of the selected string unit SU is selected, and the voltage VREAD is applied to the non-selected word lines WL of the selected string unit SU. The voltage VREAD is a voltage that is applied to the non-selected word lines WL in the data read operation. In other words, the non-selected word lines WL adjacent to the selected word lines WL in each erase verify operation are set to the same voltage condition as in the data read operation. Thus, the influence of the non-selected memory cell transistors MT on the threshold voltage of the selected memory cell transistor MT in the first and second erase verify operations (referred to as an inter-cell interference effect) may be reduced to approximately the same level as the inter-cell interference effect occurring in the data read operation. Accordingly, the reliability of the data erase operation can be enhanced.

2. Second Embodiment

A semiconductor memory device according to the second embodiment will be explained. The second embodiment provides an upper tail detection method that differs from the first embodiment. Specifically, the voltage Vevfy_up in the erase verify operation of the first embodiment is applied to all the word lines of the selected string unit SU. The following explanation focuses on differences of the second embodiment with respect to the first embodiment.

2.1 Upper Tail Detection Method

The upper tail detection performed in the semiconductor memory device according to the present embodiment will be explained with reference to FIG. 15. Like FIG. 11, FIG. 15 shows a flowchart of part of the erase operation performed until the upper tail detection succeeds after the erase operation.

Figure 15:
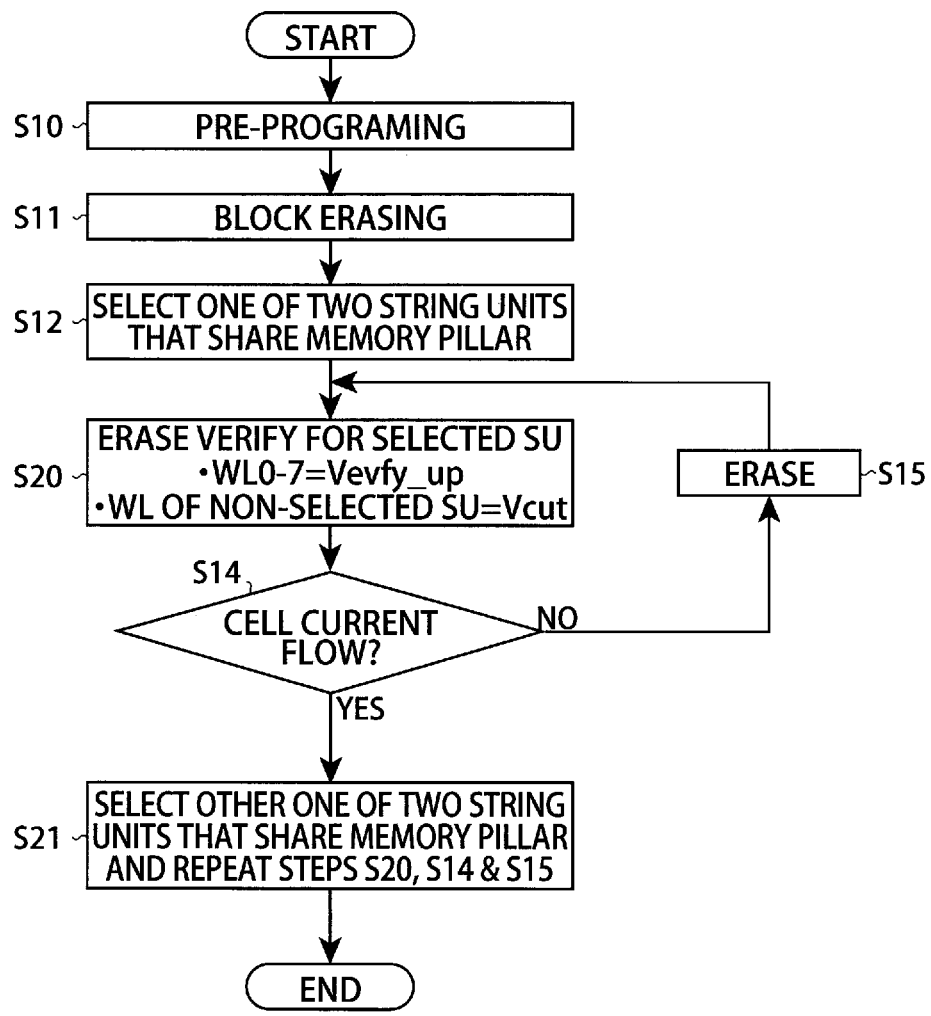
FIG. 15 shows a flowchart of an erase operation of a semiconductor memory device according to a second embodiment.
Figure 16:
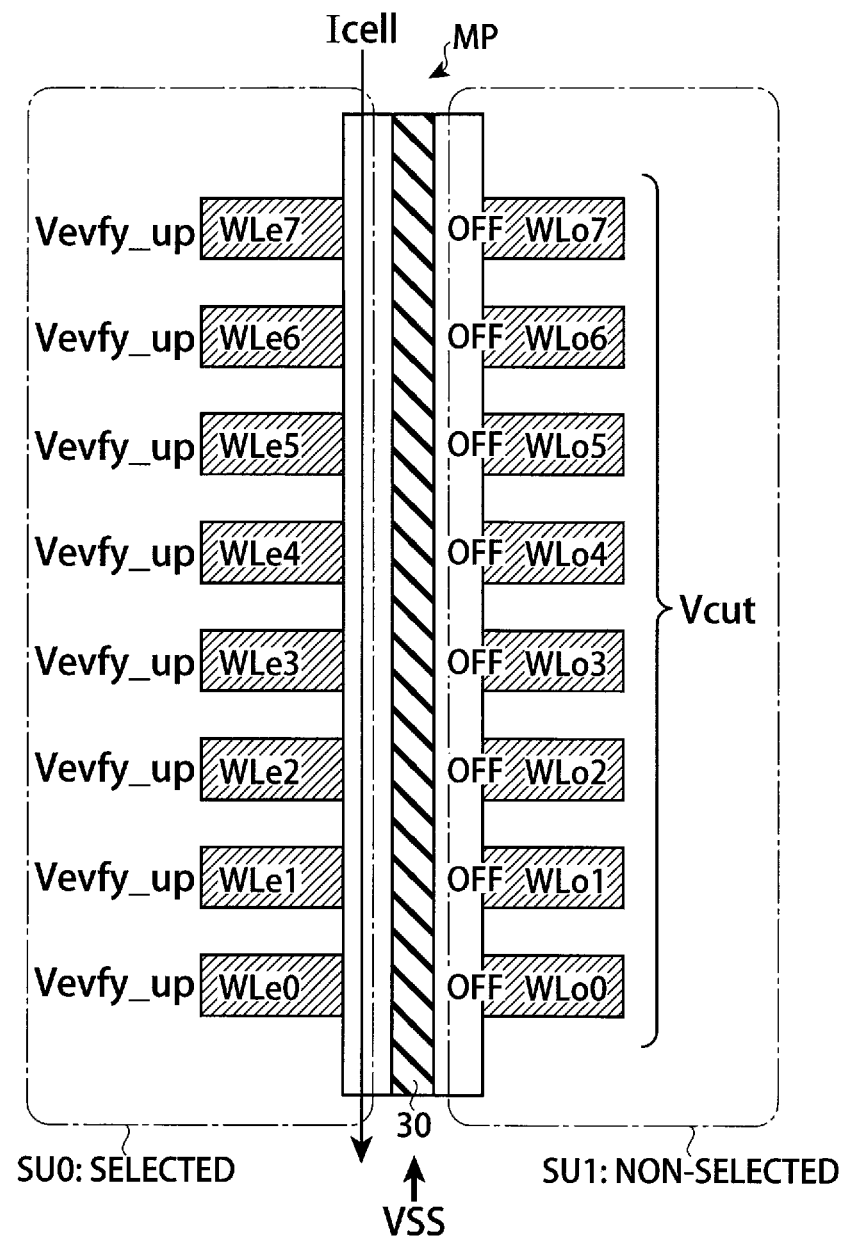
FIGS. 16 and 17 show vertical sections of a pillar of the semiconductor memory device according to the second embodiment.

As shown in FIG. 15, after executing steps S10 to S12, the sequencer 170 executes the erase verify operation (step S20). FIG. 16 schematically shows how voltages are applied to the memory pillar MP and the word lines WLe0 to WLe7 and WLo0 to WLo7 in the erase verify operation of step 20 with a cross section of the memory pillar MP.

In the example illustrated in FIG. 16, the string unit SU0 is selected to be verified, and the row decoder 120 selects the word lines WLe0 to WLe7 to apply the first erase verify voltage Vevfy_up. Furthermore, the row decoder 120 applies the voltage Vcut to the word lines WLo0 to WLo7 of non-selected string unit SU1.

Consequently, the memory cell transistors MT0 to MT7 of the non-selected string unit SU1 stay in the off state. On the other hand, if all of the memory cell transistors MT0 to MT7 of the selected string unit SU0 are turned on by applying the first erase verify voltage Vevfy_up to the gates of the memory cell transistors MT0 to MT7, the cell current Icell flows. However, if one or more of the memory cell transistors MT0 to MT7 stay in the off state, the cell current Icell does not flow.

As indicated in FIG. 15, if the cell current Icell does not flow (NO at step S14), the sequencer 170 determines that the threshold voltages of the one or more memory cell transistors MT0 to MT7 of the selected string unit SU0 are not sufficiently lowered below the first erase verify voltage Vevfy, and repeats the erase operation for the block (step S15).

Figure 17:
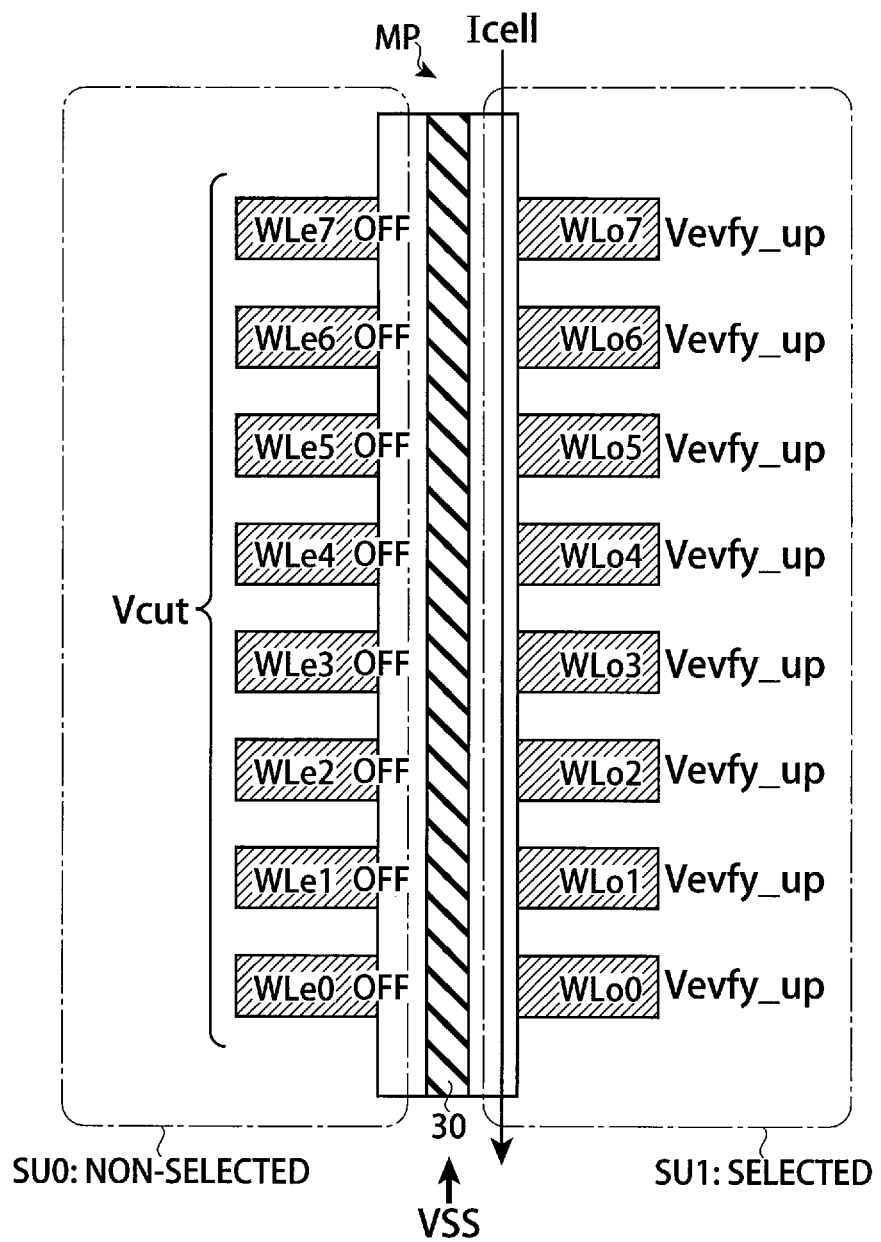

On the other hand, if the cell current Icell flows (YES at step S14), the sequencer 170 determines that the threshold voltages of the memory cell transistors MT0 to MT7 of the selected string unit SU0 are equal to or lower than the first erase verify voltage Vevfy, and selects the string unit SU1 to repeat the operations of steps S20, S14, and S15 (step S21). FIG. 17 shows the application of voltages in these operations. As illustrated in FIG. 17, the voltage Vcut is applied to the word lines WLe0 to WLe7 of the string unit SU0 and the voltage Vevfy_up is applied to the word lines WLo0 to WLo7 of the string unit SU1.

Thereafter, similar operations are executed for the remaining string units SU2 and SU3.

2.2 Effects of Second Embodiment

In the semiconductor memory device according to the second embodiment, the first erase verify voltage Vevfy_up is applied to all the word lines WL0 to WL7 of the selected string unit SU in the erase verify operation. That is, all the memory cell transistors MT of the selected string unit SU are targeted for the erase verify operation. Thus, since memory cell transistors MT formed in one memory pillar MP may be verified by executing the erase verify operation at least twice, the erase operation speed can be increased.

3. Third Embodiment

Next, a semiconductor memory device according to a third embodiment will be explained. The third embodiment provides another upper tail detection method that differs from the first embodiment. In the semiconductor memory device according to the third embodiment, in contrast with the erase verify operation of the first embodiment, a pair of NAND strings 50e and 50o that share a memory pillar MP are simultaneously selected for the erase verify operation. The following explanation focuses only on differences of the third embodiment with respect to the first embodiment.

3.1 Upper Tail Detection Method

The upper tail detection in the semiconductor memory device according to the third embodiment will be explained with reference to FIG. 18. Like FIG. 11, FIG. 18 shows a flowchart of part of the erase operation performed until the upper tail detection succeeds after the erase operation.

Figure 18:
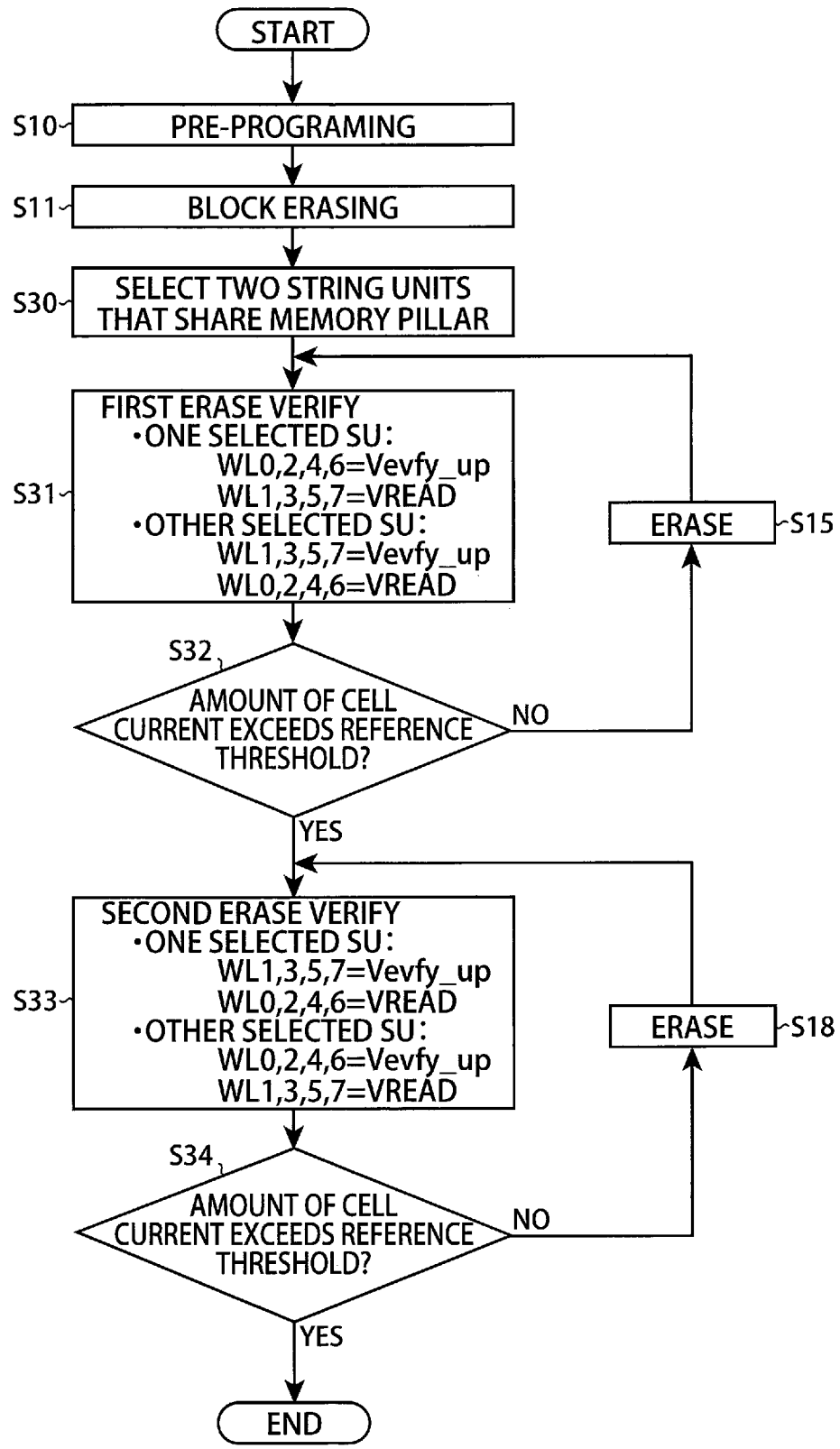
FIG. 18 shows a flowchart of an erase operation of the semiconductor memory device according to the third embodiment.
Figure 19:
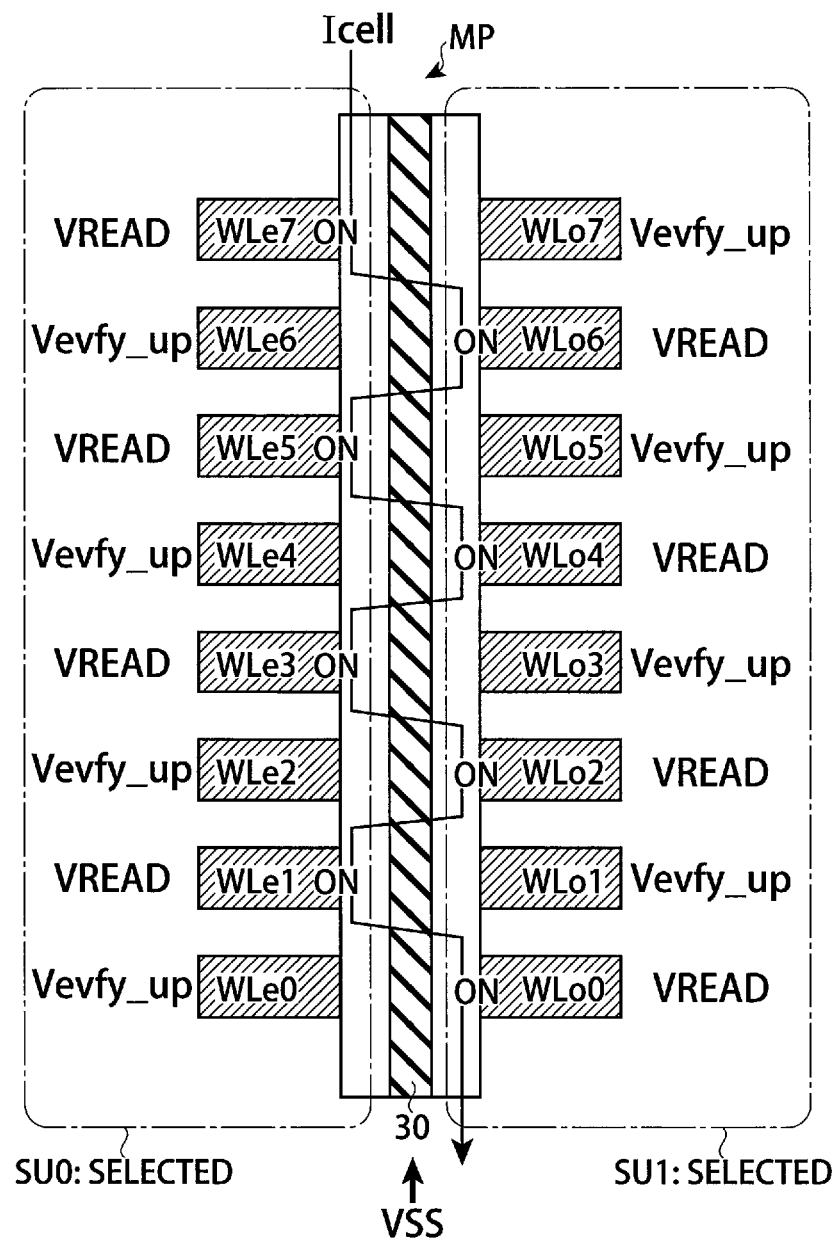

As shown in FIG. 18, for the erase target block, after executing steps S10 and S11, the sequencer 170 selects both of the two string units SU0 and SU1 that share a memory pillar MP (step S30). Then, the sequencer 170 executes the first erase verify operation for the two string units SU0 and SU1 selected at step S30 (step S31). In the semiconductor memory device according to the third embodiment, the first erase verify operation is executed to determine whether the threshold voltages of the memory cell transistors MT coupled to the even word lines WL0, WL2, WL4, and WL6 in one of the selected string units SU and the memory cell transistors MT coupled to the odd word lines WL1, WL3, WL5, and WL7 in the other selected string unit SU are lower than or equal to the first erase verify voltage Vevfy_up, as illustrated in FIG. 19. Like FIG. 12, FIG. 19 schematically shows the application of voltages in the first erase verify operation with a cross section of the memory pillar MP.

In the example illustrated in FIG. 19, two string units SU0 and SU1 are both selected. The row decoder 120 applies the first erase verify voltage Vevfy_up to the word lines WLe0, WLe2, WLe4, and WLe6, and to the word lines WLo1, WLo3, WLo5, and WLo7. The row decoder 120 also applies the voltage VREAD to the word lines WLe1, WLe3, WLe5, and WLe7 and to the word lines WLo0, WLo2, WLo4, and WLo6. The row decoder 120 further applies the voltage VSG to the selection gate lines SGD0, SGD1, SGSe, and SGSo to turn on the selection transistors ST1 and ST2 of the string units SU0 and SU1.

As a result of applying the voltage VREAD to the control gates of the memory cell transistors MT1, MT3, MT5, and MT7 of the string unit SU0 and the memory cell transistors MT0, MT2, MT4, and MT6 of the string unit SU1 as illustrated in FIG. 19, the memory cell transistors MT1, MT3, MT5, and MT7 of the string unit SU0 are turned on, and the memory cell transistors MT0, MT2, MT4, and MT6 of the string unit SU1 are turned on. The cell current Icell, as indicated by an arrow in FIG. 19, flows through those memory cell transistors MT in which the voltage VREAD is applied to their control gates.

The memory cell transistors MT0, MT2, MT4, and MT6 of the string unit SU0 and the memory cell transistors MT1, MT3, MT5, and MT7 of the string unit SU1, to the control gates of which the first erase verify voltage Vevfy_up is applied, are turned on if their threshold values are lowered to voltages equal to or lower than the first erase verify voltage Vevfy_up, thereby allowing the cell current Icell to flow. This means that, as more of those memory cell transistors have the threshold values lower than or equal to the first erase verify voltage Vevfy_up (i.e. as more of those memory cell transistors are turned on), the amount of cell current Icell increases.

As shown in FIG. 18, if the amount of cell current Icell does not exceed a predetermined reference threshold value (NO at step S32), the sequencer 170 determines that the threshold voltage of any of the memory cell transistors MT0, MT2, MT4, and MT6 of the string unit SU0 and the memory cell transistors MT1, MT3, MT5, and MT7 of the string unit SU1 is not sufficiently lowered below the first erase verify voltage Vevfy_up, and thus repeats the erase operation for the blocks (step S15). Then, the first erase verify operation is executed again (step S31). Whether the amount of cell current Icell exceeds the reference threshold value may be determined at the sense amplifier 140.

If the amount of cell current exceeds the reference threshold value (YES at step S32), the sequencer 170 executes the second erase verify operation for the two string units selected at step S30 (step S33). In the semiconductor memory device according to the third embodiment, the second erase verify operation is executed to determine whether the threshold voltages of the memory cell transistors MT coupled to the odd word lines WL1, WL3, WL5, and WL7 in one of the selected string units SU and the memory cell transistors MT coupled to the even word lines WL0, WL2, WL4, and WL6 in the other selected string unit SU are lower than or equal to the first erase verify voltage Vevfy_up. Either the first erase verify operation or the second erase verify operation may be executed first. The application of voltages in the second erase verify operation is illustrated in FIG. 20. Like FIG. 12, FIG. 20 schematically shows the application of voltages in the second erase verify operation with cross section of the memory pillar MP.

The second erase verify operation of FIG. 20 differs from the first erase verify operation of FIG. 19 in that the first erase verify voltage Vevfy_up is applied to the word lines WLe1, WLe3, WLe5, and WLe7 and the word lines WLo0, WLo2, WLo4, and WLo6 instead of the voltage VREAD, and that the voltage VREAD is applied to the word lines WLe0, WLe2, WLe4, and WLe6 and the word lines WLo1, WLo3, WLo5, and WLo7 instead of the first erase verify voltage Vevfy_up.

If the amount of cell current does not exceed the reference threshold value (NO at step S34), the sequencer 170 repeats the erase operation (step S18). If the amount of cell current exceeds the reference threshold value (YES at step S34), it is determined that the threshold voltages of all of the memory cell transistors MT0 to MT7 in the two string units SU0 and SU1 are lower than or equal to the first erase verify voltage Vevfy_up.

The same operations are executed for the remaining string units SU2 and SU3.

3.2 Effects of Third Embodiment

In the semiconductor memory device according to the third embodiment, two string units SU that share a memory pillar MP are selected in the erase verify operation. In the same manner as discussed in the first embodiment, every other word line WL is selected for application of the first erase verify voltage Vevfy_up in two erase verify operations, namely the first erase verify operation and second erase verify operation. In the first and second erase verify operations, the voltage VREAD is applied to the word lines WL positioned adjacent to the word lines to which the first erase verify voltage Vevfy_up is applied.

As a result, in the same manner as in the second embodiment, all the memory cell transistors formed in one memory pillar MP can be verified by executing the erase verify operation at least twice. Furthermore, as discussed in the first embodiment, the erase verify operation can be realized under a condition of application of voltages similar to that in the data read operation.

4. Fourth Embodiment

A semiconductor memory device according to the fourth embodiment will be explained. The semiconductor memory device according to the fourth embodiment provides another upper tail detection method. According to the fourth embodiment, the erase verify operation of the third embodiment is modified in such a way that the same word lines WL in the selected two string units SU are selected for application of the first erase verify voltage Vevfy_up. The following explanation focuses on differences of the fourth embodiment with respect to the first and third embodiments.

4.1 Upper Tail Detection Method

The upper tail detection performed in the semiconductor memory device according to the fourth embodiment will be explained with reference to FIG. 21. Like FIG. 18, FIG. 21 shows a flowchart of part of the erase operation executed until the upper tail detection succeeds after the erase operation.

Figure 22:
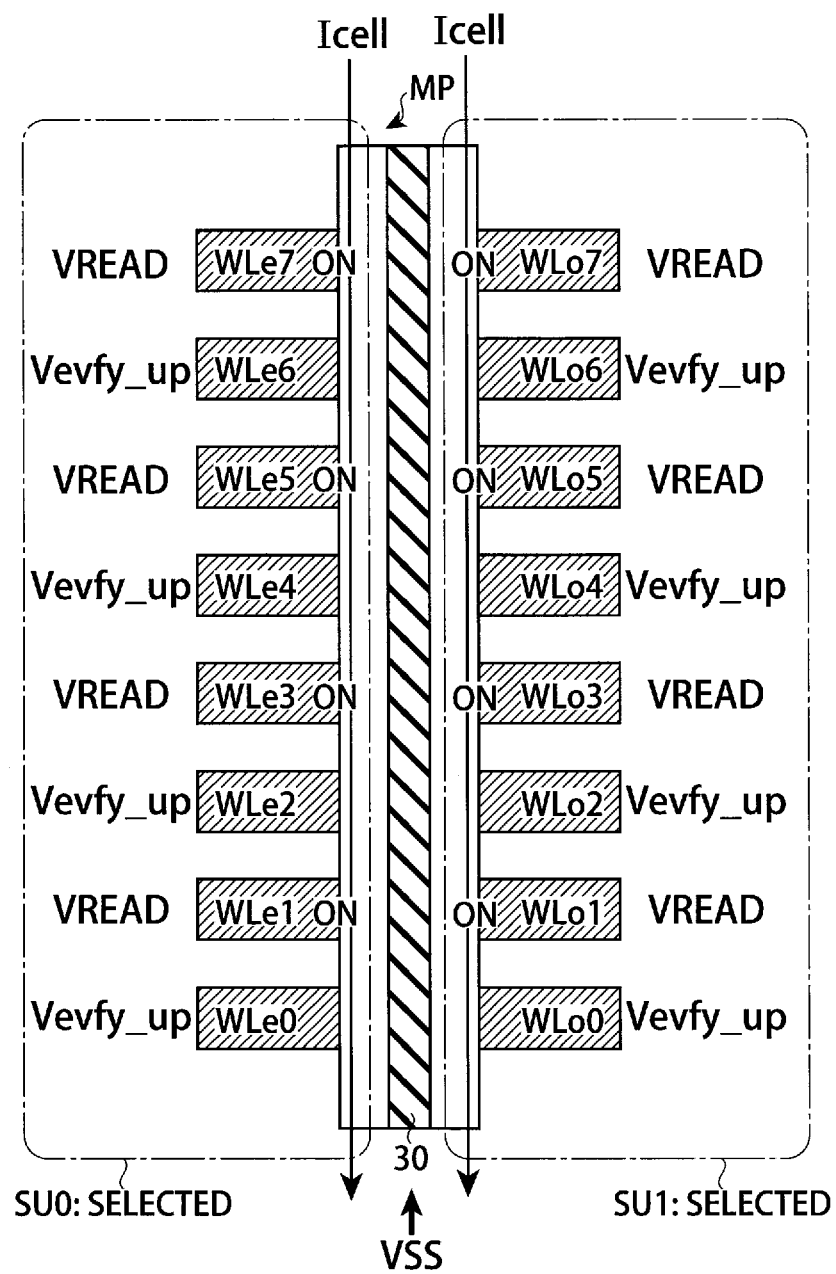
FIGS. 22 and 23 show vertical sections of a pillar of the semiconductor memory device according to the fourth embodiment.

The operations of steps S10, S11, and S30 are executed in the same manner as in the third embodiment, as shown in FIG. 21. Then, the sequencer 170 executes the first erase verify operation for the two string units SU selected at step S30 (step S40). In the semiconductor memory device according to the present embodiment, the first erase verify operation is executed to determine whether or not the threshold voltages of the memory cell transistors MT that are coupled to the even word lines WL0, WL2, WL4, and WL6 in the selected two string units SU are lowered to voltages lower than or equal to the first erase verify voltage Vevfy_up, as illustrated in FIG. 22. Like FIG. 19, FIG. 22 schematically shows the application of voltages in the first erase verify operation with cross section of the memory pillar MP.

In the example illustrated in FIG. 22, both of the string units SU0 and SU1 are selected. The row decoder 120 applies the first erase verify voltage Vevfy_up to the word lines WLe0, WLe2, WLe4, and WLe6, and to the word lines WLo0, WLo2, WLo4, and WLo6. The row decoder 120 also applies the voltage VREAD to the word lines WLe1, WLe3, WLe5, and WLe7, and to the word lines WLe1, WLe3, WLe5, and WLe7. The row decoder 120 further applies the voltage VSG to the selection gate lines SGD0, SGD1, SGSe, and SGSo to turn on the selection transistors ST1 and ST2 in the string units SU0 and SU1.

As a result of applying the voltage VREAD to the control gates of the memory cell transistors MT1, MT3, MT5, and MT7 in the string units SU0 and SU1, as illustrated in FIG. 22, the memory cell transistors MT1, MT3, MT5, and MT7 of the string units SU0 and SU1 are turned on in the string units SU0 and SU1. When the memory cell transistors MT0, MT2, MT4, and MT6 of the string unit SU0 or SU1 are turned on, the cell current Icell flows through the memory cell transistors MT0 to MT7 in the on state as indicated by the arrow in FIG. 22. For the memory cell transistors MT coupled to the word lines to which the voltage Vevfy_up is applied to allow the cell current Icell to flow, either one of the memory cell transistors MTi of the string units SU0 and SU1 coupled to the word lines WLei and WLoi to which the first erase verify voltage Vevfy_up is applied may be turned on. That is, one of the two memory cell transistors MTi facing each other across the memory pillar MP may be turned on. Furthermore, the cell current Icell increases when both of the two memory cell transistors MTi are in the on state.

As indicated in FIG. 21, if the amount of cell current Icell does not exceed a predetermined reference threshold value (NO at step S41), the sequencer 170 determines that the threshold voltage of any of the memory cell transistors MT0, MT2, MT4, and MT6 in the string units SU0 and SU1 is not sufficiently lowered below the first erase verify voltage Vevfy_up, and thus repeats the erase operation for the block (step S15). Then, the first erase verify operation is executed again (step S40). Whether the cell current Icell exceeds the reference threshold voltage may be determined at the sense amplifier 140.

Figure 23:
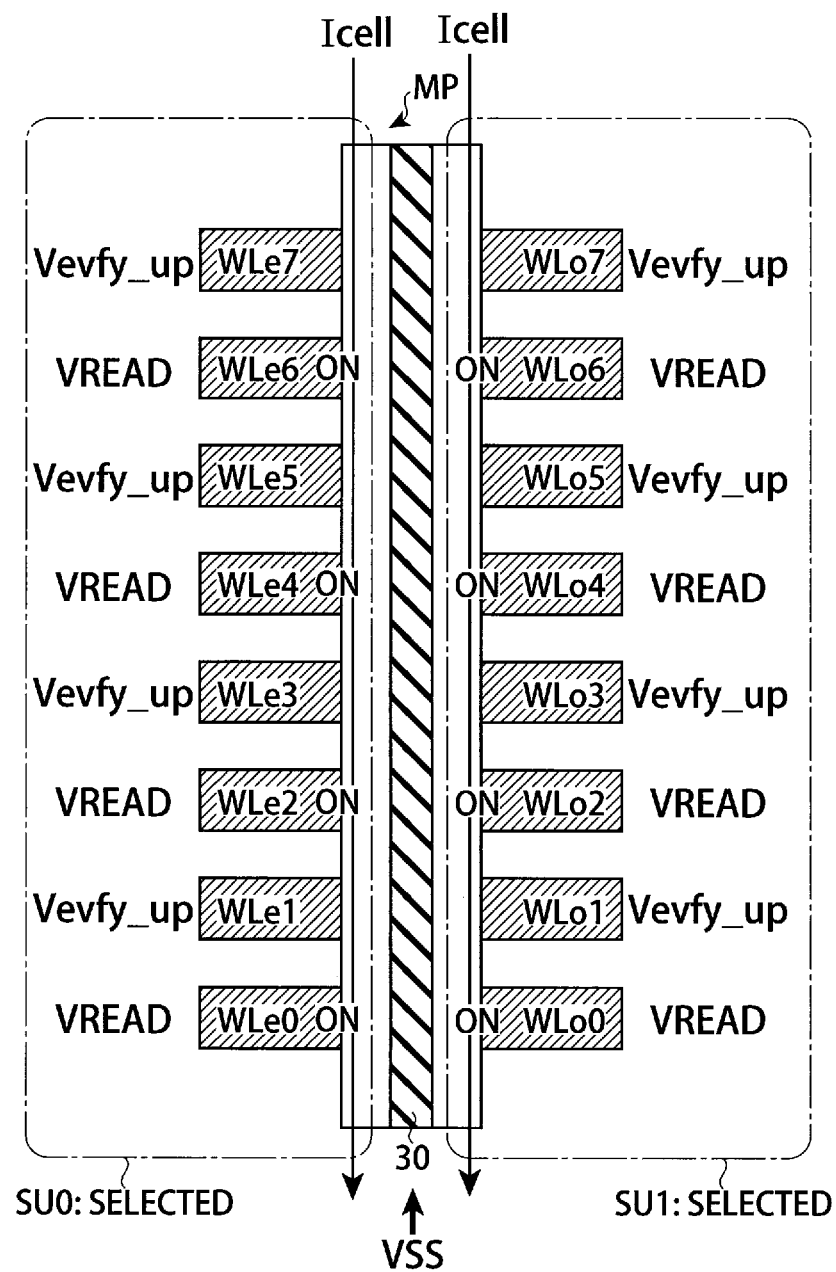

On the other hand, when the amount of cell current Icell exceeds the reference threshold value (YES at step S41), the sequencer 170 executes the second erase verify operation on the string units SU (i.e. the string units SU0 and SU1 in this example) selected at step S30 (step S42). In the semiconductor memory device according to the present embodiment, the second erase verify operation is executed to determine whether the threshold voltages of the memory cell transistors MT that are coupled to the odd word lines WL1, WL3, WL5, and WL7 in the selected two string units SU are lower than or equal to the first erase verify voltage Vevfy_up. Either the first erase verify operation or the second erase verify operation may be executed first. The application of voltages in the second erase verify operation is illustrated in FIG. 23. Like FIG. 20, FIG. 23 schematically shows the application of voltages in the second erase verify operation with a cross section of the memory pillar MP.

The second erase verify operation of FIG. 23 differs from the first erase verify operation of FIG. 22 in that the voltage Vevfy_up is applied to the word lines WLe1, WLe3, WLe5, and WLe7, and the word lines WLo1, WLo3, WLo5, and WLo7 instead of the voltage VREAD, and that the voltage VREAD is applied to the word lines WLe0, WLe2, WLe4, and WLe6, and the word lines WLo0, WLo2, WLo4, and WLo6 instead of the first erase verify voltage Vevfy_up.

If the amount of cell current does not exceed the reference threshold value (NO at step S43), the sequencer 170 repeats the erase operation (step S18). If the amount of cell current exceeds the reference threshold value (YES at step S43), it is determined that the threshold voltages of the memory cell transistors MT0 to MT7 included in the two string units SU0 and SU1 are lower than or equal to the first erase verify voltage Vevfy_up.

The same operations are executed for the remaining string units SU2 and SU3.

4.2 Effects of Fourth Embodiment

In the semiconductor memory device according to the fourth embodiment, the same effects as in the third embodiment can be achieved.

5. Fifth Embodiment

A semiconductor memory device according to a fifth embodiment will be explained. The fifth embodiment provides another upper tail detection method. In the semiconductor memory device according to the fifth embodiment, the erase verify operation as discussed in the third and fourth embodiments is modified in such a way that the first erase verify voltage is applied to all of the word lines. The following explanation focuses only on the differences of the fifth embodiment with respect to the first to fourth embodiments.

5.1 Upper Tail Detection Method

The upper tail detection in the semiconductor memory device according to the fifth embodiment will be explained with reference to FIG. 24. Like FIG. 18, FIG. 24 shows a flowchart of part of the erase operation performed until the upper tail detection succeeds after the erase operation.

As illustrated in FIG. 24, after executing the operations of steps S10, S11, and S30 in the same manner as explained in the third and fourth embodiments, the sequencer 170 executes another erase verify operation (step S50). FIG. 25 schematically shows the application of voltages in the erase verify operation of step 50 with cross section of the memory pillar MP.

In the example of FIG. 25, both the string units SU0 and SU1 are selected. Then, the row decoder 120 applies the first erase verify voltage Vevfy_up to the word lines WLe0 to WLe7 and WLo0 to WLo7. The row decoder 120 further applies the voltage VSG to the selection gate lines SGD0, SGD1, SGSe, and SGSo to turn on the selection transistors ST1 and ST2 of the string units SU0 and SU1.

As illustrated in FIG. 25, when the memory cell transistors MT0 to MT7 in the string units SU0 and SU1 are turned on with the first erase verify voltage Vevfy_up applied to the control gates of those memory cell transistors MT0 to MT7, the cell current Icell flows as indicated by the arrows in FIG. 25. For the cell current Icell to flow through the memory cell transistors MT0 to MT7 to which the voltage Vevfy_up is applied in the string units SU0 and SU1, either one of the memory cell transistors MTi coupled to the word lines WLei and WLoi in the string units SU0 and SU1 may be turned on. That is, one of the two memory cell transistors MTi facing each other across the memory pillar MP may be turned on. Furthermore, when both of the memory cell transistors MTi of the string units SU0 and SU1 are turned on, the amount of cell current Icell increases.

As shown in FIG. 24, when the amount of cell current Icell does not exceed a predetermined reference threshold value (NO at step S51), the sequencer 170 determines that the threshold voltage of any of the memory cell transistors MT0 to MT7 in the string units SU0 and SU1 is not sufficiently lowered below the first erase verify voltage Vevfy_up, and repeats the erase operation for the block (step S15). Thereafter, the erase verify operation is executed again (step S50). Whether the cell current Icell exceeds the reference threshold value may be determined at the sense amplifier 140.

On the other hand, if the amount of cell current exceeds the reference threshold (YES at step S51), it is determined that the threshold voltages of the memory cell transistors MT0 to MT7 included in the two string units SU0 and SU1 are lower than or equal to the voltage Vevfy_up.

The same operations are executed for the remaining string units SU2 and SU3.

5.2 Effects of Fifth Embodiment

In the erase verify operation of the semiconductor memory device according to the fifth embodiment, two string units SU that share a memory pillar MP are simultaneously selected, and the verify voltage Vevfy_up is applied to all the word lines WL0 to WL7. Thus, since the memory cell transistors MP formed in one memory pillar MP may be verified by executing the erase verify operation at least once, the speed of the erase operation can be further increased.

6. Sixth Embodiment

Next, a semiconductor memory device according to a sixth embodiment will be explained. The sixth embodiment provides lower tail detection and write-back (re-program) operations explained above in the first embodiment with reference to FIG. 10. Other operations (pre-programming, erase operations, and upper tail detection) are executed in the same manner as the first to fifth embodiments.

6.1 Lower Tail Detection and Write-back Method

Figure 26:
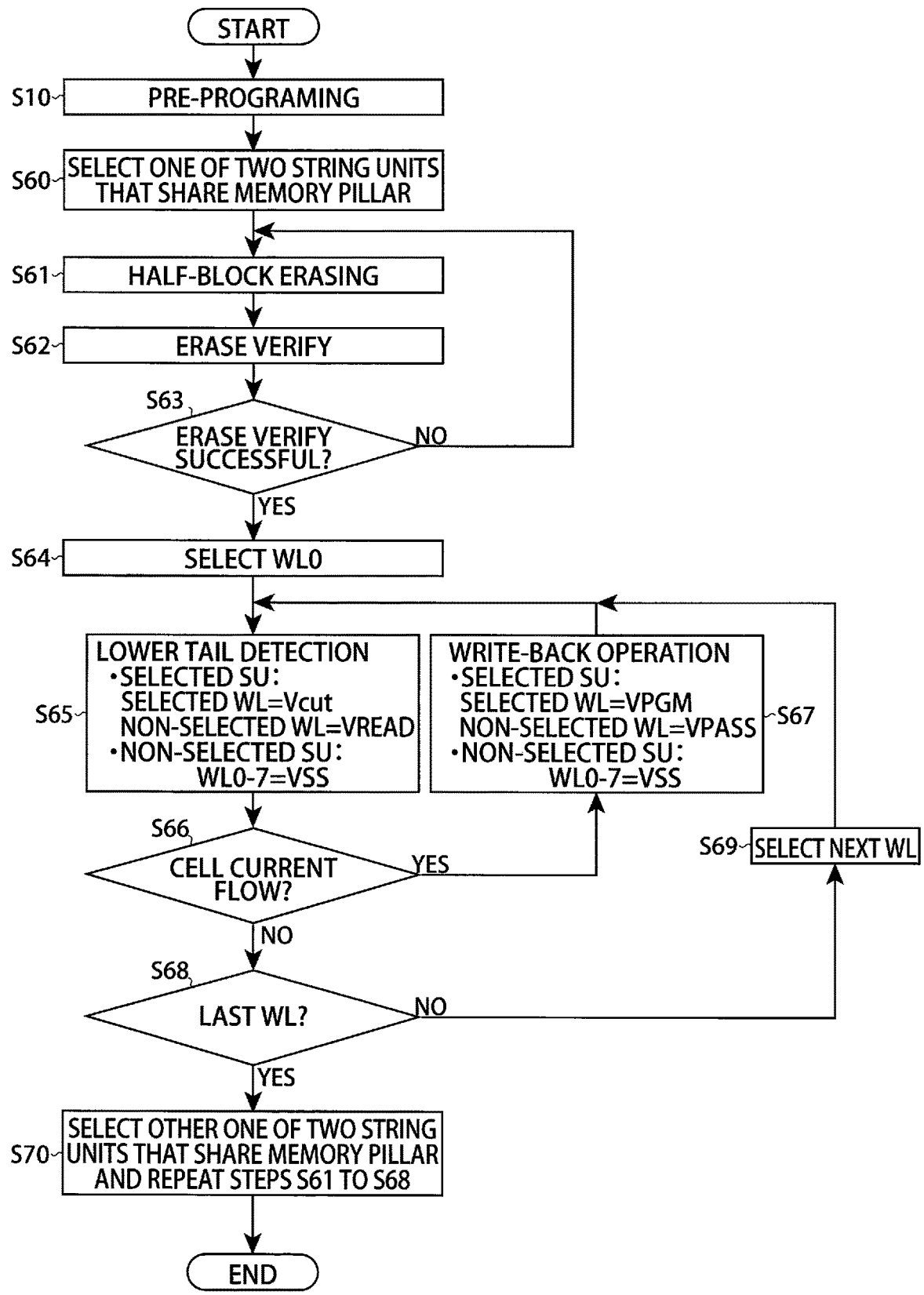
FIG. 26 shows a flowchart of an erase operation of a semiconductor memory device according to a sixth embodiment.

The lower tail detection and write-back operations executed in the semiconductor memory device according to the present embodiment will be explained with reference to FIG. 26. FIG. 26 shows a flowchart of the erase operation executed in the semiconductor memory device according to the present embodiment which corresponds to the erase operation of the first embodiment shown in FIG. 10.

As shown in FIG. 26, the sequencer 170 first executes the pre-program operation (step S10). The semiconductor memory device in this pre-program operation is illustrated in FIG. 27. FIG. 27 schematically shows the application of voltages in the pre-program operation with a cross section of a memory pillar MP.

As illustrated in FIG. 27, the row decoder 120 applies the voltage VPGM to all the word lines WLe0 to WLe7 and WLo0 to WLo7 of the erase target block BLK. In the pre-program operation, the threshold voltages do not need to be significantly raised as in a regular data program operation. The voltage VPGM for pre-programming therefore may be lower than the voltage VPGM used to write data into memory cell transistors MT in the regular data program operation, and various values may be suitably adopted, as long as VPGM>VSS is established. A well driver (not shown) applies a voltage VSS (e.g., 0V) to the semiconductor layer 31 of the memory pillar MP. Consequently, channels are formed in the memory cell transistors MT0 through MT7.

The row decoder 120 applies the voltage VSGD to the selection gate lines SGD0 to SGD3 to turn on the selection transistors ST1 of the string units SU of the erase target block BLK. On the other hand, the row decoder 120 applies the voltage VSS to the selection gate lines SGSe and SGSo to turn off the selection transistors ST2 of the string units SU of the erase target block BLK. The relationship of the voltages VPGM, VSDG and VSS is VPGM>VSGD>VSS.

Figure 28:
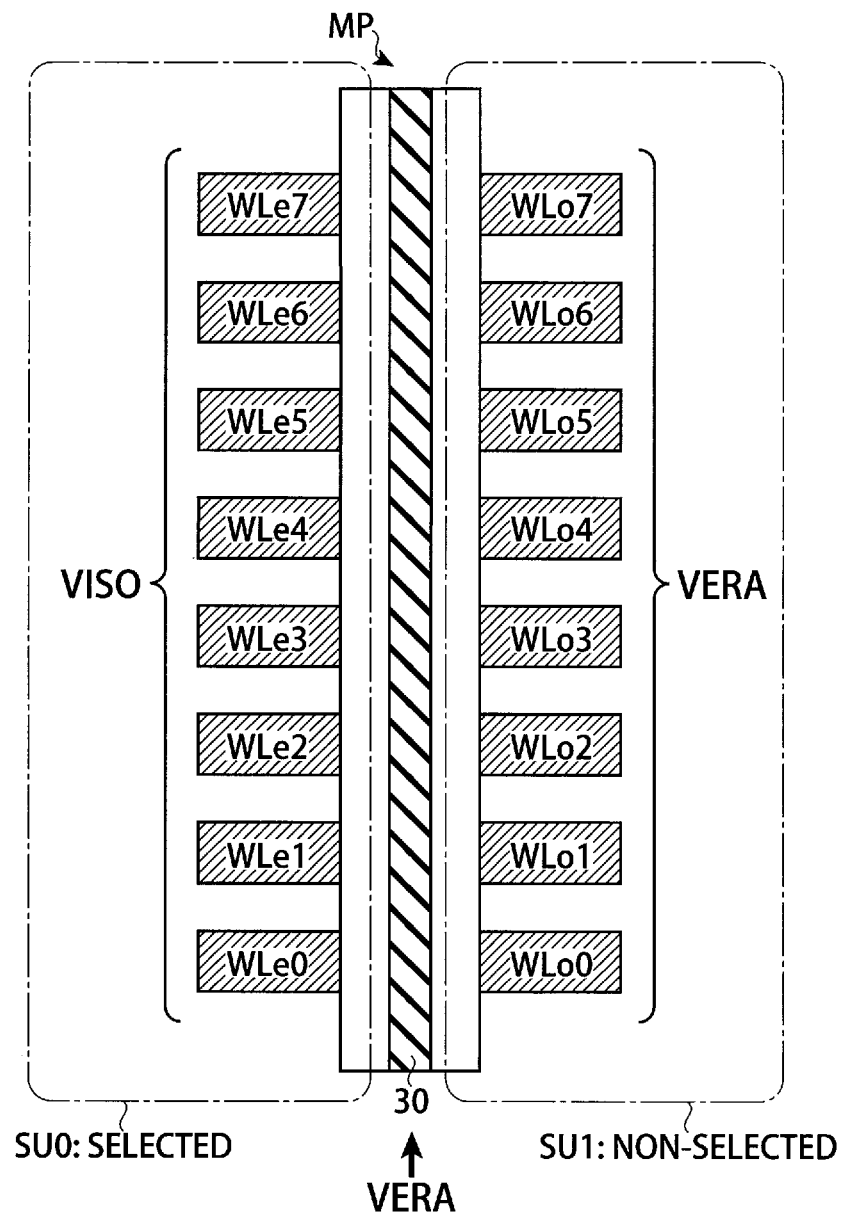

The sense amplifier 140 applies the voltage VSS to all the bit lines BL. The voltage VSS is applied from the bit lines BL to the channels of the memory cell transistors MT. As a result, electrons in the channels are injected to the charge accumulation layer 33 of the memory cell transistors MT, thereby increasing the threshold voltages of the memory cell transistors MT. The voltage provided by the sense amplifier 140 is not necessarily VSS, and may have a positive value depending on the targeted rise of the threshold voltage Next, as shown in FIG. 26, the sequencer 170 selects one of the two string units SU of the erase target block that share a memory pillar MP (step S60). The sequencer 170 erases data stored in memory cell transistors MT of every half block (step S61, referred to as a first erase operation). Here, the string unit SU selected at step S60 is an erase target for the half block. The application of voltages in this erase operation is illustrated in FIG. 28. FIG. 28 schematically shows the application of voltages in the first erase operation with a cross section of the memory pillar MP. In the example of FIG. 28, the even string unit SU0 (and SU2) is selected in the first erase operation.

In the example as illustrated in FIG. 28, in the first erase operation, the row decoder 120 applies the voltage VISO to the word lines WLe0 to WLe7 of the selected string unit SU0, and the voltage VERA to the word lines WLo0 to WLo7 of the non-selected string unit SU1. The well driver (not shown) applies the erase voltage VERA to the semiconductor layer 31 of the memory pillar MP. As a result, the threshold voltages of the memory cell transistors MT of the string unit SU0 are lowered.

Next, the erase verify operation is executed for the memory cell transistors MT of the string unit SU selected as an erase target at step S61 (i.e. of the even string unit SUe in this example) (step S62). This corresponds to the upper tail detection (time t2 in FIG. 10) and the erase operation (times t1 to t2 and t2 to t3 in FIG. 10) of the first to fifth embodiments. In the explanation of the sixth embodiment as well as the following seventh to tenth embodiments, the upper tail detection and erase operations are collectively referred to as an "erase verify operation". The method as explained in any of the first to fifth embodiments may be applied to the erase verify operation executed in the semiconductor memory device according to any of the sixth to tenth embodiments.

When the erase verify operation is successful (YES at step S63), the lower tail detection and write-back operation are executed. First, the row decoder 120, controlled by the sequencer 170, selects the word line WL0 located in the lowermost word line layer (step S64). Thereafter, the lower tail detection is initiated (step S65). For the lower tail detection in the selected string units SU (e.g. the even string unit SU0 in this example), the row decoder 120 applies the voltage Vcut to the selected word line WL, while applying the voltage VREAD to the non-selected word lines WL, and the voltage VSG to the selection gate lines SGD and SGS. The row decoder 120 further applies the voltage VSS to the word lines WL0 to WL7 and to the selection gate line SGD of the non-selected string unit SU (e.g. the string unit SU1 in this example). Then, the sense amplifier 140 pre-charges the bit lines BL. As a result, if the cell current flows from any bit line BL to the source line SL (YES at step S66), it is determined that the threshold voltage of the memory cell transistor of the memory pillar MP coupled to the bit line BL, which is also coupled to the selected word line WL in the selected string unit SU, is lower than or equal to the voltage Vcut.

Thus, the sequencer 170 executes the write-back operation (which may be referred to as a re-write operation) on that memory cell transistor MT having the threshold values lower than or equal to the voltage Vcut (step S67). The write-back operation is executed to increase the threshold voltage of the memory cell transistor MT that is lower than or equal to the voltage Vcut to a voltage higher than voltage Vcut by programming it. In this program operation, the row decoder 120 applies the voltage VPGM to the selected word line WL of the selected string unit SU, the voltage VPASS to the non-selected word lines WL, the voltage VSGD to the selection gate line SGD, and the voltage VSS to the selection gate line SGS. The sense amplifier 140 applies, for example, 0V to the bit lines BL through which the cell current Icell has flowed at step S66, and the voltage VSG to the bit lines BL through which the cell current did not flow. The voltage VPASS is applied to turn on any memory cell transistor MT. The voltage VSGD is applied to the control gate of the selection transistor ST1 to allow it to transfer 0V but not the voltage VSG. The relationship of the voltages VPGM, VPASS, VSGD and VSG is VPGM>VPASS>VSGD=(≈) VSG.

As a result of the above, the selection transistor ST1 is turned on in a NAND string 50 through which the cell current Icell has flowed at step S66, and 0V is applied to the channel of the memory cell transistor MT coupled to the selected word line WL. With charge being injected into the charge accumulation layer of the memory cell transistors MT, the threshold voltage of the memory cell transistor MT increases. In contrast, in a NAND string 50 through which the cell current did not flow at step S66, the selection transistor ST1 is turned off so that the channel of the memory cell transistor MT coupled to the selected word line WL will fall into an electrically floating state. The potential of the channel of the memory cell transistor MT coupled to the selected word line WL becomes approximately equal to the potential of the control gate, and thus the threshold voltage thereof remains substantially the same. In the non-selected string unit SU, the voltage VSS is applied to the word lines WL0 to WL7 and the selection gate line SGD so that the program operation will not be executed.

Figure 29:
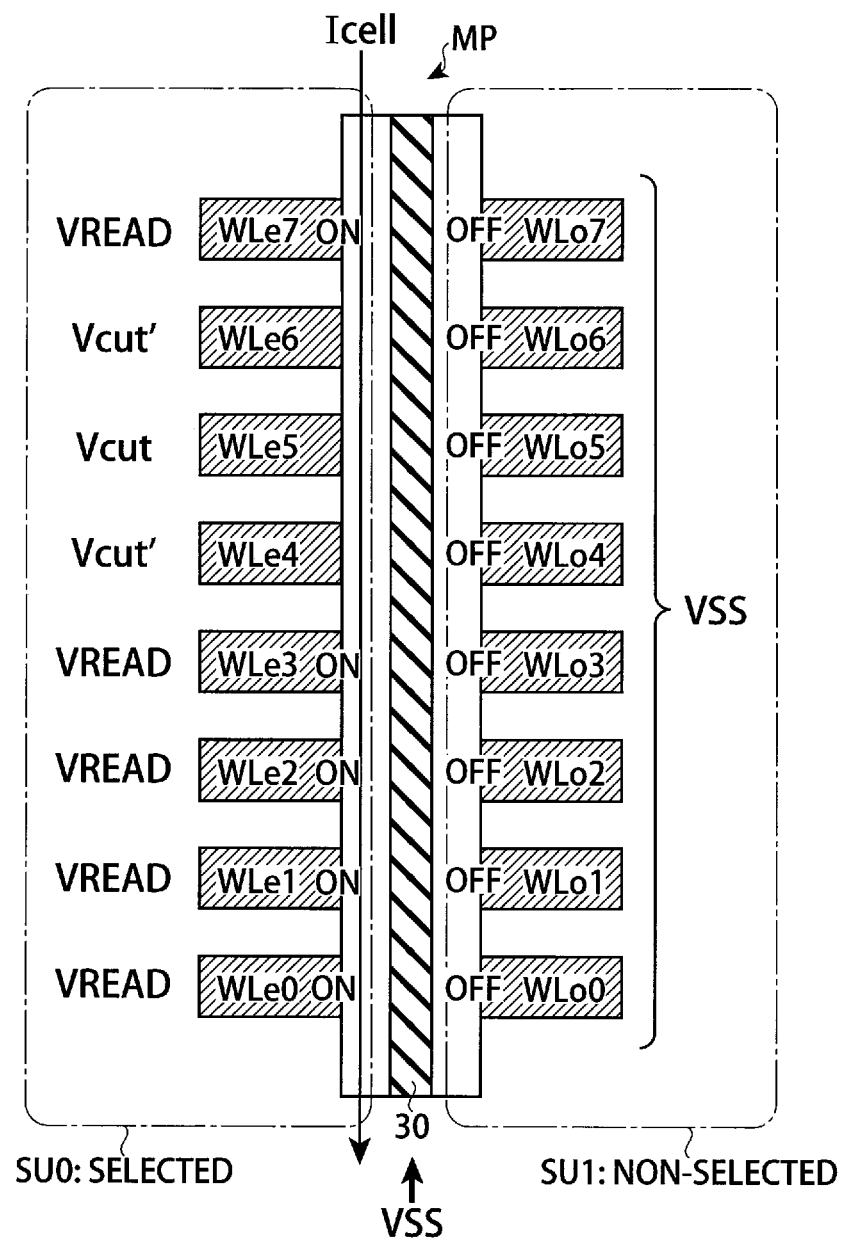

The lower tail detection at step S65 and the write-back operation at step S67 are illustrated in FIGS. 29 and 30, respectively. FIGS. 29 and 30 schematically show the application of voltages respectively in the lower tail detection and in the write-back operation with cross sections of an example memory pillar MP in which the NAND strings of the string units SU0 and SU1 are formed.

First, by way of example, the lower tail detection will be explained with reference to FIG. 29. In the example of FIG. 29, the word line WLe5 of the string unit SU0 is selected for the lower tail detection. As illustrated in FIG. 29, the voltage Vcut is applied to the selected word line WLe5, and the voltage VREAD is applied to the word lines WLe0 to WLe3 and WLe7. In the example of FIG. 29, the voltage Vcut' is applied to the non-selected word lines WLe4 and WLe6 which are adjacent to the selected word line WLe5. Alternatively, the voltage VREAD may be applied to the adjacent non-selected word lines. The voltage Vcut' may have a voltage value between the voltages Vcut and VREAD which is high enough to turn on a memory cell transistor MT in the erase state "Er". The voltage VSG is applied to the selection gate lines SGD0 and SGSe (not shown). In the non-selected string unit SU1, the voltage VSS is applied to all of the word lines WLo0 to WLo7 as well as the selection gate lines SGD1 and SGSo.

As a result of the above, in the non-selected string unit SU1, the memory cell transistors MT0 to MT7 and the selection transistors ST1 and ST2 are set in the off state. On the other-hand, in the selected string unit SU0, the non-selected memory cell transistors MT0 to MT4, MT6 and MT7 are set in the on state. If the threshold voltage of the selected memory cell transistor MT5 is lower than or equal to Vcut, the selected memory cell transistor MT5 is turned on, and causes the cell current Icell to flow from the bit line BL to the source line SL. In contrast, if the threshold voltage of the memory cell transistor MT5 is higher than Vcut, the memory cell transistor MT5 remains in the off state, and thus does not allow the cell current Icell to flow.

Next, by way of example, the write-back operation will be explained with reference to FIG. 30. FIG. 30 illustrates the write-back operation for the memory cell transistor MT5 when it is determined in the lower tail detection shown in FIG. 29 that the cell current Icell flows. As illustrated in FIG. 30, in the selected string unit SU0, the voltage VPGM is applied to the selected word line WLe5, while the voltage VPASS is applied to the non-selected word lines WLe0 to WLe4, WLe6, and WLe7. Also, in the selected string unit SU0, the voltage VSGD is applied to the selection gate line SGD0 (not shown), and the voltage VSS is applied to the selection gate line SGSe. Furthermore, 0V may be applied to the write-back target bit line BL coupled to the memory pillar MP, and the selection transistor ST1 is turned on with the voltage VSGD being applied to the control gate thereof. As a result, in the memory cell transistor MT5, a potential difference corresponding to the voltage VPGM is produced between the channel and the control gate, and a charge is thereby injected to the charge accumulation layer to raise the threshold voltage of the memory cell transistor MT5. On the other hand, in the non-selected string unit SU1, since the voltage VSS is applied to the word lines WLo0 to WLo7 and to the selection gate lines SGD1 and SGSo, the program operation is not executed.

After the write-back operation is executed in the above-described manner, the sequencer 170 repeats the lower tail detection for the memory cell transistor MT5 coupled to the selected word line WLe5 of the selected string unit SU0 (step S65), and re-executes the write-back operation, if it is determined that the threshold voltage of the memory cell transistor MT5 is still lower than the voltage Vcut (step S67). The sequencer 170 repeats the lower tail detection and write-back operations of steps S65 to S67 for from the word line WL0 to the last word line (word line WL7 in this example) in the selected string unit (the string unit SU0 in this example) (steps S68 and S69). Thereafter, the other of the two string units that share the memory pillar MP (the string unit SU1 in this example) is selected to repeat steps S61 to S68 (step S70). The same operations as shown in FIG. 26 are executed for the remaining string units SU2 and SU3.

6.2 Effects of Sixth Embodiment

In the erase operation performed in the semiconductor memory device according to the embodiment, the lower tail detection is executed as illustrated in FIG. 29 after the upper tail detection is successful. In the operation of the lower tail detection, any memory cell transistor MT having a threshold voltage lower than or equal to the voltage Vcut (corresponding to the voltage Vevfy_low in the example shown in FIG. 10) is identified. Such a memory cell transistor MT is referred to as an "over-erased memory cell transistor". When any over-erased memory cell transistor is found in the lower tail detection, the write-back operation is executed for the same over-erased memory cell transistor as illustrated in FIG. 30. Thus, the threshold voltage of the over-erased memory cell transistor can be increased to a voltage higher than the voltage Vcut.

The presence of over-erased memory cell transistors in a block in the erase state can be avoided by raising the threshold voltage of any identified over-erased memory cell transistor to a voltage higher than the voltage Vcut, and thus, reliability can be enhanced in the subsequent data write operation for the block. The write operation includes a program operation for increasing the threshold voltage of a target memory cell transistor MT to a targeted voltage value depending on data to be written by injecting charge into the charge accumulation layer of the target memory cell transistor MT, and also includes a program verify operation for confirming whether the threshold voltage of the target memory cell transistor MT reaches the targeted voltage value as a result of the program operation. In the program verify operation, the voltage Vcut is applied to the control gate of a non-selected memory cell transistor MT that faces the target memory cell transistor MT across a memory pillar MP shared by those memory cell transistor MT to set the non-selected memory cell transistor MT in the off state. However, in a case where the facing non-selected memory cell transistor MT is an over-erased memory cell transistor, even if the threshold voltage of the target memory cell transistor MT is properly increased to the targeted voltage value and is thereby turned off to shut the cell current Icell for verification, the cell current Icell still flows through the facing non-selected memory cell transistor MT. This is because the threshold voltage of the over-erased non-selected memory cell transistor is lower than the voltage Vcut, and it is in the ON state with the voltage Vcut being applied. As a result, the program verify operation is not successful, which requires the program operation to be repeated. To avoid this, the voltage Vcut may need to be set to a large negative voltage value, which may produce an excessive load on the voltage generation circuit.

In contrast, in the semiconductor memory device according to the sixth embodiment, the threshold voltage of any identified over-erased memory cell transistor MT is increased to a voltage higher than the voltage Vcut in the lower tail detection and the write-back operation. This prevents the facing non-selected cell from being turned on at the time of the program verify operation after writing data into the target memory cell transistor MT. Thus, whether or not the cell current Icell flows depends only on the ON/OFF state of the target memory cell transistor MT, and the program verify operation for the target memory cell transistor MT can be reliably executed. Accordingly, the voltage Vcut does not need to be set to a large negative voltage value, reducing the load of the voltage generation circuit.

In addition, according to the sixth embodiment, the write-back operation is executed for the over-erased memory cell transistors identified in the lower tail detection operation, as explained with reference to FIG. 30. In other words, the write-back operation is not executed for any memory cell transistor MT that is not in the over-erased state. Since the programming is not executed for a memory cell transistor MT for which the write-back operation is not required, the upper tail of the threshold voltage distribution of the memory cell transistors MT that has been adjusted by the operations of steps S61 to S63 of FIG. 26 is not adversely affected. As a result, the distribution of the threshold voltage of the memory cell transistor MT after the erase operation is done will be securely set in a range between the voltages Vevfy_low (=Vcut) and Vevfy_up as indicated in time t4 of FIG. 10.

7. Seventh Embodiment

Next, a semiconductor memory device according to a seventh embodiment will be explained. In the semiconductor memory device according to the seventh embodiment, the memory pillar MP has a two-tier structure including a lower memory pillar layer and an upper memory pillar layer. The following explanation focuses only on differences of the seventh embodiment with respect to the sixth embodiment.

7.1 Lower Tail Detection and Write-back Method

Operations of lower tail detection and write-back executed in the semiconductor memory device according to the seventh embodiment will be explained. The basic procedure of the operations is the same as the operations of the sixth embodiment as explained with reference to FIG. 26. The seventh embodiment differs from the sixth embodiment in that the operation shown in FIG. 26 is executed in parallel for the upper and lower memory pillar (MP) layers.

The structure of the memory pillar MP in the semiconductor memory device according to the seventh embodiment will be explained with reference to FIG. 31. FIG. 31 schematically shows the application of voltages in the pre-program operation with a cross section of vertically stacked memory pillars MP.

As illustrated in FIG. 31, the memory pillar MP includes a first layer memory pillar MP1 corresponding to the lower memory pillar layer, and a second layer memory pillar corresponding to the upper memory pillar layer. The diameter of the first layer memory pillar MP1 decreases towards its bottom end, establishing the relationship W2>W1 where W1 is the diameter at the bottom end and W2 is the diameter at its top end. Like the first layer memory pillar MP1, the second layer memory pillar MP2 is featured by the relationship W4>W3, where W3 is the diameter at the bottom end, and W4 is the diameter at the top end. Furthermore, the diameter W2 at the top end of the first layer memory pillar MP1 and the diameter W3 at the bottom end of the second layer memory pillar MP2 have the relationship W2>W3, and the bottom surface of the second layer memory pillar MP2 is arranged to overlap the top surface of the first layer memory pillar MP1. The memory pillar MP has a narrow portion at the portion where the first layer memory pillar MP1 is in contact with the second layer memory pillar MP2. The word lines WL0 to WL3 are provided for the first layer memory pillar MP1, while the word lines WL4 to WL7 are provided for the second layer memory pillar MP2.

As illustrated in FIG. 31, in the semiconductor memory device according to seventh embodiment, the pre-program operation is executed in the same manner as the sixth embodiment as illustrated in FIG. 27. By applying the voltage VPGM to the word lines WL0 to WL7, the program operation is executed for all memory cell transistors MT in an erase target block BLK.

Next, the operations of steps S60 to S69 as explained in the sixth embodiment are executed. Here, the operations of steps S60 to S69 are executed for both the string unit corresponding to the first layer memory pillar MP1 and the string unit corresponding to the second layer memory pillar MP2. Thus, as the word line initially selected at step S64 of the flowchart shown in FIG. 26, the word line WL0 is selected for the first layer memory pillar MP1, and the word line WL4 is selected for the second layer memory pillar MP2. At step S68, the last word line WL is the word line WL7 for the second layer memory pillar MP2, and the last word line WL for the first layer memory pillar MP1 is the word line WL3. At step S60, different string units of the two string units that share the memory pillar MP are selected for the first layer memory pillar MP1 and the second layer memory pillar MP2. For instance, if the string unit SU0 is selected for the first layer memory pillar MP1, the string unit SU1 is selected for the second layer memory pillar MP2, and vice versa.

Figure 32:
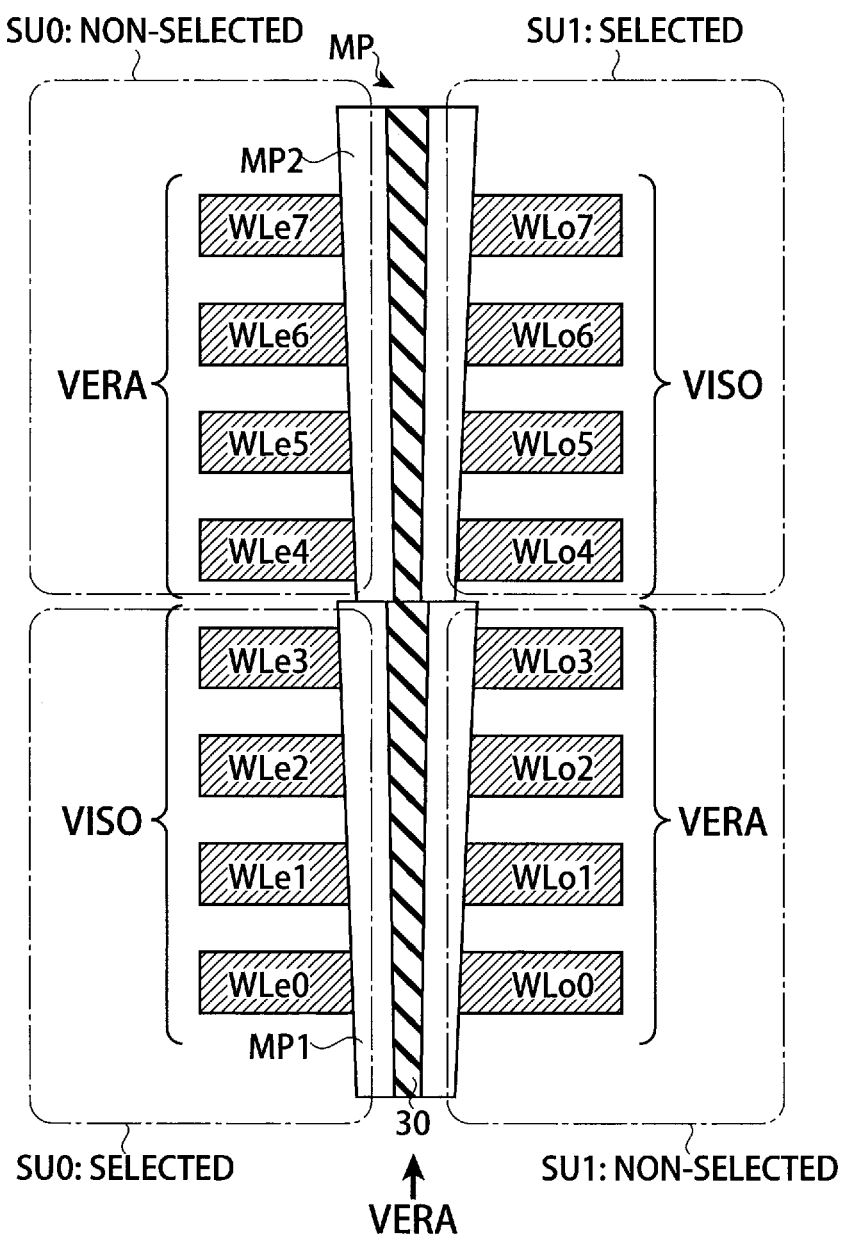

FIG. 32 shows the first half erase operation executed at step S61. As illustrated in FIG. 32, the string unit SU0 is selected for the first layer memory pillar MP1. The row decoder 120 therefore applies the voltage VISO to the word lines WLe0 to WLe3 of the string unit SU0, and the voltage VERA to the word lines WLo0 to WLo3 of the string unit SU1. On the other hand, for the second layer MP2, the string unit SU1 is selected. Thus, the row decoder 120 applies the voltage VISO to the word lines WLo4 to WLo7 of the string unit SU1, and the voltage VERA to the word lines WLe4 to WLe7 of the string unit SU0. Furthermore, the well driver (not shown) applies the voltage VERA to the semiconductor layer 31 of the memory pillar MP. As a result, the threshold voltages of the memory cell transistors MT0 to MT3 coupled to the word lines WLe0 to WLe3 in the string unit SU0 and the threshold voltages of the memory cell transistors MT4 to MT7 coupled to the word lines WLo4 to WLo7 in the string unit SU1 are lowered.

Thereafter, the erase verify operation is executed for the memory cell transistors MT for which the erase operation is performed at step S61 (step S62). When the erase verify operation is successful (YES at step S63), the lower tail detection and write-back operation are executed for those memory cell transistors MT (steps S64 to S67).

Figure 33:
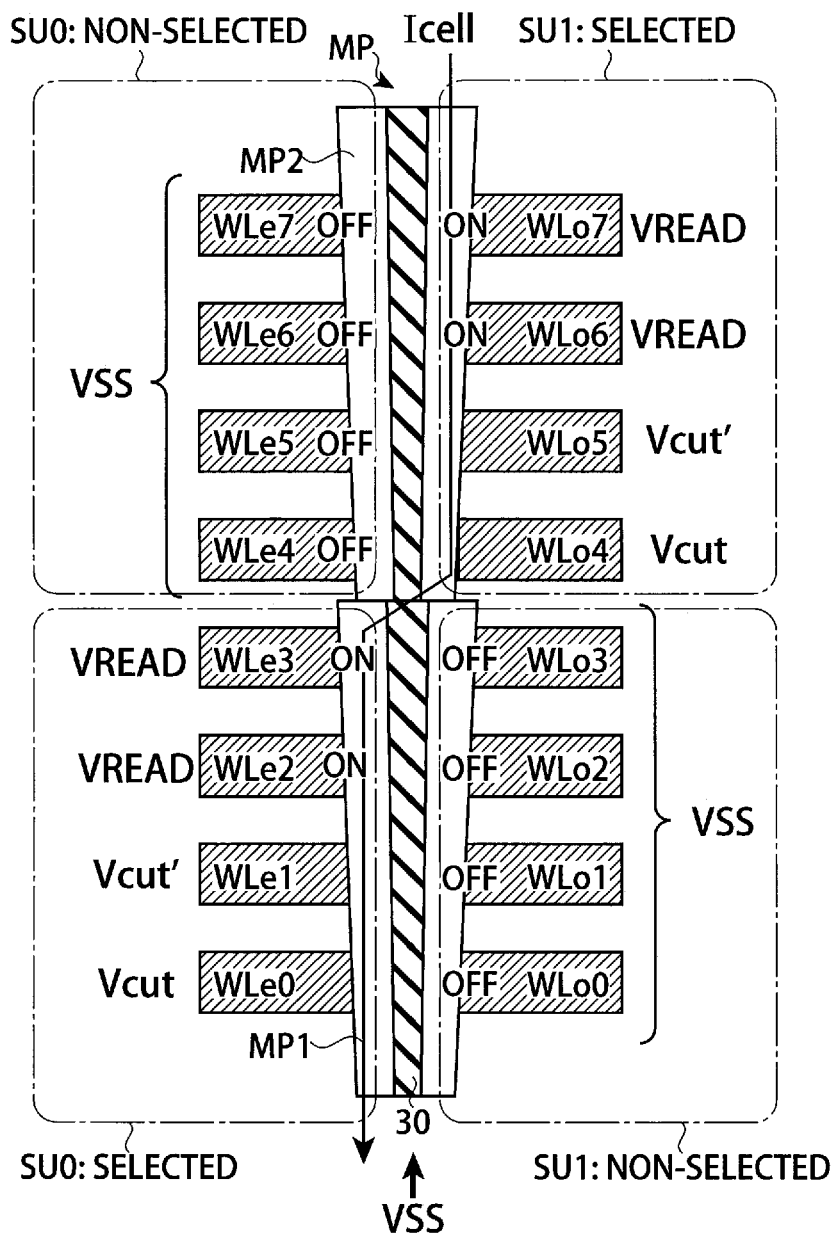

The first and second layer memory pillars MP1 and MP2 in the lower tail detection is illustrated in FIG. 33. As illustrated in FIG. 33, the row decoder 120 selects the lowermost word line WLe0 of the string unit SU0 for the first layer memory pillar MP1 and the lowermost word line WLo4 of the string unit SU1 for the second layer memory pillar MP2, respectively (step S64). Then, the lower tail detection for the threshold voltages of the memory cell transistors MT0 and MT4 coupled to the selected word lines WLe0 and WLo4 is initiated (step S65). In the semiconductor memory device according to the seventh embodiment, the lower tail detection of step S65 explained with reference to FIG. 26 in the sixth embodiment is executed for both of the first layer memory pillar MP1 and the second layer memory pillar MP2. In the example illustrated in FIG. 33, for the first layer memory pillar MP1, the voltage Vcut is applied to the selected word line WLe0, the voltage VREAD is applied to the word lines WLe2 and WLe3, and the voltage Vcut' is applied to the word line WLe1, in the string unit SU0. In addition, the voltage VSS is applied to the word lines WLo0 to WLo3 in the string unit SU1 for the first layer memory pillar MP1. For the second layer memory pillar MP2, the voltage Vcut is applied to the selected word line WLo4, the voltage VREAD is applied to the word lines WLo6 and WLo7, and the voltage Vcut' is applied to the word line WLo5, in the string unit SU1. In addition, the voltage VSS is applied to the word lines WLe4 to WLe7 in the string unit SU0 for the second layer memory pillar MP2. Furthermore, the voltage VSG is applied to the selection gate lines SGD0, SGD1, SGSe, and SGSo (not shown).

As a result of the above, if the threshold voltage of the memory cell transistor MT0 in the string unit SU0 and the threshold voltage of the memory cell transistor MT4 in the string unit SU1 are lower than or equal to Vcut, these memory cell transistors MT0 and MT4 are turned on, causing the cell current Icell to flow from the bit line BL to the source line SL. In contrast, if one of the threshold voltages of those memory cell transistors MT0 and MT4 exceeds the Vcut, the cell current does not flow.

Figure 34:
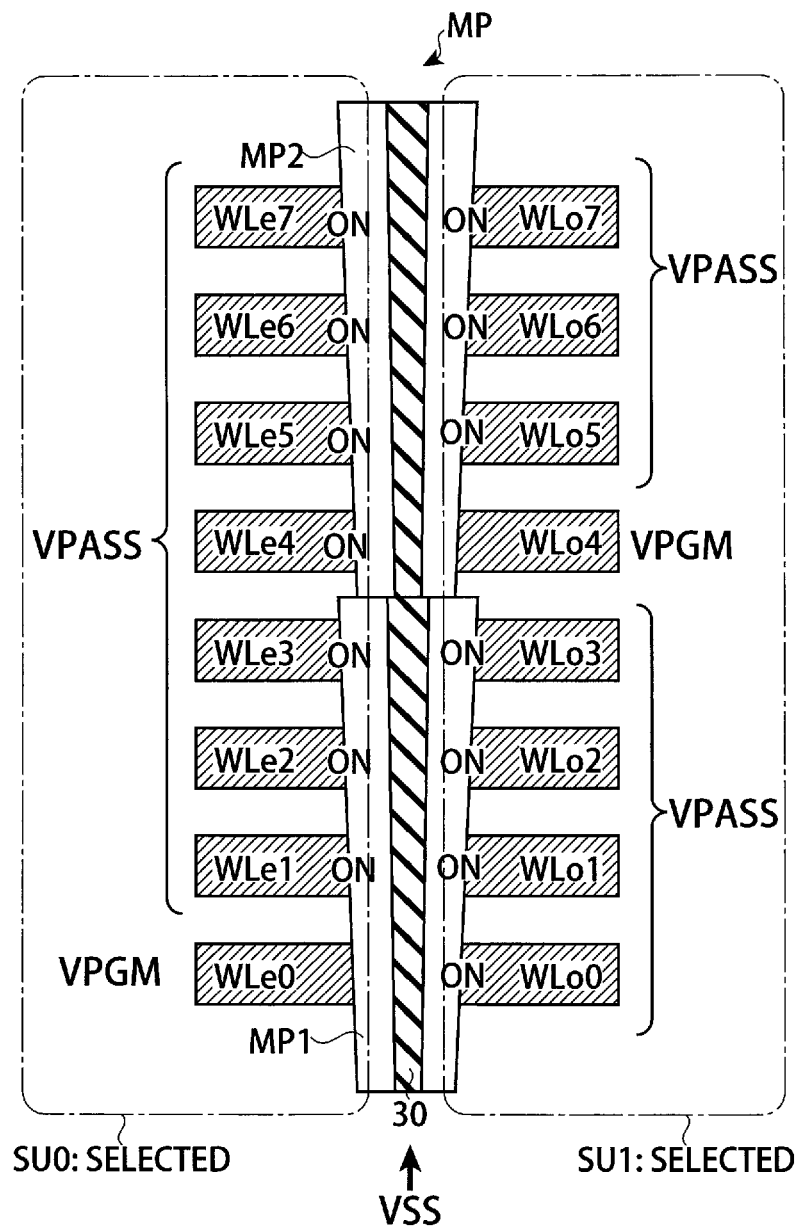

Next, the write-back operation will be explained with reference to FIG. 34. FIG. 34 shows the write-back operation executed when it is determined in the lower tail detection of FIG. 33 that the cell current Icell flows (YES at step S66). As illustrated in FIG. 34, in the string unit SU0, the voltage VPGM is applied to the selected word line WLe0, and the voltage VPASS is applied to the non-selected word lines WLe1 to WLe7. In the string unit SU1, the voltage VPGM is applied to the selected word line WLo4, and the voltage VPASS is applied to the non-selected word lines WLo0 to WLo3 and WLo5 to WLo7. In addition, in the string units SU0 and SU1, the voltage VSGD is applied to the selection gate lines SGD0 and SGD1 (not shown) to turn on the selection transistors ST1 of the string units SU0 and SU1, and the voltage VSS is applied to the selection gate lines SGSe and SGSo (not shown) Furthermore, 0V, for example, may be applied to the write-back target bit line BL coupled to the memory pillar MP, with the selection transistors ST1 of the string units SU0 and SU1 in the on state. As a result, charge is injected into the charge accumulation layer in the memory cell transistor MT0 of the string unit SU0 and the memory cell transistor MT4 of the string unit SU1, and their threshold voltages are increased.

After the write-back operation is executed in the above-described manner, the sequencer 170 repeats the lower tail detection (step S65), and repeats the write-back operation, if it is still determined that the threshold voltage of the memory cell transistor MT0 in the string unit SU0 and the threshold voltage of the memory cell transistor MT4 in the string unit SU1 are lower than or equal to Vcut (step S67). The sequencer 170 repeats the operations of steps S65 to S67 for all the word lines up to the last word line (the word line WL3 for the string unit SU0 and the word line WL7 for the string unit SU1 in this example) (steps S68 and S69). Thereafter, for the remaining half block, the sequencer 170 selects the string unit SU1 for the first layer MP1 and the string unit SU0 for the second layer MP2, and repeats the operations of steps S61 to S68 (step S70).

7.2 Effects of Seventh Embodiment

According to the present embodiment, the lower tail detection is executed for two string units SU at a time. The erase operation speed can be thereby improved.

That is, in the semiconductor memory device according to the seventh embodiment, the memory pillar MP has a two-layered structure. In other words, the memory pillar MP includes a narrow portion between the first layer memory pillar MP1 in the lower memory pillar layer and the second layer memory pillar MP2 in the upper memory pillar layer. The memory pillars MP have this shape because they are fabricated in two steps. Since the first layer memory pillars MP1 and the second layer memory pillars MP2 have the same shape with the same diameter in the X-Y plane as shown in FIG. 6, the coupling effect produced in the memory cell transistors MT of the first layer memory pillar MP1 is expected to be substantially the same as the coupling effect produced in the memory cell transistors MT of the second layer memory pillar MP2. In other words, in the memory cell transistors MT of the first and second layer memory pillars MP1 and MP2, if a memory cell transistor MT of one of the first and second layer memory pillars MP1 and MP2 tends to fall into the over-erased state, a memory cell transistor MT of the other memory pillar would also tend to fall into the over-erased state, with approximately the same degree of the over-erasing. On the other hand, if one is less likely to be in the over-erased state, the other would also be less likely to be in the over-erased state.

In the semiconductor memory device according to the seventh embodiment, relying on the above-described characteristic, for two memory cell transistors MT that are provided in the regions of substantially the same diameter in the first layer memory pillar MP1 and the second layer memory pillar MP2 can be selected at a time for the lower tail detection and write-back operations. The lower tail detection and write-back operations for the two memory cell transistors MT can be executed in parallel. This reduces the time required for the lower tail detection and write-back operations and increases the speed of the data erase operation.

In the semiconductor memory device according to the seventh embodiment, the write-back operation is executed for a bit lines BL coupled to a memory pillar MP through which the cell current Icell flows in the lower tail detection operation as illustrated in FIG. 33. On the other hand, the writing-back operation is not executed for bit lines BL coupled to memory pillars MP through which the cell current Icell does not flow in the lower tail detection operation. Thus, similarly to the sixth embodiment, the upper tail of the threshold voltage distribution of the memory cell transistors MT that has been adjusted at steps S61 to S63 of FIG. 26 is not adversely affected.

8. Eighth Embodiment

Next, a semiconductor memory device according to an eighth embodiment will be explained. The eighth embodiment provides another method for the lower tail detection and write-back operations, which differ from those explained in the sixth and seventh embodiments. In the semiconductor memory device according to the eighth embodiment, for the lower tail detection and write-back operations, two string units SU are selected, and the same word lines in the two string units are selected. The following explanation focuses only on the differences of the eighth embodiment with respect to the sixth embodiment.

8.1 Lower Tail Detection and Write-back Method

The lower tail detection and write-back operations in the semiconductor memory device according to the eighth embodiment will be explained with reference to FIG. 35. FIG. 35 shows a flowchart of the erase operation performed in the semiconductor memory device according to the eighth embodiment, which corresponds to the flowchart shown in FIG. 26 of the sixth embodiment.

As illustrated in FIG. 35, first, the aforementioned steps S10, S11, S62, and S63 are executed. As explained in the sixth embodiment, any one of the methods according to the first to fifth embodiments may be adopted for the erase verify operation.

When the erase verify operation is successful (YES at step S63), the lower tail detection and write-back operations are executed. In this example, two string units SU (e.g. the string units SU0 and SU1) including the NAND strings 50e and NAND strings 50o that share a memory pillar MP are selected for the lower tail detection and write-back operations (step S80). The row decoder 120 first selects the lowermost word lines WL0 of the selected string units SU0 and SU1 (step S64), and initiates the lower tail detection operation (step S81).

In the lower tail detection, the row decoder 120 applies the voltage Vcut to the selected word lines WL (e.g. the word line WL0) of the selected two string units SU (e.g. the string units SU0 and SU1), whereas the row decoder 120 applies the voltage VREAD to the non-selected word lines WL and the voltage VSG to the selection gate lines SGD and SGS in the selected two string units SU. Then, the sense amplifier 140 pre-charges the bit line BL coupled to the memory pillar. As a result of this pre-charging, if the cell current Icell flows from the bit line BL to the source line SL (YES at step S82), it is determined that the threshold voltage of at least one of the two memory cell transistors of the selected two string units which are coupled to the selected word lines WL is lower than or equal to the voltage Vcut.

Then, the sequencer 170 executes the write-back operation for the memory cell transistors MT having a threshold voltage lower than or equal to the voltage Vcut (step S83). More specifically, for the selected two string units SU, the row decoder 120 applies the voltage VPGM to the selected word lines WL, the voltage VPASS to the non-selected word lines WL, the voltage VSG to the selection gate lines SGD, and the voltage VSS to the selection gate lines SGS. The sense amplifier 140 applies 0V, for example, to the bit line BL coupled to the memory pillar through which the cell current Icell flows at the lower tail detection of step S81, and the voltage VSG to the bit line BL coupled to the memory pillar MP through which the cell current Icell does not flow.

Consequently, in the NAND strings formed in the memory pillar MP through which the cell current Icell flows in the lower tail detection of step S81, charge is injected into the charge accumulation layer of the two target memory cell transistors MT, and the threshold voltages of the two target memory cell transistors MT are thereby raised.

Figure 36:
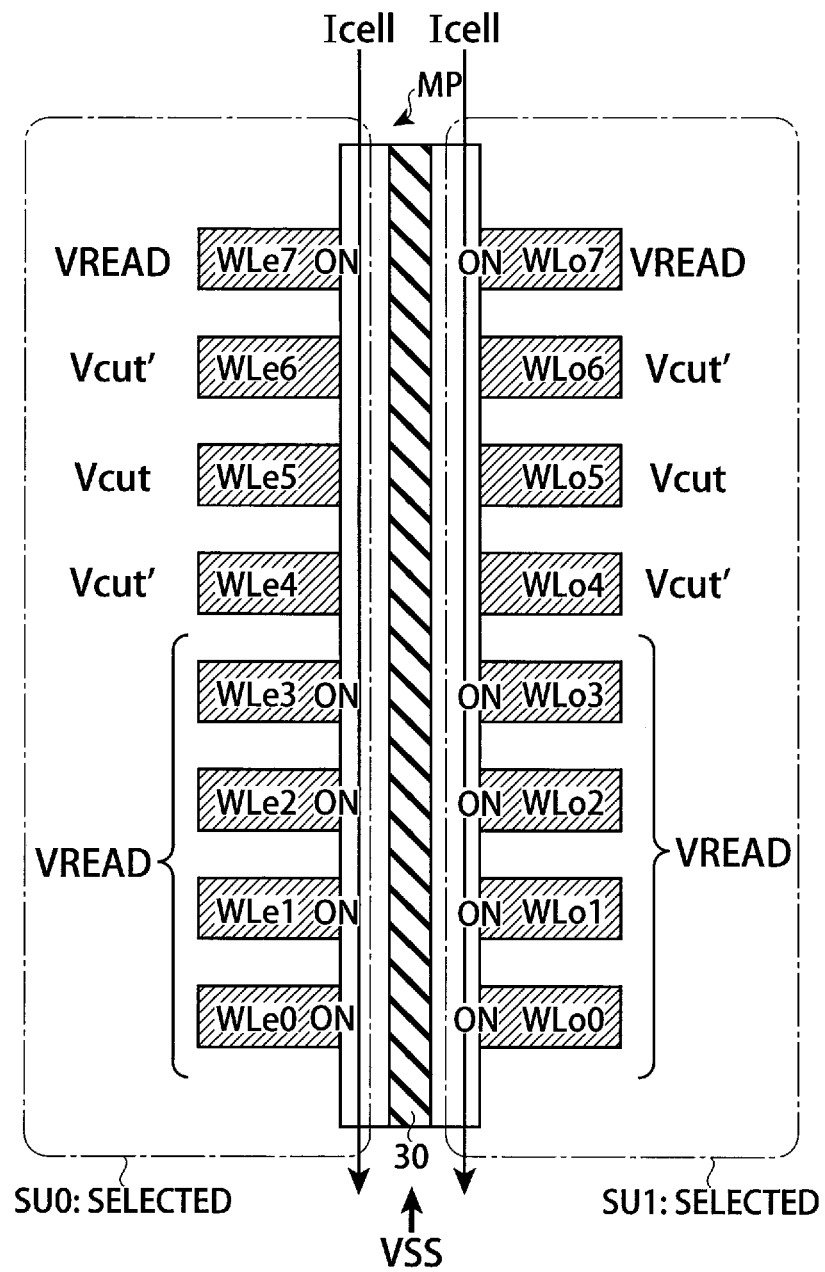
FIGS. 36 and 37 show vertical sections of a pillar of the semiconductor memory device according to the eighth embodiment.
Figure 37:
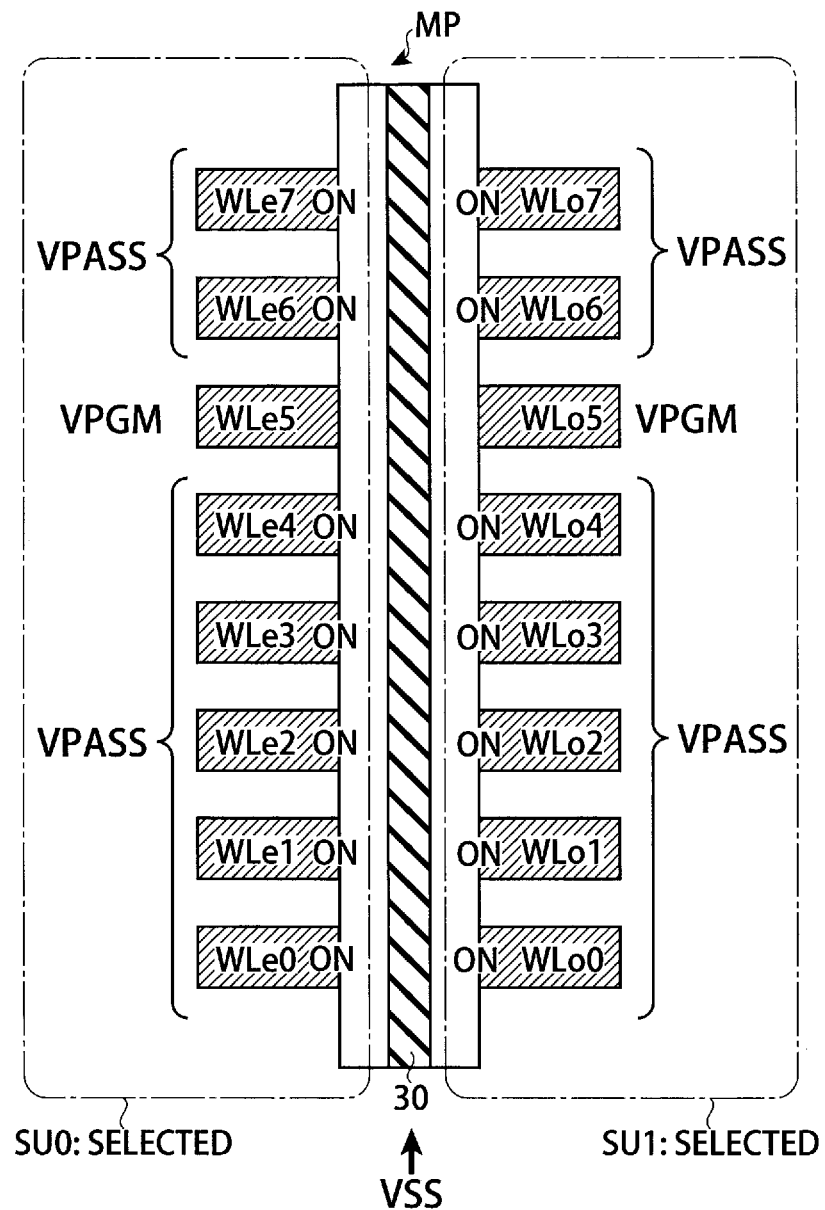

Examples of the lower tail detection at step S81 and the write-back operation at step S83 are illustrated in FIGS. 36 and 37. FIGS. 36 and 37 schematically show the application of voltages in the lower tail detection and write-back operations with cross sections of a memory pillar MP, respectively.

First, the example of the lower tail detection will be explained with reference to FIG. 36. In the example of FIG. 36, the word lines WLe5 and WLo5 of the string units SU0 and SU1 are selected. As illustrated in FIG. 36, for the selected string units SU0 and SU1, the voltage Vcut is applied to the selected word lines WLe5 and WLo5, and the voltage VREAD is applied to the non-selected word lines WLe0 to WLe3 and WLe7 and to the non-selected word lines WLo0 to WLo3 and WLo7. Furthermore, the voltage Vcut' is applied to the non-selected word lines WLe4, WLe6, WLo4, and WLo6. Also, for the selected string units SU0 and SU1, the voltage VSG is applied to the selection gate lines SGD0, SGD1, SGSe, and SGSo (not shown). As a result of the above, if any of the memory cell transistors MT5 coupled to the selected word lines WLe5 and WLo5 in the string units SU0 and SU1 is in the ON state with the threshold voltage thereof being lower than or equal to the Vcut, the cell current Icell flows from the bit line BL to the source line SL.

Next, the example of the write-back operation will be explained with reference to FIG. 37. FIG. 37 shows the write-back operation executed when it is determined in the lower tail detection of FIG. 36 that the cell current Icell flows. In the example illustrated in FIG. 37, for the selected string units SU0 and SU, the voltage VPGM is applied to the selected word lines WLe5 and WLo5, and the voltage VPASS is applied to the non-selected word lines WLe0 to WLe4, WLe6, WLe7, WLo0 to WLo4, WLo6, and WLo7. Furthermore, for the selected string units SU0 and SU1, the voltage VSGD is applied to the selection gate lines SGD0 and SGD1 to turn on the selection transistors ST1 (not shown), and the voltage VSS is applied to the selection gate lines SGSe and SGSo. 0V, for example, is applied to the write-back target bit line BL coupled to the memory pillar MP through which the cell current Icell flows in the lower tail detection with the selection transistors ST1 in the on state. As a result, a potential difference corresponding to the voltage VPGM is produced between the channel and the control gate of the memory cell transistors MT5 which are coupled to the selected word lines WLe5 and WLo5 in the string units SU0 and SU1, and charge is thereby injected into the charge accumulation layer of the memory cell transistors MT5.

After the write-back operation is executed in the above-described manner, the sequencer 170 again executes the lower tail detection (step S81), and further executes the write-back operation if it is still determined that any of the threshold voltages of the memory cell transistors MT5 is lower than or equal to Vcut (step S83). The sequencer 170 repeats the operations of steps S81 to S83 until the operations for the last word line (the word line WL7 in this example) are done (steps S68 and S69). Thereafter, the same operations are executed for the remaining string units SU2 and SU3.

8.2 Effects of Eighth Embodiment

In the semiconductor memory device according to the eighth embodiment, by executing the lower tail detection and write-back operation, the threshold voltage of any over-erased memory cell transistor can be raised to a voltage higher than the voltage Vcut.

In addition, in the semiconductor memory device according to the eighth embodiment, the lower tail detection and the write-back operation are executed in parallel for two memory cell transistors selected in two string units SU. Thus the speed of the erase operation can be enhanced.

9. Ninth Embodiment

Next, a semiconductor memory device according to a ninth embodiment will be explained. The ninth embodiment provides another method for the lower tail detection and write-back operations that differs from those provided in the sixth to eighth embodiments. More specifically, the lower tail detection and write-back operations of the sixth embodiment are modified in such a way that two string units SU are selected, and all of the word lines of the two string units SU are selected. The following explanation focuses only on the differences of the ninth embodiment with respect to the sixth to eighth embodiments.

9.1 Lower Tail Detection and Write-back Method

The lower tail detection and write-back operations performed in the semiconductor memory device according to the ninth embodiment will be explained with reference to FIG. 38. FIG. 38 shows a flowchart of the erase operation of the semiconductor memory device according to the present embodiment, which corresponds to the erase operation of the sixth embodiment as illustrated in FIG. 26.

As illustrated in FIG. 38, first, the aforementioned operations of steps S10, S11, S62, and S63 are executed. As explained in the sixth embodiment, any one of the erase verify operations as explained in the first to fifth embodiments may be adopted for the erase verify operation of the ninth embodiment.

When the erase verify operation is successful (YES at step S63), the lower tail detection and write-back operations are executed. In this example, two string units SU that share a memory pillar MP are selected for the lower tail detection and write-back operations (step S80). The row decoder 120 selects all the word lines WL of the two string units SU, and initiates the lower tail detection (step S90), as illustrated in FIG. 39.

Figure 39:
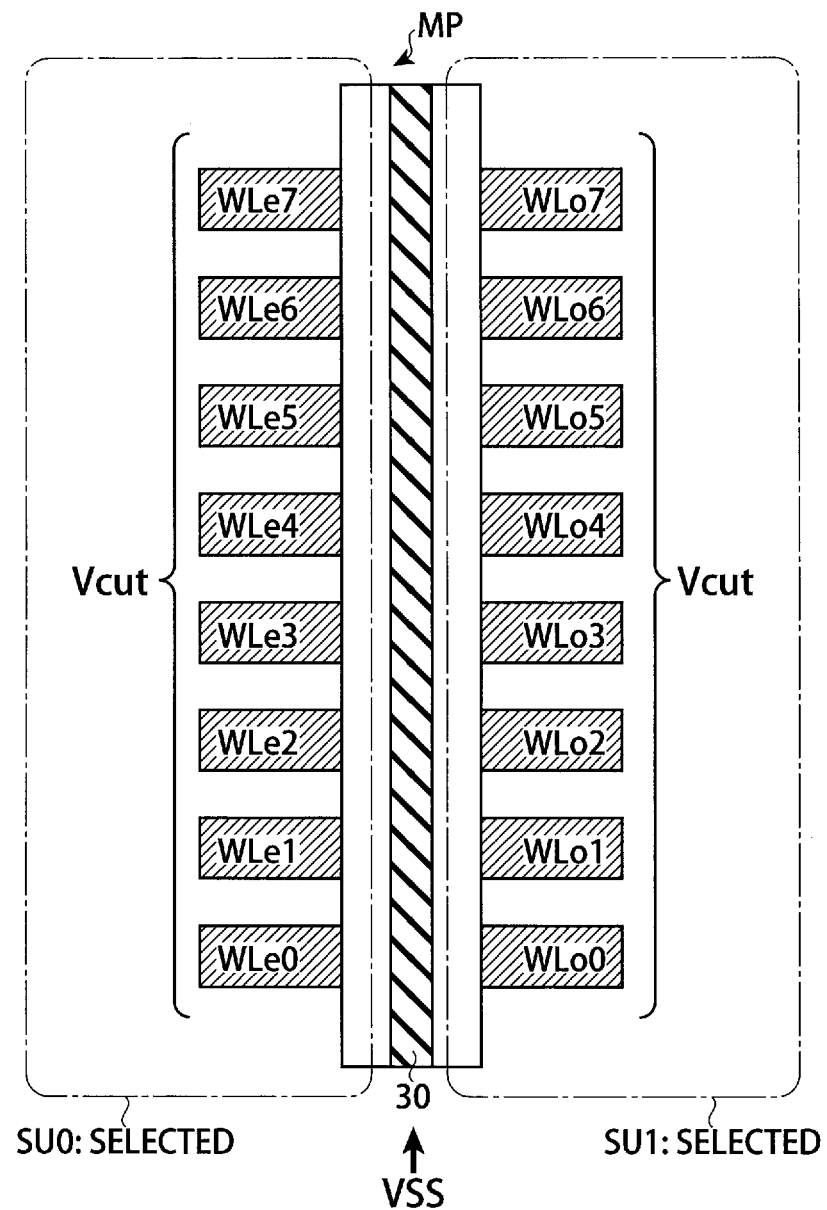
FIG. 39 shows a vertical section of a pillar of the semiconductor memory device according to the ninth embodiment.

In an example illustrated in FIG. 39, for the selected two string units SU0 and SU1, the voltage Vcut is applied to the word lines WLe0 to WLe7 and WLo0 to WLo7. Furthermore, for the selected two string units SU0 and SU1, the voltage VSG is applied to the selection gate lines SGD0, SGD1, SGSe, and SGSo. Then, the sense amplifier 140 pre-charges the bit line BL. If the cell current Icell flows from the bit line BL to the source line SL, it means that in each of the word line layers 0 to 7 (referred to as a word line layer i, the threshold voltage of at least one of the two memory cell transistors MTi coupled to the word lines WLei and WLoi in the string units SU0 and SU1 is lower than or equal to the voltage Vcut.

Thus, if it is determined that the NAND strings of the string units SU0 and SU1 include memory cell transistors MT having a threshold voltage lower than or equal to the voltage Vcut is present, the sequencer 170 executes the write-back operation (step S92). In this example, for the selected two string units SU0 and SU1, the row decoder 120 applies the voltage VPGM to all the word lines WLe0 to WLe7 and WLo0 to WLo7, the voltage VSG to the selection gate lines SGD0 and SGD1, and the voltage VSS to the selection gate lines SGSe and SGSo. Then, the sense amplifier 140 applies, for example, 0V, to the bit line BL coupled to the memory pillar MP through which the cell current flows in the lower tail detection of step S90, and the voltage VSG to the bit line BL coupled to the memory pillar MP through which the cell current does not flow.

As a result, in the two NAND strings of the memory pillar MP through which the cell current flows in the lower tail detection of step S90, charge is injected to the charge accumulation layer of all of the memory cell transistors MT to raise the threshold voltages thereof to voltages higher than the voltage Vcut.

After the write-back operation is executed in the above-described manner, the sequencer 170 again executes the lower tail detection (step S90), and further executes the write-back operation if the cell current Icell still flows through the memory pillar MP (step S92). Thereafter, the same operations are executed for the remaining string units SU2 and SU3.

9.2 Effects of Ninth Embodiment

In the semiconductor memory device according to the ninth embodiment, the lower tail detection and write-back operations are executed in parallel for all of the memory cell transistors MT of two string units SU that share a memory pillar MP. Thus, the erase operation can be realized at extremely high speed.

10. Tenth Embodiment

A semiconductor memory device according to a tenth embodiment will be explained. The tenth embodiment provides another method for the lower tail detection and write-back operations that are different from those explained in the sixth to ninth embodiments. In the semiconductor memory device according to the tenth embodiment, for the lower tail detection and write-back operations, two string units SU are selected, and every other word line in the selected two string units SU is selected. The following explanation focuses only on the differences of the tenth embodiment with respect to the sixth to ninth embodiments.

10.1 Lower Tail Detection and Write-back Method

Figure 40:
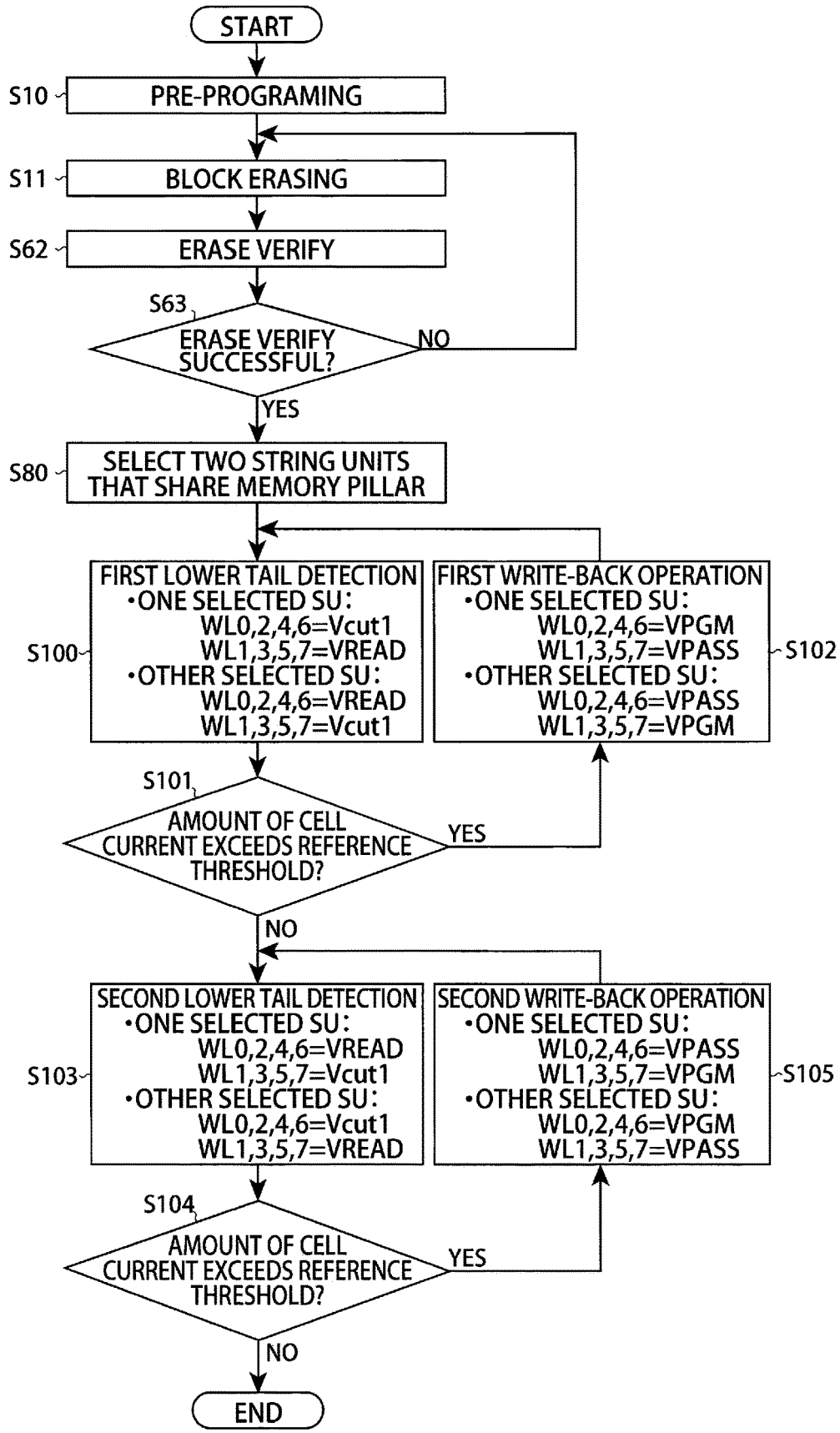
FIG. 40 shows a flowchart of an erase operation of a semiconductor memory device according to a tenth embodiment.

The lower tail detection and write-back operations performed in the semiconductor memory device according to the tenth embodiment will be explained with reference to FIG. 40. FIG. 40 shows a flowchart of the erase operation of the semiconductor memory device according to the tenth embodiment which corresponds to the erase operation as explained in the sixth embodiment with reference to FIG. 26.

As illustrated in FIG. 40, first, the aforementioned operations of steps S10, S11, S62, and S63 are executed for the pre-program and erase verify operations. As explained in the sixth embodiment, any of the erase verify operations performed in the semiconductor memory device according to the first to fifth embodiments may be adopted for the erase verify operation of tenth embodiment.

When the erase verify operation is successful (YES at step S63), the lower tail detection and write-back operations are executed. In this semiconductor memory device according to the tenth embodiment, both of the two string units SU that share a memory pillar MP are selected for the lower tail detection and write-back operations (step S80).

Figure 41:
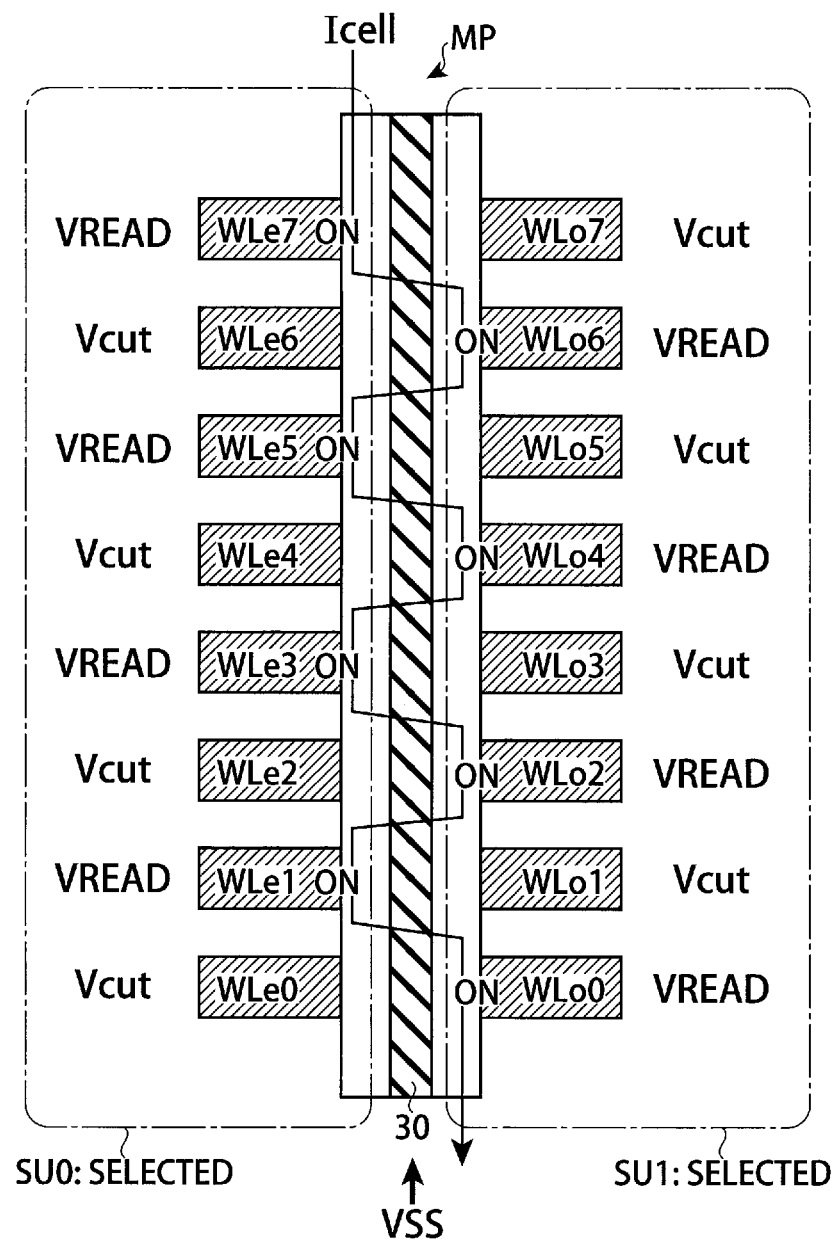

Then, the sequencer 170 executes a first lower tail detection operation for the two string units selected at step S80 (step S100). The first lower tail detection is executed to determine whether the threshold voltages of the memory cell transistors MT coupled to the even-numbered word lines WL0, WL2, WL4, and WL6 in one of the selected string units SU and the threshold voltages of the memory cell transistors MT coupled to the odd-numbered word lines WL1, WL3, WL5, and WL7 in the other selected string unit SU are lower than or equal to the voltage Vcut (=Vevfy_low), as illustrated in FIG. 41. These memory cell transistors selected for the first lower tail detection are collectively referred to as first selected memory cell transistors MT. FIG. 41 schematically shows how voltages are applied to the memory pillar MP and the word lines WLe0 to WLe7 and WLo0 to WLo7 in the selected string units SU0 and SU1 for the first lower tail detection with a cross section of the memory pillar MP.

In the example of FIG. 41, both of the two string units SU0 and SU1 that share a memory pillar MP are selected. The row decoder 120 applies the voltage Vcut to the word lines WLe0, WLe2, WLe4, and WLe6 of the string unit SU0, and to the word lines WLo1, WLo3, WLo5, and WLo7 of the string unit SU1, which are coupled to the control gates of the first selected memory cell transistors MT. Furthermore, the row decoder 120 applies the voltage VREAD to the word lines WLe1, WLe3, WLe5, and WLe7 of the string unit SU0, and to the word lines WLo0, WLo2, WLo4, and WLo6 of the string unit SU1, which are coupled to the other memory cell transistors MT. The row decoder 120 further applies the voltage VSG to the selection gate lines SGD0, SGD1, SGSe, and SGSo, for the string units SU0 and SU1.

As illustrated in FIG. 41, with the voltage VREAD being applied to their control gates, the memory cell transistors MT1, MT3, MT5, and MT7 coupled to the word lines WLe1, WLe3, WLe5 and WLe7 in the string unit SU0 are turned on, and the memory cell transistors MT0, MT2, MT4, and MT6 coupled to the word lines WLo0, WLo2, WLo4, and WLo6 in the string unit SU1 are turned on. As a result, the cell current Icell flows via those memory cell transistors MT, as indicated by the arrow in FIG. 41.

Furthermore, with the voltage Vcut being applied to their control gates, any of the first selected memory cell transistors MT (MT0, MT2, MT4, and MT6 of the string unit SU0 and MT1, MT3, MT5, and MT7 of the string unit SU1) is turned on to allow the cell current Icell to flow if its threshold voltage is lower than or equal to the voltage Vcut. In other words, with more of the first selected memory cell transistors MT having threshold voltages lower than or equal to Vcut (i.e. with more of the first selected memory cell transistors MT being turned on), the amount of cell current Icell increases.

As shown in FIG. 40, upon determination that the amount of cell current Icell exceeds a predetermined reference threshold value (YES at step S101), the sequencer 170 determines that one or more of the first selected memory cell transistors MT (MT0, MT2, MT4, and MT6 of the string unit SU0 and MT1, MT3, MT5, and MT7 of the string unit SU1) are over-erased memory cell transistors, and thus executes a first write-back operation for the first selected memory cell transistors MT (step S102). The first write-back operation is executed to the first selected memory cell transistors MT which are selected for the first lower tail detection at step S100 and raise their threshold voltages, as illustrated in FIG. 42.

Figure 42:
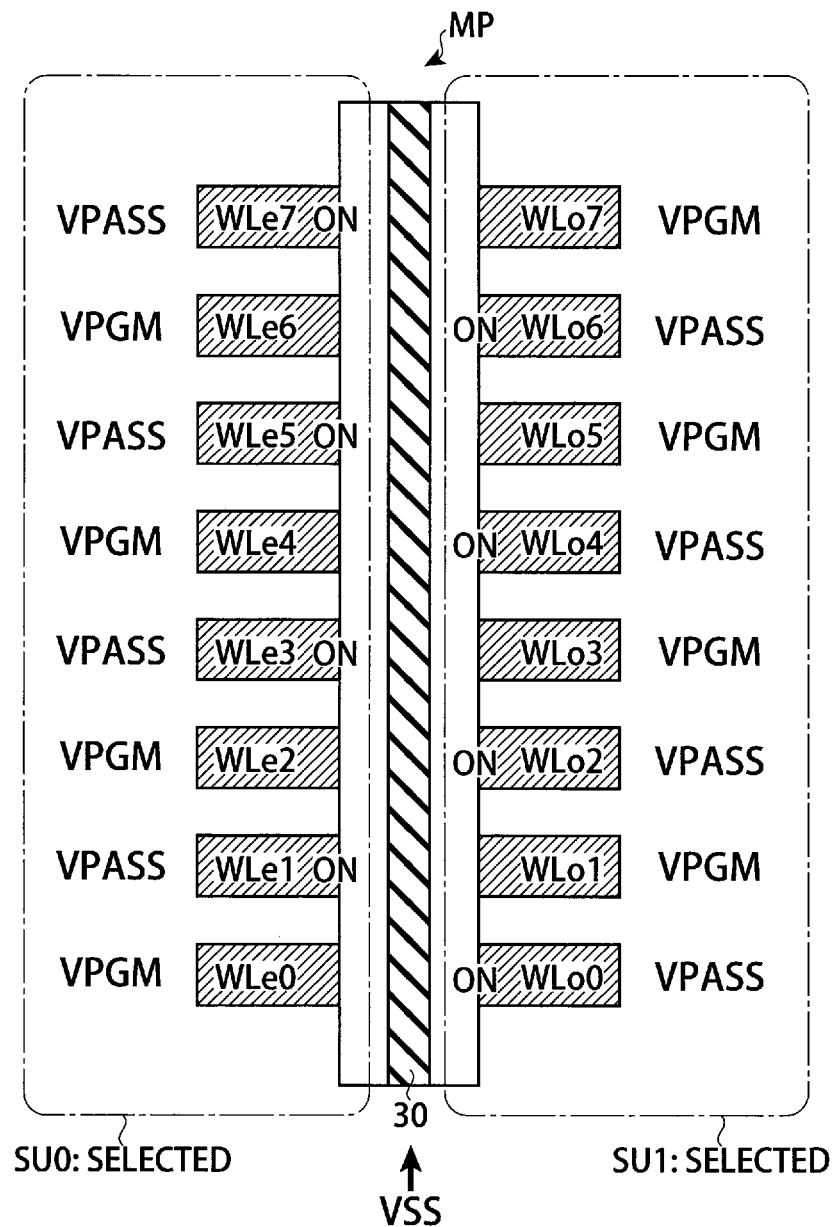

As illustrated in FIG. 42, the row decoder 120 applies the voltage VPGM to the word lines WLe0, WLe2, WLe4, and WLe6, and to the word lines WLo1, WLo3, WLo5, and WLo7, which are coupled to the control gates of the first selected memory cell transistors MT. The row decoder 120 also applies the voltage VPASS to the word lines WLe1, WLe3, WLe5, and WLe7 and to the word lines WLo0, WLo2, WLo4, and WLo6, which are coupled to the other memory cell transistors MT. Furthermore, for the string units SU0 and SU1, the row decoder 120 applies the voltage VSGD to the selection gate lines SGD0 and SGD1, and the voltage VSS to the selection gate lines SGSe and SGSo. As a result, the program operation is executed for the first selected memory cell transistors MT (i.e. MT0, MT2, MT4, and MT6 of the string unit SU0 and MT1, MT3, MT5, and MT7 of the string unit SU1), and the threshold voltages of the first selected memory cell transistors MT are thereby raised.

On the other hand, if it is determined that the amount of cell current does not exceed the reference threshold value and thereby that none of the first selected memory cell transistors MT is an over-erased memory cell transistor (NO at step S101), the sequencer 170 initiates a second lower tail detection operation for the same string units SU0 and SU1 selected at step S80 (step S103). The second lower tail detection operation of the semiconductor memory device according to the tenth embodiment is executed to determine whether the threshold voltages of the memory cell transistors MT coupled to the odd-numbered word lines WL1, WL3, WL5, and WL7 in one of the selected string units SU and the memory cell transistors MT coupled to the even-numbered word lines WL0, WL2, WL4, and WL6 in the other selected string unit SU (collectively referred to as second selected memory cell transistors MT) are lower than or equal to voltage Vcut. Either one of the first lower tail detection and the second lower tail detection can be executed first. The application of voltages in the second lower tail detection in this example is illustrated in FIG. 43.

The second lower tail detection illustrated in FIG. 43 differs from the first lower tail detection illustrated in FIG. 41 in that the voltage Vcut, instead of the voltage VREAD, is applied to the word lines WLe1, WLe3, WLe5, and WLe7 of the string unit SU0 and to the word lines WLo0, WLo2, WLo4, and WLo6 of the string unit SU1, which are coupled to the control gates of the second selected memory cell transistors MT, whereas the voltage VREAD, instead of the voltage Vcut, is applied to the word lines WLe0, WLe2, WLe4, and WLe6 of the string unit SU0 and to the word lines WLo1, WLo3, WLo5, and WLo7 of the string unit SU1, which are coupled to the control gates of the other memory cell transistors MT.

Upon determination that the amount of cell current Icell exceeds the reference threshold value (YES at step S104), the sequencer 170 determines that one or more of the second selected memory cell transistors MT (MT1, MT3, MT5, and MT7 of the string unit SU0, and MT0, MT2, MT4, and MT6 of the string unit SU1) are over-erased memory cell transistors, and executes a second write-back operation for the second selected memory cell transistors MT (step S105). The second write-back operation is executed to program the second selected memory cell transistors MT which are selected for the second lower tail detection at step S103 and thereby raise the threshold voltages of the second selected memory cell transistors MT, as illustrated in FIG. 44.

Figure 44:
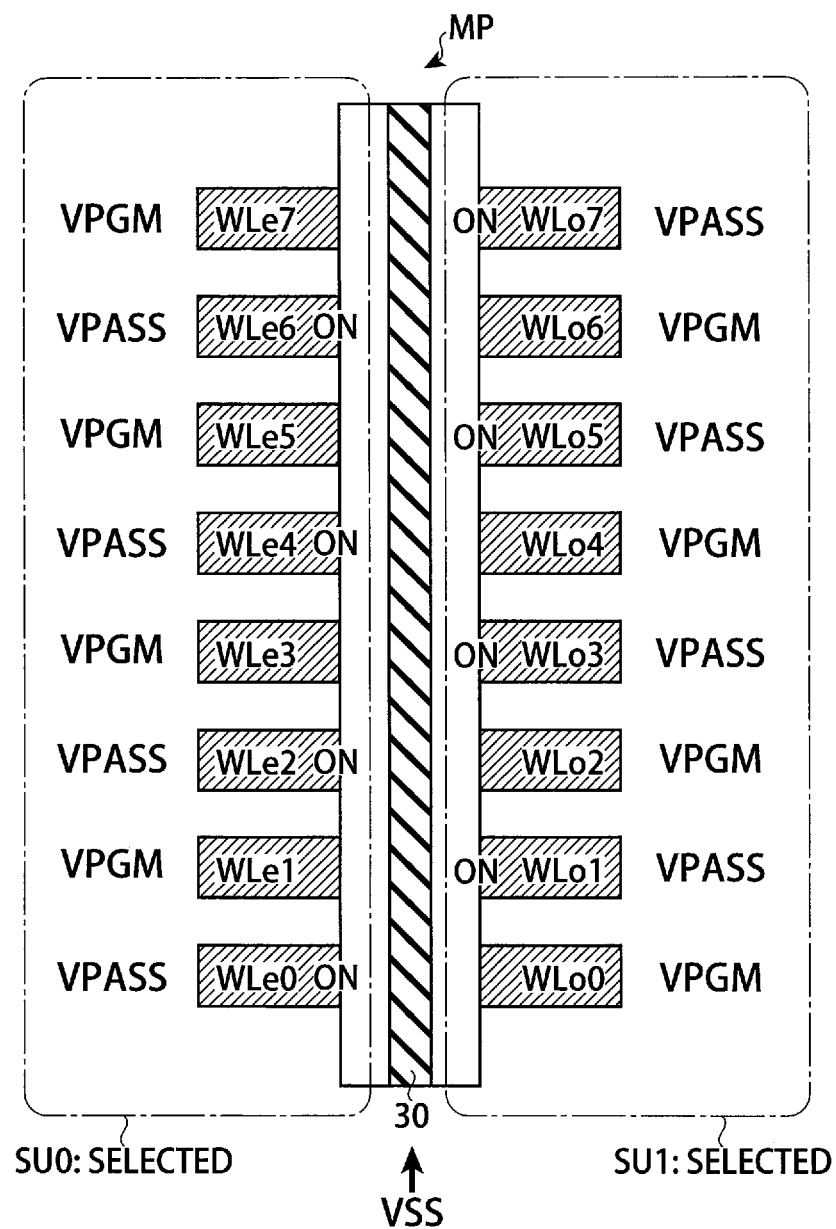

As illustrated in FIG. 44, the row decoder 120 applies the voltage VPGM to the word lines WLe1, WLe3, WLe5, and WLe7 of the string unit SU0 and to the word lines WLo0, WLo2, WLo4 and WLo6 of the string unit SU1, which are coupled to the second selected memory cell transistors MT. The row decoder 120 also applies the voltage VPASS to the word lines WLe0, WLe2, WLe4, and WLe6 of the string unit SU0 and to the word lines WLo1, WLo3, WLo5, and WLo7 of the string unit SU1, which are coupled to the other memory cell transistors MT. Furthermore, for the string units SU0 and SU1, the row decoder 120 applies the voltage VSGD to the selection gate lines SGD0 and SGD1, and the voltage VSS to the selection gate lines SGSe and SGSo. Thereafter, the second lower tail detection is again executed (step S103).

If it is determined that the amount of cell current still exceeds the reference threshold value (YES at step S104), the sequencer 170 repeats the second write-back operation (step S105). On the other hand, if it is determined that the amount of cell current does not exceed the reference threshold value (NO at step S104), the sequencer 170 determines that the threshold voltages of all the second selected memory cell transistors MT are higher than the voltage Vcut. Thus, at the end of the operations illustrated in FIG. 40, it is confirmed that the threshold voltages of all the transistors MT0 to MT7 included in the two string units SU0 and SU1 are higher than the voltage Vcut (=Vevfy_low).

The same operations are executed for the remaining string units SU2 and SU3.

10.2 Effects of Tenth Embodiment

In the semiconductor memory device according to the tenth embodiment, the lower tail detection and write-back operations for the memory cell transistors MT included in the erase target block BLK are executed so that the threshold voltages of over-erased memory cell transistors, if any in the erased block BLK, can be increased to voltages higher than the voltage Vcut (=Vevfy_low).

11. Modification Examples

As discussed above, a semiconductor memory device according to the above embodiments includes: a first memory cell capable of holding data; a second memory cell capable of holding data; a first word line coupled to the first memory cell; a second word line coupled to the second memory cell; and a first bit line capable of being electrically coupled to both the first memory cell and the second memory cell. The first memory cell shares a semiconductor layer (31) with the second memory cell, and faces the second memory cell across the semiconductor layer. The semiconductor memory device is configured to execute a first operation (data erase), a second operation (data erase), a third operation (upper tail detection), a fourth operation (upper tail detection), a fifth operation (lower tail detection), and a sixth operation (lower tail detection) to erase data. In the first operation (data erase), a first voltage (VISO) is applied to the first word line, and a second voltage (VERA) higher than the first voltage is applied to the semiconductor layer (31). In the second operation (data erase), the first voltage (VISO) is applied to the second word line, and the second voltage (VERA) is applied to the semiconductor layer (31). In the third operation (upper tail detection) after the first operation, a third voltage (Vevfy_up) lower than the second voltage (VERA) is applied to the first word line to read data from the first memory cell. In the fourth operation (upper tail detection) after the second operation, the third voltage (Vevfy_up) is applied to the second word line to read data from the second memory cell. In the fifth operation (lower tail detection) after the third operation, a fourth voltage (Vcut=Vevfy_low) lower than the third voltage (Vevfy_up) is applied to the first word line to read data from the first memory cell. In the sixth operation (lower tail detection) after the fourth operation, the fourth voltage (Vcut=Vevfy_low) is applied to the second word line to read data from the second memory cell.

In the semiconductor memory device according to the present embodiments, the operation reliability can be improved. The above-described embodiments are provided merely by way of example, and various modifications to the embodiments can be made.

For instance, in the semiconductor memory device according to any of the first to fifth embodiments, the erase operation explained with reference to FIG. 10 may be executed for every block or for every half block. The semiconductor memory device according to the tenth embodiment may adopt the lower tail detection as explained with reference to FIG. 36 in the eighth embodiment. The semiconductor memory device according to the tenth embodiment may adopt the write-back operation as explained with reference to FIG. 30 in the sixth embodiment. Furthermore, the structure of the memory pillars MP of the semiconductor memory device according to the seventh embodiment is applicable to the semiconductor memory device according to any of the first to fifth embodiments and the eighth to tenth embodiments. The operations as explained in each embodiment may be executed independently for the first layer memory pillars MP1 and for the second layer memory pillars MP2, as in the seventh embodiment. It is appreciated by a person skilled in the relevant art that the features of the minimum size unit for data erasing, the upper tail detection, the lower tail detection, and the write-back operation as explained in the above embodiments can be combined in various appropriate ways. In the above embodiments, the sense amplifier detects the current flowing from the bit line to the source line in the erase verify operation. Alternatively, the sense amplifier may sense the voltage of the bit line in the erase verify operation, that is the sense amplifier may determine that the selected memory cell turns on when the bit line voltage is lower than the predetermined reference voltage.

Note that the semiconductor memory device according to any of the above-described embodiments may include the following features:

(1) When the memory cell holds 2-bit data ("Er", "A", "B", and "C"), the voltage applied to the selected word line in the reading operation of A level may range from, for example, 0 V to 0.55 V. However, the present embodiments are not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the reading operation of B level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the reading operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the reading operation may be set within the range of, for example, 25 μs to 38 μs, 38 μs to 70 μs, or 70 μs to 80 μs.

(2) A writing operation may include a program operation and a verify operation. In the writing operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V.

The voltage first applied to the selected word line when write-accessing an odd-numbered word line and the voltage first applied to the selected word line when write-accessing an even-numbered word line may be different.

If the program operation may be Incremental Step Pulse Program (ISPP), the voltage of step-up may be, for example, 0.5 V.

The voltage applied to an unselected word line may be set within the range of, for example, 6.0 V to 7.3 V. However the voltage is not limited to this and may be set within the range of, for example, 7.3 V to 8.4 or set to 6.0 V or less.

The pass voltage to be applied may be changed depending on whether the unselected word line is an odd-numbered word line or an even-numbered word line.

A time (tProg) of the writing operation may be set within the range of, for example, 1,700 μs to 1,800 μs, 1,800 μs to 1,900 μs, or 1,900 μs to 2000 μs.

(3) In erasing operation,

The voltage first applied to the well, which may be formed in the upper portion of the semiconductor substrate and above which the memory cell may be arranged, may be set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V.

A time (tErase) of the erasing operation may be set within the range of, for example, 3,000 μs to 4,000 μs, 4,000 μs to 5,000 μs, or 4,000 μs to 9,000 μs.

(4) The structure of the memory cell

A charge accumulation layer may be arranged on a 4 to 10 nm thick tunnel insulating film. The charge accumulation layer may have a stacked structure of a 2 to 3 nm thick insulating film of silicon nitride (SiN) or silicon oxynitride (SiON) and 3 to 8 nm thick polysilicon. A metal such as ruthenium (Ru) may be added to the polysilicon. An insulating film is provided on the charge accumulation layer. The insulating film may include a 4 to 10 nm thick silicon oxide film sandwiched between a 3 to 10 nm thick lower High-k film and a 3 to 10 nm thick upper High-k film. As the High-k film, hafnium oxide (HfO) or the like may be usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as tantalum oxide (TaO) or a metal nitride film such as tantalum nitride (TaN). As the control electrode, tungsten (W) or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first memory cell configured to hold data;
a second memory cell configured to hold data;
a first word line coupled to the first memory cell;
a second word line coupled to the second memory cell;
a first bit line configured to be electrically coupled to both the first memory cell and the second memory cell, wherein the first memory cell shares a semiconductor layer with the second memory cell, and faces the second memory cell across the semiconductor layer; and
circuitry configured to execute a first operation, a second operation, a third operation, a fourth operation, a fifth operation, and a sixth operation to erase data, wherein
in the first operation, a first voltage is applied to the first word line, and a second voltage higher than the first voltage is applied to the semiconductor layer;
in the second operation, the first voltage is applied to the second word line, and the second voltage is applied to the semiconductor layer;
in the third operation after the first operation, a third voltage lower than the second voltage is applied to the first word line to read data from the first memory cell;
in the fourth operation after the second operation, the third voltage is applied to the second word line to read data from the second memory cell;
in the fifth operation after the third operation, a fourth voltage lower than the third voltage is applied to the first word line to read the data from the first memory cell; and
in the sixth operation after the fourth operation, the fourth voltage is applied to the second word line to read the data from the second memory cell.

2. The device according to claim 1, wherein the fourth voltage is applied to the second word line in the third operation.

3. The device according to claim 1, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer, and in the third operation, the third voltage is applied to the first word line, a fifth voltage to turn on a memory cell is applied to the third word line, and the fourth voltage is applied to the second word line and the fourth word line; and thereafter, the fifth voltage is applied to the first word line, the third voltage is applied to the third word line, and the fourth voltage is applied to the second word line and the fourth word line.

4. The device according to claim 1, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer, and in the third operation, the third voltage is applied to the first word line and the third word line, and the fourth voltage is applied to the second word line and the fourth word line; and in the fourth operation, the third voltage is applied to the second word line and the fourth word line, and the fourth voltage is applied to the first word line and the third word line.

5. The device according to claim 1, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer, and in the third operation, the third voltage is applied to the first word line, a fifth voltage to turn on a memory cell is applied to the third word line, the fifth voltage is applied to the second word line, and the third voltage is applied to the fourth word line; and in the fourth operation, the fifth voltage is applied to the first word line, the third voltage is applied to the third word line, the third voltage is applied to the second word line, and the fifth voltage is applied to the fourth word line.

6. The device according to claim 1, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer, and
the circuitry is further configured to execute the third operation and the fourth operation in parallel, wherein
in the third operation and the fourth operation, the third voltage is applied to the first word line and the second word line, and a fifth voltage to turn on a memory cell is applied to the third word line and the fourth word line.

7. The device according to claim 1, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer; and
the circuitry is further configured to execute the third operation and the fourth operation in parallel, wherein
in the third operation and the fourth operation, the third voltage is applied to the first to fourth sword lines.

8. The device according to claim 1, wherein the circuitry is further configured to execute a seventh operation before the first to sixth operations, and
in the seventh operation, a fifth voltage is applied to the first word line and the second word line, and
the fifth voltage is higher than the first voltage, the third voltage, and the fourth svoltage.

9. The device according to claim 8, wherein the device is further configured to:
in the first operation, set a potential of the semiconductor layer to a voltage higher than a gate potential of the first memory cell to lower a threshold voltage of the first memory cell;
in the second operation, set the potential of the semiconductor layer to a voltage higher than a gate potential of the second memory cell to lower a threshold voltage of the second memory cell; and
execute the second operation after the first operation.

10. The device according to claim 9, wherein
in the fifth operation, the fourth voltage is applied to the first word line and a sixth voltage to turn off the second memory cell is applied to the second word line; and
in the sixth operation, the fourth voltage is applied to the second word line and the sixth voltage is applied to the first word line.

11. The device according to claim 10, wherein
in the fifth operation, the fifth voltage is applied to the first word line and the sixth voltage is applied to the second word line after the data is read from the first memory cell; and
in the sixth operation, the fifth voltage is applied to the second word line and the sixth voltage is applied to the first word line after the data is read from the second memory cell.

12. The device according to claim 9, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer, and
in the fifth operation, the fourth voltage is applied to the first word line and the fourth word lines and a sixth voltage to turn off a memory cell is applied to the second word line and the third word line to read the data from the first memory cell and the fourth memory cell; and
in the sixth operation, the fourth voltage is applied to the second word line and the third word line and the sixth voltage is applied to the first word line and the fourth word line to read the data from the second memory cell and the third memory cell.

13. The device according to claim 12, wherein
in the fifth operation; the fifth voltage is applied to the first word line and the fourth word line and the sixth voltage is applied to the second word line and the third word line after the data is read from the first memory cell and the fourth memory cell; and
in the sixth operation, the fifth voltage is applied to the second word line and the third word line and the sixth voltage is applied to the first word line and the fourth word line after the data is read from the second memory cell and the third memory cell.

14. The device according to claim 1, wherein the circuitry is further configured to execute the fifth operation and the sixth operation in parallel.

15. The device according to claim 14, wherein a fifth voltage is applied to the first word line and the second word line after the data is read from the first memory cell and the second memory cell in the fifth operation and the sixth operation, and
the fifth voltage is higher than the first voltage, the third voltage, and the fourth voltage.

16. The device according to claim 1, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer, and
the circuitry is further configured to execute the fifth operation and the sixth operation in parallel, and wherein
in the fifth operation and the sixth operation, the fourth voltage is applied to the first to fourth word lines.

17. The device according to claim 16, wherein a fifth voltage is applied to the first to fourth word lines after the fourth voltage is applied to the first to fourth word lines in the fifth operation and the sixth operation, and
the fifth voltage is higher than the first voltage, the third voltage, and the fourth voltage.

18. The device according to claim 1, further comprising:
a third memory cell configured to hold data;
a fourth memory cell configured to hold data;
a third word line coupled to the third memory cell; and
a fourth word line coupled to the fourth memory cell,
wherein the first to fourth memory cells share the semiconductor layer, and the first memory cell and the third memory cell face the second memory cell and the fourth memory cell across the semiconductor layer, and
in the fifth operation, the fourth voltage is applied to the first word line, a fifth voltage to turn on a memory cell is applied to the third word line and the second word line, and the fourth voltage is applied to the fourth word line; and
in the sixth operation, the fifth voltage is applied to the first word line, the fourth voltage is applied to the second word line and the third word line, the fifth voltage is applied to the fourth word line.

19. The device according to claim 18, wherein
in the fifth operation, a sixth voltage is applied to the first word line and the fourth word line, after the fourth voltage is applied to the first word line and the fourth word line,
in the sixth operation, the sixth voltage is applied to the first word line and the fourth word line, after the fourth voltage is applied to the second line and the third word line, and
the sixth voltage is higher than the first voltage, the third voltage, and the fourth voltage.

20. The device according to claim 1, wherein
the third operation is an operation for determining whether or not a threshold voltage of the first memory cell from which the data is read is higher than the third voltage, and
the fifth operation is an operation for determining whether or not the threshold voltage of the first memory cell from which the data is read is equal to or lower than the fourth voltage.

* * * * *